(12) United States Patent
Maunder et al.

(10) Patent No.: US 12,244,441 B2
(45) Date of Patent: Mar. 4, 2025

(54) COMMUNICATION UNIT FOR SOFT-DECISION DEMODULATION AND METHOD THEREFOR

(71) Applicant: AccelerComm Limited, Southampton (GB)

(72) Inventors: Robert G. Maunder, Southampton (GB); Aryan Tavakkoli, Chilworth (GB)

(73) Assignee: AccelerComm Limited, Southampton (GB)

( * ) Notice: Subject to any disclaimer, the term of this patent is extended or adjusted under 35 U.S.C. 154(b) by 14 days.

(21) Appl. No.: 18/015,507

(22) PCT Filed: Jul. 9, 2021

(86) PCT No.: PCT/EP2021/069168
§ 371 (c)(1),
(2) Date: Jan. 10, 2023

(87) PCT Pub. No.: WO2022/013097
PCT Pub. Date: Jan. 20, 2022

(65) Prior Publication Data
US 2023/0261912 A1  Aug. 17, 2023

(30) Foreign Application Priority Data

Jul. 13, 2020 (GB) ...................................... 2010773
Mar. 29, 2021 (GB) ...................................... 2104419

(51) Int. Cl.
*H04L 25/03* (2006.01)
*H03M 13/00* (2006.01)
(Continued)

(52) U.S. Cl.
CPC .. *H04L 25/03318* (2013.01); *H03M 13/2957* (2013.01); *H03M 13/6325* (2013.01);
(Continued)

(58) Field of Classification Search
CPC . H04L 25/03318; H04L 25/067; H04L 27/22; H04L 27/2278; H04L 27/38;
(Continued)

(56) References Cited

U.S. PATENT DOCUMENTS 6,018,546 A    1/2000 Rege
10,819,544 B2 * 10/2020 Stanciu .................. H04L 27/14
(Continued)

OTHER PUBLICATIONS

Takizawa K et al: Iterative Demodulation and Decoding for Parallel Combinatorial SS Systems, GLOBECOM '01 : IEEE Global Telecommunications Conference; San Antonio, Texas, USA, Nov. 25-29, 2001, IEEE Operations Center, Piscataway, NJ, Nov. 25, 2001 (Nov. 25, 2001), pp. 811-815, XP001099218,DOI: 10.1109/GLOCOM. 2001.965531ISBN: 978-0-7803-7206-1Sections II, 111.B, IV.
(Continued)

*Primary Examiner* — Betsy Deppe
(74) *Attorney, Agent, or Firm* — Optimus Patents US, LLC

(57) ABSTRACT

A communication unit for performing soft-decision demodulation includes a receiver that receives a transmitted signal conveying a first set of bits including k bits selected from a set of $2^k$ possible signals. A demodulator includes a bank of $2^k$ correlators that detects a transmission of each possible transmitted signal, and outputs $2^k$ magnitudes of correlator outputs, based on the detected possible transmitted signals, as a first set of inputs. A de-mapper circuit receives the first set of inputs and determines derived from a plurality of aggregated correlator output magnitude distributions of the first set of inputs, wherein the plurality of aggregated correlator output magnitude distributions is fewer than $2^{2k}$; and calculates therefrom a first set of aposteriori soft bits including k soft bits. In this manner, high quality soft-decisions can be obtained in a robust and practical manner.

20 Claims, 64 Drawing Sheets

(51) Int. Cl.
*H03M 13/29* (2006.01)
*H04B 1/707* (2011.01)
*H04L 25/06* (2006.01)
*H04L 27/22* (2006.01)
*H04L 27/227* (2006.01)

(52) U.S. Cl.
CPC ........... *H04B 1/707* (2013.01); *H04L 25/067* (2013.01); *H04L 27/22* (2013.01); *H04L 27/2278* (2013.01)

(58) Field of Classification Search
CPC ..... H04L 1/005; H04L 1/0045; H04L 1/0047; H03M 13/2957; H03M 13/6325; H03M 13/00
See application file for complete search history.

(56) References Cited

U.S. PATENT DOCUMENTS

2005/0105649 A1  5/2005  Takizawa
2007/0183542 A1  8/2007  Evaggelos

OTHER PUBLICATIONS

Guvensen Gokhan Met al: "A Reduced-State Ungerboeck Type MAP Receiver with Bidirectional Decision Feedback for M-ary Quasi Orthogonal Signaling", IEEE Transactions on Communications, IEEE Service Center, Piscataway, NJ. USA, vo 1 . 62 , No. 2, Feb. 1, 2014 (Feb. 1, 2014), pp. 552-566, XP011541098, ISSN: 0090-6778, DOI:10.1109/TCOMM.2014.011114.130714 [retrieved on Feb. 25, 2014] Sections II, III, IV.

* cited by examiner

FIG. 26

| No. | Symbol | Correlator magnitudes | | | | | | | | | | | | | | | |
|---|---|---|---|---|---|---|---|---|---|---|---|---|---|---|---|---|---|
| 1 | 13 | 5.5 | 9.9 | 14.5 | 12.9 | 13.8 | 11.7 | 17.2 | 9.9 | 12.3 | 7.1 | 17.8 | 9.8 | 10.4 | 49.9 | 18.1 | 5.7 |
| 2 | 1 | 9.5 | 54.3 | 9.4 | 14.9 | 17.2 | 7.6 | 5.3 | 19.1 | 14.8 | 4.8 | 9.9 | 16.5 | 3.4 | 18.2 | 8.0 | 20.2 |
| 3 | 11 | 6.6 | 5.4 | 3.2 | 11.4 | 7.3 | 5.8 | 5.1 | 6.3 | 9.7 | 4.6 | 9.5 | 51.2 | 4.9 | 14.0 | 13.9 | 18.9 |
| 4 | 10 | 2.1 | 4.6 | 4.1 | 10.0 | 7.6 | 8.2 | 11.7 | 4.2 | 5.3 | 4.3 | 47.2 | 14.2 | 9.7 | 0.9 | 9.2 | 10.6 |
| 5 | 13 | 10.7 | 3.2 | 11.0 | 7.7 | 11.6 | 6.8 | 19.4 | 5.4 | 27.8 | 2.6 | 4.3 | 8.7 | 9.1 | 54.3 | 8.8 | 6.9 |
| 6 | 4 | 4.7 | 1.8 | 10.9 | 13.0 | 46.7 | 4.2 | 5.5 | 14.0 | 21.6 | 9.2 | 5.2 | 9.6 | 8.9 | 0.5 | 8.4 | 12.4 |
| 7 | 9 | 10.5 | 1.5 | 11.1 | 5.5 | 13.0 | 12.8 | 8.7 | 5.6 | 5.9 | 53.0 | 1.5 | 19.9 | 20.8 | 10.3 | 5.0 | 6.6 |
| 8 | 8 | 1.7 | 7.5 | 15.2 | 7.0 | 17.2 | 10.0 | 11.8 | 3.9 | 50.3 | 5.7 | 17.7 | 20.8 | 3.2 | 10.4 | 8.9 | 23.1 |
| 9 | 7 | 11.7 | 4.2 | 5.3 | 10.3 | 4.0 | 8.7 | 15.4 | 41.5 | 16.9 | 10.2 | 3.8 | 3.1 | 10.4 | 1.6 | 3.5 | 6.8 |
| 10 | 14 | 11.1 | 4.8 | 5.9 | 4.1 | 20.6 | 9.8 | 10.7 | 10.2 | 3.1 | 10.3 | 5.6 | 11.2 | 2.1 | 13.4 | 42.9 | 5.3 |
| 11 | 7 | 7.2 | 21.5 | 10.2 | 10.6 | 16.0 | 14.9 | 4.7 | 55.7 | 3.8 | 7.8 | 6.5 | 2.7 | 10.7 | 10.4 | 10.0 | 9.5 |
| 12 | 10 | 20.0 | 8.1 | 9.0 | 4.6 | 3.7 | 8.9 | 9.3 | 3.4 | 6.9 | 5.6 | 52.4 | 6.0 | 2.7 | 15.3 | 6.0 | 9.5 |
| 13 | 7 | 20.2 | 8.2 | 14.4 | 16.6 | 4.0 | 6.0 | 5.6 | 43.5 | 44.1 | 16.4 | 21.2 | 20.8 | 5.6 | 4.8 | 9.3 | 7.4 |
| 14 | 1 | 5.9 | 49.8 | 2.9 | 10.6 | 6.9 | 7.4 | 5.1 | 8.2 | 11.5 | 10.8 | 5.7 | 4.6 | 12.3 | 5.2 | 2.6 | 7.0 |
| 15 | 8 | 13.6 | 5.4 | 14.9 | 12.4 | 13.0 | 4.5 | 11.6 | 11.6 | 13.0 | 3.7 | 9.6 | 10.6 | 5.6 | 18.6 | 15.1 | 10.0 |
| 16 | 5 | 7.5 | 7.1 | 7.6 | 11.2 | 7.8 | 49.9 | 9.3 | 13.2 | 7.5 | 6.1 | 6.0 | 7.5 | 11.3 | 10.4 | 6.3 | 6.1 |
| 17 | 4 | 13.8 | 4.8 | 10.2 | 8.0 | 51.7 | 1.4 | 5.1 | 6.9 | 11.6 | 11.5 | 3.1 | 9.1 | 6.9 | 3.1 | 7.9 | 13.9 |
| 18 | 15 | 11.2 | 5.6 | 9.9 | 9.3 | 12.4 | 6.9 | 2.7 | 14.1 | 3.1 | 7.3 | 6.4 | 6.6 | 6.4 | 5.7 | 9.4 | 49.2 |
| 19 | 7 | 3.0 | 8.6 | 6.5 | 9.8 | 6.8 | 6.4 | 5.0 | 49.3 | 12.6 | 6.1 | 12.1 | 15.7 | 5.9 | 5.7 | 10.0 | 14.3 |
| 20 | 13 | 2.7 | 9.6 | 15.6 | 22.2 | 3.9 | 8.0 | 18.2 | 14.6 | 19.2 | 9.8 | 8.3 | 5.5 | 13.0 | 56.2 | 6.9 | 11.7 |

| Message combinations 3702 | | OS symbol LLR 3703 |
| --- | --- | --- |
| Decimal | Binary 3701 | |
| 0 | 0000 | $LLR_0^{sym,in}$ |
| 1 | 0001 | $LLR_1^{sym,in}$ |
| . | . | . |
| . | . | . |
| . | . | . |
| 15 | 1111 | $LLR_{15}^{sym,in}$ |

{3700 encompasses all rows above}

FIG. 28

Terms in the bit LLRs 3802

| Message 3801 Dec. | Bin. (Column # =>) | Message Bit 3 bit="0" (1) | Message Bit 3 bit="1" (2) | Message Bit 2 bit="0" (3) | Message Bit 2 bit="1" (4) | Message Bit 1 bit="0" (5) | Message Bit 1 bit="1" (6) | Message Bit 0 bit="0" (7) | Message Bit 0 bit="1" (8) |
|---|---|---|---|---|---|---|---|---|---|
| 0 | 0000 | $LLR_0^{sym}$ | | $LLR_0^{sym}$ | | $LLR_0^{sym}$ | | $LLR_0^{sym}$ | |
| 1 | 0001 | $LLR_1^{sym}$ | | $LLR_1^{sym}$ | | $LLR_1^{sym}$ | | | $LLR_1^{sym}$ |
| 2 | 0010 | $LLR_2^{sym}$ | | $LLR_2^{sym}$ | | | $LLR_2^{sym}$ | $LLR_2^{sym}$ | |
| 3 | 0011 | $LLR_3^{sym}$ | | $LLR_3^{sym}$ | | | $LLR_3^{sym}$ | | $LLR_3^{sym}$ |
| 4 | 0100 | $LLR_4^{sym}$ | | | $LLR_4^{sym}$ | $LLR_4^{sym}$ | | $LLR_4^{sym}$ | |
| 5 | 0101 | $LLR_5^{sym}$ | | | $LLR_5^{sym}$ | $LLR_5^{sym}$ | | | $LLR_5^{sym}$ |
| 6 | 0110 | $LLR_6^{sym}$ | | | $LLR_6^{sym}$ | | $LLR_6^{sym}$ | $LLR_6^{sym}$ | |
| 7 | 0111 | $LLR_7^{sym}$ | | | $LLR_7^{sym}$ | | $LLR_7^{sym}$ | | $LLR_7^{sym}$ |
| 8 | 1000 | | $LLR_8^{sym}$ | $LLR_8^{sym}$ | | $LLR_8^{sym}$ | | $LLR_8^{sym}$ | |
| 9 | 1001 | | $LLR_9^{sym}$ | $LLR_9^{sym}$ | | $LLR_9^{sym}$ | | | $LLR_9^{sym}$ |
| 10 | 1010 | | $LLR_{10}^{sym}$ | $LLR_{10}^{sym}$ | | | $LLR_{10}^{sym}$ | $LLR_{10}^{sym}$ | |
| 11 | 1011 | | $LLR_{11}^{sym}$ | $LLR_{11}^{sym}$ | | | $LLR_{11}^{sym}$ | | $LLR_{11}^{sym}$ |
| 12 | 1100 | | $LLR_{12}^{sym}$ | | $LLR_{12}^{sym}$ | $LLR_{12}^{sym}$ | | $LLR_{12}^{sym}$ | |
| 13 | 1101 | | $LLR_{13}^{sym}$ | | $LLR_{13}^{sym}$ | $LLR_{13}^{sym}$ | | | $LLR_{13}^{sym}$ |
| 14 | 1110 | | $LLR_{14}^{sym}$ | | $LLR_{14}^{sym}$ | | $LLR_{14}^{sym}$ | $LLR_{14}^{sym}$ | |
| 15 | 1111 | | $LLR_{15}^{sym}$ | | $LLR_{15}^{sym}$ | | $LLR_{15}^{sym}$ | | $LLR_{15}^{sym}$ |
| 3804 Bit LLR | | $L_3^{bit,0}$ | $L_3^{bit,1}$ | $L_2^{bit,0}$ | $L_2^{bit,1}$ | $L_1^{bit,0}$ | $L_1^{bit,1}$ | $L_0^{bit,0}$ | $L_0^{bit,1}$ |
| | | $LLR_3^{bit,out} =$ $L_3^{bit,0} - L_3^{bit,1}$ 3803 | | $LLR_2^{bit,out} =$ $L_2^{bit,0} - L_2^{bit,1}$ | | $LLR_1^{bit,out} =$ $L_1^{bit,0} - L_1^{bit,1}$ | | $LLR_0^{bit,out} =$ $L_0^{bit,0} - L_0^{bit,1}$ | |

| Message combinations 3801 | | Symbol LLR 3703 | Corresponding apriori bit LLR combination 3901 |
|---|---|---|---|
| Decimal | Binary | | |
| 0 | 0000 | $LLR_0^{sym,in}$ | $LLR_0^{sym,bit} = (LLR_3^{bit,in} + LLR_2^{bit,in} + LLR_1^{bit,in} + LLR_0^{bit,in})/2$ |
| 1 | 0001 | $LLR_1^{sym,in}$ | $LLR_1^{sym,bit} = (LLR_3^{bit,in} + LLR_2^{bit,in} + LLR_1^{bit,in} - LLR_0^{bit,in})/2$ |
| . | . | . | . |
| . | . | . | . |
| 15 | 1111 | $LLR_{15}^{sym,in}$ | $LLR_{15}^{sym,bit} = (-LLR_3^{bit,in} - LLR_2^{bit,in} - LLR_1^{bit,in} - LLR_0^{bit,in})/2$ |

| No. | 6-bit Msg. Value | | Cross-correlation Values: | | | | | | | | | | | | |
|---|---|---|---|---|---|---|---|---|---|---|---|---|---|---|---|
| | | | 0 | | 1 | | 2 | | 3 | | 4 | | 5 | | 6 | |
| | Dec. | Bin. | I | Q | I | Q | I | Q | I | Q | I | Q | I | Q | I | Q |
| 1 | 29 | '011101' | -0.9 | -6.0 | -1.6 | -2.7 | -15.6 | 3.1 | 1.7 | 3.6 | 12.7 | 0.3 | 0.4 | -7.1 | 7.4 | 5.8 |
| 2 | 33 | '100001' | 6.4 | 1.8 | 45.3 | -37.8 | 8.4 | 16.7 | 10.6 | 6.7 | -6.6 | -2.4 | 15.4 | 5.8 | -11.0 | -6.9 |
| 3 | 34 | '100010' | 6.5 | 13.4 | -3.6 | 1.6 | 37.6 | -25.5 | 12.3 | -2.0 | 8.2 | 11.0 | -2.4 | 3.6 | -11.3 | -0.5 |
| 4 | 18 | '010010' | 3.3 | 6.8 | 1.7 | 10.2 | -38.8 | 45.3 | 9.5 | 1.7 | 0.6 | 5.9 | -13.3 | 3.0 | 5.3 | -7.5 |
| 5 | 41 | '101001' | -2.9 | 11.8 | -9.7 | -4.2 | -12.8 | 5.0 | 2.5 | -12.9 | -7.5 | 3.9 | 1.9 | 8.1 | -7.4 | 5.1 |
| 6 | 62 | '111110' | -14.3 | 4.9 | 0.5 | 3.7 | -3.8 | 2.6 | 11.1 | 2.3 | 1.4 | -2.2 | 4.4 | -2.0 | 14.1 | -5.9 |
| 7 | 63 | '111111' | 1.2 | 8.5 | -9.2 | -3.8 | 5.6 | -5.2 | -0.6 | 12.9 | -11.0 | -12.1 | -1.9 | -5.1 | 3.8 | 1.6 |
| 8 | 63 | '111111' | -7.6 | 3.2 | -10.2 | -5.8 | 1.3 | 0.5 | 1.7 | 2.9 | 1.3 | 7.0 | 0.3 | 9.9 | -2.3 | 4.0 |
| 9 | 55 | '110111' | 2.1 | 14.2 | 1.6 | 3.6 | -3.3 | 10.1 | -3.1 | -3.9 | -0.6 | 1.9 | -1.0 | 8.0 | -13.0 | 1.2 |
| 10 | 51 | '110011' | -1.9 | 0.5 | -4.0 | -2.6 | -7.2 | 3.7 | -28.4 | -34.0 | 3.8 | -3.3 | 1.5 | -3.1 | 9.4 | 4.6 |
| 11 | 39 | '100111' | -3.1 | 3.1 | -15.6 | -9.1 | 5.1 | 6.1 | -5.5 | 1.2 | -1.7 | -5.4 | -0.6 | -5.6 | -7.7 | 0.5 |
| 12 | 6 | '000110' | -14.3 | -10.8 | -11.1 | -4.8 | 4.2 | 8.8 | -9.5 | -0.3 | -7.4 | -1.0 | -3.3 | 2.1 | 35.9 | 33.9 |
| 13 | 40 | '101000' | -0.7 | 5.2 | -2.0 | -15.0 | 5.7 | -8.3 | -6.2 | -1.7 | -4.0 | 5.3 | -1.0 | 4.4 | -4.6 | -10.9 |
| 14 | 62 | '111110' | -1.1 | -4.1 | -2.3 | -4.7 | 9.1 | -1.0 | -11.3 | 6.0 | -2.7 | -5.2 | -6.2 | -14.5 | 1.0 | -4.8 |
| 15 | 39 | '100111' | -0.1 | -4.1 | -5.2 | -3.0 | 6.9 | -0.7 | -2.3 | -0.9 | -3.3 | 9.3 | 1.0 | 0.5 | -4.0 | -11.8 |
| 16 | 14 | '001110' | 6.9 | -7.1 | 0.4 | 2.5 | -2.5 | 5.7 | 12.3 | 0.7 | 5.4 | 13.0 | -13.4 | 1.3 | 6.2 | -4.0 |
| 17 | 28 | '011100' | 9.6 | 5.5 | 2.8 | -4.1 | 1.0 | 5.5 | 4.1 | 3.5 | 4.0 | -2.2 | -6.6 | 15.8 | 9.8 | 10.4 |
| 18 | 9 | '001001' | -2.6 | 6.4 | -6.4 | -5.0 | -1.8 | 6.5 | 6.2 | 7.9 | -12.8 | -5.2 | -4.2 | -4.3 | 1.4 | 5.0 |
| 19 | 12 | '001100' | -4.8 | 1.5 | 9.7 | 3.1 | -5.2 | 7.7 | 8.6 | 7.2 | -3.1 | 1.8 | 0.3 | -7.6 | -2.7 | 2.6 |
| 20 | 48 | '110000' | -29.6 | -36.1 | -10.9 | -11.9 | 1.9 | -4.4 | -3.0 | 9.5 | 9.3 | -3.5 | -1.7 | 5.5 | 4.6 | -10.8 |

In-phase_Quadrature-phase (I-Q) Pairs

| 7 | | 8 | | 9 | | 10 | | 11 | | 12 | | 13 | | 14 | | 15 | |
|---|---|---|---|---|---|---|---|---|---|---|---|---|---|---|---|---|---|
| I | Q | I | Q | I | Q | I | Q | I | Q | I | Q | I | Q | I | Q | I | Q |
| 4.8 | 15.7 | -6.7 | 11.9 | -1.5 | 0.7 | -1.8 | -5.1 | 6.8 | 4.1 | -12.8 | -3.1 | -39.2 | 27.4 | -2.7 | -3.6 | -13.0 | -9.2 |
| 6.5 | 7.1 | -9.5 | 15.3 | 3.5 | 0.5 | 2.9 | 14.0 | -9.5 | 13.9 | 6.5 | -5.8 | 10.1 | 3.5 | -1.6 | 4.9 | -7.5 | -6.3 |
| 8.5 | 8.6 | 4.9 | -7.0 | 1.3 | -3.7 | -3.0 | -11.0 | 13.9 | -2.8 | 3.7 | 7.1 | 3.4 | -3.0 | 3.2 | 7.9 | -2.6 | 11.5 |
| -2.5 | 1.2 | 5.5 | 2.4 | -0.1 | -5.3 | -0.4 | 3.4 | -5.5 | -2.3 | 1.0 | -0.4 | 16.1 | -3.3 | -0.4 | -11.8 | -6.7 | -4.1 |
| -2.0 | -11.8 | 0.3 | -2.7 | 39.9 | -45.4 | -6.2 | 0.4 | 5.0 | -7.5 | -2.5 | -6.1 | -3.7 | 5.3 | 5.1 | -5.9 | -11.7 | 16.2 |
| 1.8 | -2.6 | 6.4 | 16.5 | 2.7 | 0.5 | -8.6 | -5.3 | 13.3 | -4.4 | 3.6 | 3.6 | -0.9 | -1.3 | -32.1 | -28.1 | -9.2 | -6.6 |
| -5.8 | -3.1 | 19.0 | -6.1 | 9.4 | -0.3 | 14.4 | -9.0 | 13.3 | -0.3 | 1.0 | 6.2 | 12.5 | -2.1 | 2.3 | 3.3 | -39.0 | -36.1 |
| 0.6 | 15.5 | 15.6 | 2.3 | -2.7 | -8.7 | 2.9 | 13.7 | -1.8 | -8.4 | 12.2 | 2.9 | -2.9 | 9.5 | 5.0 | -1.8 | -30.5 | -49.0 |
| -41.4 | -31.3 | 9.0 | -2.2 | 10.9 | -3.4 | 1.8 | 3.5 | -5.8 | -4.7 | -0.5 | 6.7 | -0.2 | 4.2 | 2.5 | -0.9 | -6.0 | 9.3 |
| -7.3 | 5.8 | -7.3 | 1.8 | 3.1 | 1.4 | 11.4 | 7.3 | 2.5 | -1.6 | 0.0 | -15.0 | -6.8 | 5.7 | 5.7 | 2.2 | 4.7 | -1.6 |
| 37.5 | -32.1 | 5.1 | -5.0 | 4.9 | -4.4 | 8.4 | 0.8 | -8.2 | 9.8 | 11.4 | -1.6 | -2.8 | -14.5 | -10.0 | -1.8 | 2.8 | -3.1 |
| -0.8 | -9.9 | -7.8 | 6.3 | 2.5 | 5.6 | 8.2 | -2.4 | 0.0 | 14.7 | 0.3 | 3.3 | 2.5 | -1.9 | 0.8 | 13.8 | 4.2 | 9.3 |
| 4.1 | 4.9 | 36.2 | -36.5 | -7.2 | 5.3 | -5.4 | -2.2 | 4.3 | 5.7 | 0.8 | -1.9 | -1.3 | -7.8 | -4.2 | -1.8 | -4.5 | 3.1 |
| -5.3 | -12.1 | 7.4 | -0.8 | -8.5 | -4.2 | 5.4 | -1.7 | -0.9 | 3.4 | -12.7 | 0.0 | 0.0 | 5.5 | -27.0 | -38.2 | 0.1 | 4.9 |
| 36.5 | -36.8 | -12.5 | -9.8 | 6.2 | 1.1 | 2.7 | 6.9 | -0.1 | -0.5 | -15.2 | -2.6 | -2.0 | -2.4 | -1.1 | -1.4 | 7.6 | 11.0 |
| 0.8 | 11.5 | 9.7 | -6.8 | 7.0 | 7.0 | 9.3 | -9.6 | -0.8 | -3.8 | -6.1 | 7.8 | 7.8 | -11.5 | 37.1 | 34.9 | 9.3 | -3.4 |
| -7.0 | -5.9 | -14.8 | 4.3 | 2.2 | 4.2 | 3.2 | 3.9 | 3.1 | 3.3 | -29.9 | 28.5 | -7.9 | 1.7 | -7.5 | -3.6 | 3.3 | 0.8 |
| 8.7 | 9.7 | -6.6 | -0.3 | 38.2 | 32.1 | -6.7 | -3.3 | 4.7 | 10.9 | -5.9 | -13.5 | 8.6 | 2.4 | 0.9 | -7.1 | -6.0 | -1.0 |
| 6.4 | -6.3 | -7.6 | 1.8 | 12.2 | 3.2 | 2.0 | -7.5 | 10.3 | -5.8 | 43.3 | 35.4 | -10.6 | -3.2 | 6.4 | 2.5 | 1.3 | -2.7 |
| 12.9 | -0.1 | -0.5 | -6.7 | 0.2 | -4.7 | 1.0 | -10.2 | 2.2 | -2.5 | -11.9 | 7.0 | 2.6 | 2.4 | 19.9 | -8.0 | 0.2 | 7.8 |

FIG. 31B

|  | Message | | Terms in the bit LLR | | | |
|---|---|---|---|---|---|---|
|  | Dec. | Bin. | Message Bit 5 | | Message Bit 4 | |
|  |  |  | bit="0" | bit="1" | bit="0" | bit="1" |
|  | (Column # =>) | | (1) | (2) | (3) | (4) |
|  | 0 | 000000 | $LLR_0^{sym}$ |  | $LLR_0^{sym}$ |  |
|  | 1 | 000001 | $LLR_1^{sym}$ |  | $LLR_1^{sym}$ |  |
|  | 2 | 000010 | $LLR_2^{sym}$ |  | $LLR_2^{sym}$ |  |
|  | 3 | 000011 | $LLR_3^{sym}$ |  | $LLR_3^{sym}$ |  |
|  | . | . | . |  | . |  |
|  | . | . | . |  | . |  |
|  | 15 | 001111 | $LLR_{15}^{sym}$ |  | $LLR_{15}^{sym}$ |  |
|  | 16 | 010000 | $LLR_{16}^{sym}$ |  |  | $LLR_{16}^{sym}$ |
|  | 17 | 010001 | $LLR_{17}^{sym}$ |  |  | $LLR_{17}^{sym}$ |
|  | . | . | . |  |  | . |
|  | . | . | . |  |  | . |
|  | 30 | 011110 | $LLR_{30}^{sym}$ |  |  | $LLR_{30}^{sym}$ |
| 4100 | 31 | 011111 | $LLR_{31}^{sym}$ |  |  | $LLR_{31}^{sym}$ |
|  | 32 | 100000 |  | $LLR_{32}^{sym}$ | $LLR_{32}^{sym}$ |  |
|  | 33 | 100001 |  | $LLR_{33}^{sym}$ | $LLR_{33}^{sym}$ |  |
|  | 34 | 100010 |  | $LLR_{34}^{sym}$ | $LLR_{34}^{sym}$ |  |
|  | 35 | 100011 |  | $LLR_{35}^{sym}$ | $LLR_{35}^{sym}$ |  |
|  | . | . |  | . | . |  |
|  | . | . |  | . | . |  |
|  | 47 | 101111 |  | $LLR_{47}^{sym}$ | $LLR_{47}^{sym}$ |  |
|  | 48 | 110000 |  | $LLR_{48}^{sym}$ |  | $LLR_{48}^{sym}$ |
|  | 49 | 110001 |  | $LLR_{49}^{sym}$ |  | $LLR_{49}^{sym}$ |
|  | . | . |  | . |  | . |
|  | . | . |  | . |  | . |
|  | 62 | 111110 |  | $LLR_{62}^{sym}$ |  | $LLR_{62}^{sym}$ |
|  | 63 | 111111 |  | $LLR_{63}^{sym}$ |  | $LLR_{63}^{sym}$ |
|  |  |  | ↓ $L_5^{bit,0}$ | ↓ $L_5^{bit,1}$ | ↓ $L_4^{bit,0}$ | ↓ $L_4^{bit,1}$ |
|  | 3804 Bit LLR | | $LLR_5^{bit,out} =$ $L_5^{bit,0} - L_5^{bit,1}$ | | $LLR_4^{bit,out} =$ $L_4^{bit,0} - L_4^{bit,1}$ | |

FIG. 32A calculation 3802

| | Message Bit 0 | |
|---|---|---|
| | bit="0" (5) | bit="1" (6) |
| | $LLR_0^{sym}$ | |
| | | $LLR_1^{sym}$ |
| | $LLR_2^{sym}$ | |
| | | $LLR_3^{sym}$ |
| | . | . |
| | . | . |
| | | $LLR_{15}^{sym}$ |
| | $LLR_{16}^{sym}$ | |
| | | $LLR_{17}^{sym}$ |
| | . | . |
| | . | . |
| | $LLR_{30}^{sym}$ | |
| | | $LLR_{31}^{sym}$ |
| | $LLR_{32}^{sym}$ | |
| | | $LLR_{33}^{sym}$ |
| | $LLR_{34}^{sym}$ | |
| | | $LLR_{35}^{sym}$ |
| | . | . |
| | . | . |
| | | $LLR_{47}^{sym}$ |
| | $LLR_{48}^{sym}$ | |
| | | $LLR_{49}^{sym}$ |
| | . | . |
| | . | . |
| | $LLR_{62}^{sym}$ | |
| | | $LLR_{63}^{sym}$ |
| ... | ↓ $L_0^{bit,0}$ | ↓ $L_0^{bit,1}$ |
| ... | $LLR_0^{bit,out} = L_0^{bit,0} - L_0^{bit,1}$ | |

FIG. 32B

| Message combinations 4201 | | OS symbol LLR 3703 | PSK symbol LLR 4202 | Feedback symbol LLR 4203 |
|---|---|---|---|---|
| Decimal | Binary | | | |
| 0 | 00 0000 | $LLR_0^{OS,in}$ | $LLR_0^{PSK,in}$ | $LLR_0^{sym,bit}$ |
| 1 | 00 0001 | $LLR_1^{OS,in}$ | $LLR_1^{PSK,in}$ | $LLR_1^{sym,bit}$ |
| . | . | . | . | . |
| 15 | 00 1111 | $LLR_{15}^{OS,in}$ | $LLR_{15}^{PSK,in}$ | $LLR_{15}^{sym,bit}$ |
| 16 | 01 0000 | $LLR_0^{OS,in}$ | $LLR_{16}^{PSK,in}$ | $LLR_{16}^{sym,bit}$ |
| 17 | 01 0001 | $LLR_1^{OS,in}$ | $LLR_{17}^{PSK,in}$ | $LLR_{17}^{sym,bit}$ |
| . | . | . | . | . |
| 31 | 01 1111 | $LLR_{15}^{OS,in}$ | $LLR_{31}^{PSK,in}$ | $LLR_{31}^{sym,bit}$ |
| 32 | 10 0000 | $LLR_0^{OS,in}$ | $LLR_{32}^{PSK,in}$ | $LLR_{32}^{sym,bit}$ |
| 33 | 10 0001 | $LLR_1^{OS,in}$ | $LLR_{33}^{PSK,in}$ | $LLR_{33}^{sym,bit}$ |
| . | . | . | . | . |
| 47 | 10 1111 | $LLR_{15}^{OS,in}$ | $LLR_{47}^{PSK,in}$ | $LLR_{47}^{sym,bit}$ |
| 48 | 11 0000 | $LLR_0^{OS,in}$ | $LLR_{48}^{PSK,in}$ | $LLR_{48}^{sym,bit}$ |
| 49 | 11 0001 | $LLR_1^{OS,in}$ | $LLR_{49}^{PSK,in}$ | $LLR_{49}^{sym,bit}$ |
| . | . | . | . | . |
| 63 | 11 1111 | $LLR_{15}^{OS,in}$ | $LLR_{63}^{PSK,in}$ | $LLR_{63}^{sym,bit}$ |

| Message combinations 4201 | | Corresponding downstream apriori symbol LLR 4301 |
|---|---|---|
| Decimal | Binary | |
| 0 | 000000 | $LLR_0^{sym,bit} = (LLR_5^{bit,in} + LLR_4^{bit,in} + LLR_3^{bit,in} + LLR_2^{bit,in} + LLR_1^{bit,in} + LLR_0^{bit,in})/2$ |
| 1 | 000001 | $LLR_1^{sym,bit} = (LLR_5^{bit,in} + LLR_4^{bit,in} + LLR_3^{bit,in} + LLR_2^{bit,in} + LLR_1^{bit,in} - LLR_0^{bit,in})/2$ |
| . | . | . |
| . | . | . |
| 63 | 111111 | $LLR_{63}^{sym,bit} = (-LLR_5^{bit,in} - LLR_4^{bit,in} - LLR_3^{bit,in} - LLR_2^{bit,in} - LLR_1^{bit,in} - LLR_0^{bit,in})/2$ |

COMMUNICATION UNIT FOR SOFT-DECISION DEMODULATION AND METHOD THEREFOR

FIELD OF THE INVENTION

The field of the invention relates to a communication unit for soft-decision demodulation and decoding of communication packets in a receiver chain. The field of the invention is applicable to, but not limited to, demodulation for current and future generations of communication standards.

BACKGROUND OF THE INVENTION

Orthogonal Signalling (OS) is a known communications technique. In a transmitter of a communication unit that employs OS, a sequence of k bits (each of the k bits having a value '0' or '1') is converted into an integer in a range '0' to '$2^k-1$' using binary-to-decimal conversion. This integer is then used as an index to select a particular one of $2^k$ communication sequences to transmit. In OS, the set of $2^k$ communication sequences are designed to be orthogonal to each other, such that they can be readily distinguished from each other. The selected one of the $2^k$ communication sequences is transmitted over a communication channel, which may impose distortion upon it owing to the effects of noise, interference, dispersion, fading, Doppler, etc. As a result, the received sequence will typically differ from the transmitted sequence to some degree and the orthogonality of the sequences may not be preserved.

In the corresponding OS receiver, a bank of $2^k$ correlators is used. Each correlator compares the received signal with a corresponding one of the $2^k$ orthogonal communication sequences, which are known to the receiver. Each of the $2^k$ correlators produces a correlation metric, which will adopt a magnitude that quantifies the strength of the correlation between the received signal and the corresponding one of the $2^k$ orthogonal communication sequences. More specifically, a high magnitude indicates a high correlation and, hence, a high confidence that the corresponding one of the $2^k$ orthogonal communication sequences was the one that was transmitted. By contrast, a low magnitude indicates a low correlation and, hence, a low confidence that the corresponding one of the $2^k$ orthogonal communication sequences was the one that was transmitted. The receiver compares the $2^k$ magnitudes output by the bank of $2^k$ correlators to identify the one having the highest magnitude. The index of the correlator producing the highest magnitude is identified in the range 0 to $2^k-1$. Finally, a hard decision on the values of the bits in the sequence of k bits is obtained by performing decimal-to-binary conversion on the index of the correlator producing the highest magnitude.

In a conventional OS communications scheme when the channel conditions are favourable, it may be expected that the received sequence will be similar to the one of the $2^k$ orthogonal communication sequences that was selected to be transmitted. In this case, it may be expected that only the correct one of the correlators in the receiver's bank of $2^k$ correlators will produce an output having a high magnitude and that the decimal-to-binary conversion will identify the correct bit sequence, without errors.

However, when the channel conditions are unfavourable, it may be that the received sequences will not be very similar to any of the $2^k$ orthogonal communication sequences, but that it may be somewhat similar to two or more of them, which may or may not include the one of the $2^k$ orthogonal communication sequences that was selected to be transmitted. In this case, two or more of the correlators in the receiver's bank of $2^k$ correlators will produce an output having a relatively high magnitude and the correct one may not have the highest magnitude, particularly in the case where the channel does not preserve the orthogonality of the communication sequences. In this case, the decimal-to-binary conversion will identify an incorrect bit sequence, containing some bit errors. This may be mitigated by applying a channel encoder in the transmitter, to encode the bit sequence, before mapping it onto an OS sequence. In the receiver, the recovered bit sequence may then be passed through a corresponding channel decoder, in order to mitigate the bit errors that result from unfavourable channel conditions.

However, it is well understood that a channel decoder's ability to correct bit errors is limited, when operating on the basis of hard decisions. Suppose that in an OS scheme, the received sequence was similar to two of the $2^k$ orthogonal communication sequences, namely slightly less similar to the correct one of the $2^k$ orthogonal communication sequences and slightly more similar to an incorrect one of the $2^k$ orthogonal communication sequences. In this case, the magnitudes output by the two corresponding correlators will be similar, but the incorrect one will be slightly higher. During the generation of the hard decisions through decimal-to-binary conversion, the only knowledge preserved is that a particular one of the correlators had the highest magnitude. The knowledge that two of the correlators had similar magnitudes will be lost, and the channel decoder will be denied knowledge that there was another (slightly less likely) sequence of k bits that was also a candidate. In order to resolve this, it is known that a soft-decision channel decoder provides a stronger error correction capability, provided that the receiver can provide soft-decisions. These soft decisions express not only what the most likely value of each bit is (like a hard-decision receiver), but also how likely that value is (unlike a hard-decision receiver). More specifically, the magnitudes output by the bank of $2^k$ correlators can be used to determine the likelihood of each of the corresponding $2^k$ orthogonal communication sequences being correct and then these likelihoods can be converted into likelihoods of each of the k bits having a value of 0 or 1.

However, the inventors of the present invention have identified that the literature lacks a mathematically rigorous and robust method for converting the magnitudes output by the bank of $2^k$ correlators into the likelihood of each of the corresponding $2^k$ orthogonal communication sequences and then converting these into the likelihoods of each of the k bits having a value of 0 or 1.

SUMMARY OF THE INVENTION

In some implementations, the present invention provides soft-decision demodulators and methods for soft-decision demodulation using aggregated correlator output distributions, for example with improved quality of soft-decisions. In particular, examples of the present invention describe estimations of the aggregated correlator output distributions and their use for soft-decision demodulation. These and other aspects of the invention will be apparent from, and elucidated with reference to, the example embodiments described hereinafter.

In a first aspect of the invention, a communication unit for performing soft-decision demodulation comprising a receiver is described. The receiver is arranged to receive a transmitted signal conveying a first set of bits comprising k bits that has been selected from a set of $2^k$ possible signals. The receiver comprises: a demodulator comprising a bank of $2^k$ correlators and configured to: detect a transmission of each possible transmitted signal, and output $2^k$ magnitudes of correlator outputs, based on the detected possible transmitted signals, by the bank of $2^k$ correlators as a first set of inputs. The receiver also comprises a de-mapper circuit coupled to the demodulator and configured to receive the first set of inputs; determine statistics derived from a plurality of aggregated correlator output magnitude distributions of the first set of inputs, wherein the plurality of aggregated correlator output magnitude distributions is fewer than $2^{2k}$; and calculate therefrom and output a first set of aposteriori soft bits comprising k soft bits. In this manner, high quality soft-decisions can be obtained in a robust and practical manner, which is not dependent on and sensitive to an excessive number of correlator output magnitude distributions.

In an optional example, the plurality of aggregated correlator output magnitude distributions may be two, and wherein a first aggregated correlator output magnitude distribution may approximate an aggregation of the $2^k$ distributions of the output magnitudes of the $2^k$ correlators when a corresponding one of the $2^k$ possible signals was selected as the transmission signal, and wherein a second aggregated correlator output magnitude distribution may approximate an aggregation of a remaining $2^{2k}-2^k$ distributions of the output magnitudes. In this manner, the number of correlator output magnitude distributions becomes small, leading to a high degree of practicality and robustness.

In an optional example, the first and second aggregated correlator output magnitude distributions may each be represented by a first set of distribution parameters. In this manner, rather than using a histogram to represent each correlator output magnitude distribution, the amount of information required to represent each correlator output magnitude distribution becomes small, leading to a high degree of practicality and robustness. Furthermore, the fitting function used to generate the parameters may be able to fill in the gaps between samples, leading to increased robustness.

In an optional example, the first set of distribution parameters may comprise a non-centrality parameter (s) and a scale parameter (sigma). In this manner, the amount of information required to represent each correlator output magnitude distribution becomes small at just two parameters, leading to a high degree of practicality and robustness.

In an optional example, the de-mapper circuit may be configured to perform at least one of the following: estimate the first set of distribution parameters of the first aggregated correlator output magnitude distribution by fitting a first probability distribution to the magnitudes of correlator outputs obtained by correlating received synchronisation signals with correlators corresponding to known synchronisation signals; estimate the first set of distribution parameters of the second aggregated correlator output magnitude distribution by fitting a second probability distribution to the magnitudes of correlator outputs obtained by correlating received synchronisation signals with the $2^k-1$ correlators corresponding to signals other than the known synchronisation signal; estimate the first set of distribution parameters of the first aggregated correlator output magnitude distribution by fitting a third probability distribution to the magnitudes of correlator outputs having the greatest magnitude among sets of $2^k$ correlator outputs obtained by the bank of $2^k$ correlators; estimate the first set of distribution parameters of the second aggregated correlator output magnitude distribution by fitting a fourth probability distribution to the magnitudes of the $2^k-1$ correlator outputs that do not have the greatest magnitude among sets of $2^k$ correlator outputs obtained by the bank of $2^k$ correlators; select the first set of distribution parameters of the first and second aggregated correlator output magnitude distributions from a look-up-table coupled to the de-mapper circuit. In this manner, the receiver does not need to have prior knowledge of the distribution parameters and can instead estimate them based on the received signal, leading to a high degree of practicality.

In an optional example, at least one of the first, second, third or fourth probability distributions may be the Rician distribution. In this manner, a strong resemblance to the distribution of real signals may be expected, leading to high quality soft-decisions and increased robustness.

In an optional example, the output magnitudes of the $2^k$ correlators may be combined with the first set of distribution parameters of the first and second aggregated correlator output magnitude distributions in order to obtain a first set of apriori soft signals comprising $2^k$ soft magnitudes. In this manner, the contribution of each correlator output to the soft-decision demodulation can be expected to be commensurate to the appropriate level of confidence that they provide, leading to high quality soft decisions.

In an optional example, the de-mapper circuit may be configured to accept a second set of apriori soft signals comprising k soft bits as a second set of inputs. In this manner, feedback information provided by a channel decoder can enhance the soft-decision demodulation in an iterative manner, leading to high quality soft decisions.

In an optional example, the first set of aposteriori soft bits are combined with the soft bits of the second set of apriori soft signals, in order to obtain a first set of extrinsic soft bits comprising k soft bits. In this manner, a positive feedback loop between the channel decoder and the soft-decision demodulator is avoided, leading to high quality soft decisions.

In an optional example, the communication unit combines all apriori soft signals to generate a set of $2^k$ aposteriori soft signals and wherein the set of $2^k$ aposteriori soft signals are combined to obtain the first set of aposteriori soft bits. In this manner, all available information makes an appropriate contribution to the soft decisions, leading to high quality soft decisions.

In an optional example, the transmitted signal also conveys a second set of bits comprising $Q_m$ bits where a phase of the received transmitted signal has been rotated using a rotation selected from a set of $2^{Q_m}$ possible rotations, and the demodulator is configured to output an additional $2^k$ phases of the correlator outputs as a third set of inputs, to the de-mapper circuit. The de-mapper circuit may be configured to: determine statistics derived from a number of aggregated correlator output phase distributions of the third set of inputs; and calculate a second set of aposteriori soft bits comprising $Q_m$ soft bits based on the derived statistics. In this manner, high quality soft decisions can be obtained when additional bits are modulated onto the phase of the transmission signal, leading to an improved spectral efficiency.

In an optional example of the communication unit, the number of aggregated correlator output phase distributions may be one, and the aggregated correlator output phase distribution approximates an aggregation of the $2^k$ distributions of the additional $2^k$ phases of the correlator outputs when a corresponding one of the $2^k$ possible signals was selected as the transmission signal. In this manner, the number of correlator output phase distributions becomes small, leading to a high degree of practicality and robustness.

In an optional example of the communication unit, the aggregated correlator output phase distribution may be represented by a second set of distribution parameters. In this manner, rather than using a histogram to represent each correlator output phase distribution, the amount of information required to represent each correlator output phase distribution becomes small, leading to a high degree of practicality and robustness. Furthermore, the fitting function used to generate the parameters may be able to fill in the gaps between samples, leading to increased robustness.

In an optional example of the communication unit, the second set of distribution parameters may comprise a spreading parameter $sigma_{phase}$. In this manner, the amount of information required to represent each correlator output phase distribution becomes small at just one parameter, leading to a high degree of practicality and robustness.

In an optional example, the de-mapper circuit may be configured to perform at least one of the following: estimate the second set of distribution parameters of the aggregated correlator output phase distribution by fitting a fifth probability distribution to phase errors of correlator outputs obtained by correlating received synchronisation signals with correlators corresponding to known synchronisation signals; estimate the second set of distribution parameters of the aggregated correlator output phase distribution by fitting a sixth probability distribution to phase errors of correlator outputs having the greatest magnitude among sets of $2^k$ correlator outputs obtained by the bank of $2^k$ correlators; select the second set of distribution parameters of the aggregated correlator output phase distribution from a look-up-table coupled to the de-mapper circuit. In this manner, the receiver does not need to have prior knowledge of the distribution parameters and can instead estimate them based on the received signal, leading to a high degree of practicality.

In an optional example of the communication unit, at least one of the fifth or sixth probability distributions may be the Gaussian distribution. In this manner, a strong resemblance to the distribution of real signals may be expected, leading to high quality soft-decisions and increased robustness.

In an optional example, the output phases of the $2^k$ correlators may be combined with the second set of distribution parameters of the aggregated correlator output phase distribution in order to obtain a third set of apriori soft signals comprising $2^{k+Q_m}$ soft phases. In this manner, the contribution of each correlator output to the soft-decision demodulation can be expected to be commensurate to the appropriate level of confidence that they provide, leading to high quality soft decisions.

In an optional example, the de-mapper circuit may be configured to accept a fourth set of apriori soft signals comprising $Q_m$ soft bits as a fourth set of inputs. In this manner, feedback information provided by a channel decoder can enhance the soft-decision demodulation in an iterative manner, leading to high quality soft decisions.

In an optional example, the second set of aposteriori soft bits may be combined with the soft bits of the fourth set of apriori soft signals, in order to obtain a second set of extrinsic soft bits comprising $Q_m$ soft bits. In this manner, a positive feedback loop between the channel decoder and the soft-decision demodulator is avoided, leading to high quality soft decisions.

In an optional example, the communication unit may combine all apriori soft signals to generate a set of $2^{k+Q_m}$ aposteriori soft signals and wherein the set of $2^{k+Q_m}$ aposteriori soft signals is combined to obtain the first set of aposteriori soft bits and the second set of aposteriori soft bits. In this manner, all available information makes an appropriate contribution to the soft decisions, leading to high quality soft decisions.

In a second aspect of the invention, a method for performing soft-decision demodulation comprising a communication unit having a receiver, the receiver having a de-mapper circuit coupled to a demodulator that comprises a bank of $2^k$ correlators, is described. The method at the receiver comprises: receiving a transmitted signal that conveys a first set of bits comprising k bits that has been selected from a set of $2^k$ possible signals: detecting a transmission of each possible transmitted signal; outputting $2^k$ magnitudes of correlator outputs, based on the detected possible transmitted signals, by the bank of $2^k$ correlators as a first set of inputs; determining statistics derived from a plurality of aggregated correlator output magnitude distributions of the first set of inputs, wherein the plurality of aggregated correlator output magnitude distributions is fewer than $2^{2k}$; and calculating therefrom and output a first set of aposteriori soft bits comprising k soft bits.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

FIG. 26 illustrates an AWGN_0 db dataset for an example OS scheme, illustrating a first 20 rows out of 8100, according to some example embodiments of the invention.

FIG. 28 illustrates 4-bit message combinations and corresponding symbol LLR parameters, according to some example embodiments of the invention.

FIG. 29 illustrates terms in a bit LLR calculation, when there is no feedback from a decoder, according to some example embodiments of the invention.

FIG. 30 illustrates 4-bit message combinations, with corresponding symbol LLR parameters and apriori bit LLR combinations, according to some example embodiments of the invention.

FIG. 31A and FIG. 31B illustrate a AWGN_0 db dataset of a 16OS-QPSK scheme illustrating a first 20 rows out of 8100, according to some example embodiments of the invention.

FIG. 32A and FIG. 32B illustrate terms in a symbol-bit LLR conversion for 6-bit messages of FIG. 31, according to some example embodiments of the invention.

FIG. 33 illustrates the 6-bit message combinations and corresponding LLR parameters, according to some example embodiments of the invention.

FIG. 34 illustrates a conversion of apriori bit LLRs into a symbol LLR domain, according to some example embodiments of the invention.

DETAILED DESCRIPTION

In order to mitigate the problem that the literature lacks a mathematically rigorous and robust method for converting the magnitudes output by a bank of $2^k$ correlators into a likelihood of each of the corresponding $2^k$ orthogonal communication sequences, and then converting these into the likelihoods of each of the k bits having a value of 0 or 1, the inventors of the present invention have described the following in a first section of the description. A communication unit and method for performing soft-decision demodulation, comprising a receiver, is described. The receiver is arranged to receive a transmitted signal conveying a first set of bits comprising k bits that has been selected from a set of $2^k$ possible signals. The receiver includes a demodulator comprising a bank of $2^k$ correlators and configured to: detect a transmission of each possible transmitted signal, and output $2^k$ magnitudes of correlator outputs, based on the detected possible transmitted signals, by the bank of $2^k$ correlators as a first set of inputs. The receiver also includes a de-mapper circuit coupled to the demodulator and configured to receive the first set of inputs; determine statistics derived from a plurality of aggregated correlator output magnitude distributions of the first set of inputs, wherein the plurality of aggregated correlator output magnitude distributions is fewer than $2^{2k}$; and calculate therefrom and output a first set of aposteriori soft bits comprising k soft bits. In this manner, a first solution provides a soft demapping approach for OS-only correlator outputs that enables high quality soft-decisions to be obtained in a robust and practical manner, which is not dependent on and sensitive to an excessive number of correlator output magnitude distributions.

In addition, in a second section of the description, a soft-decision approach in demapping of a demodulator's correlator outputs from an orthogonal signalling-phase-shift keying (OS-PSK) modulation scheme into extrinsic soft bits in the form of logarithmic likelihood ratios (LLRs)—also known as bit LLRs or soft bits is described, according to some examples of the invention. Here, a Convert to PSK symbol LLRs circuit and a Symbol-to-symbol LLR circuit may additionally be used, whereby a transmitter chain applies a direct-sequence spread spectrum (DSSS) technique and a modulator circuit converts information bits into OS-PSK modulated data. In this manner, the extrinsic soft bits produced for the PSK-modulated bits are consistent with those produced for the OS-modulated bits, expressing a relatively appropriate level of confidence in the bit values.

Correlator Distribution Investigation and Conversion to Symbol LLRs: OS Scheme

Figure 1:
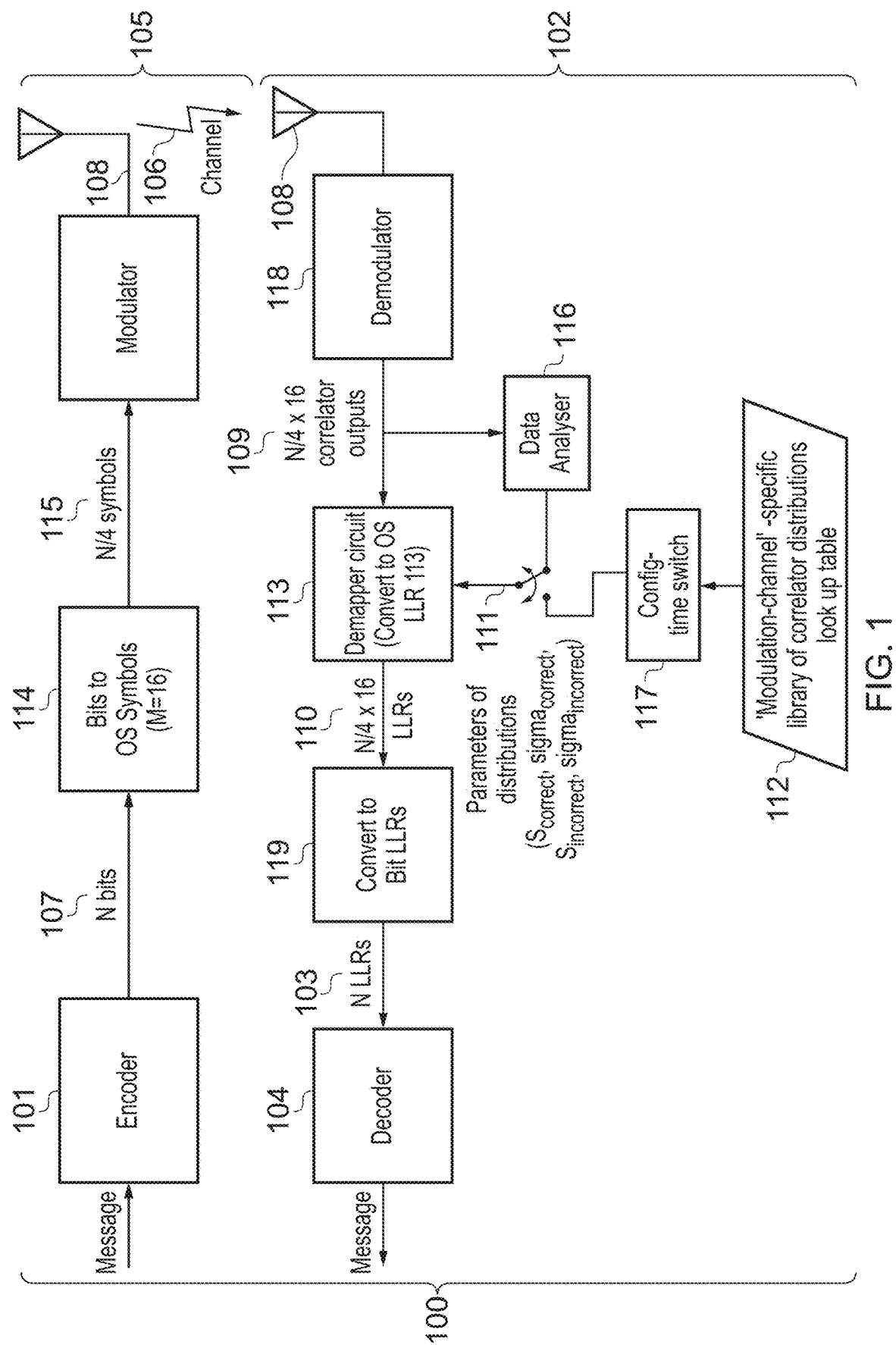
FIG. 1 illustrates a top-level block diagram of an OS-scheme transmission system adapted according to example embodiments of the present invention.

Referring now to FIG. 1, a top-level block diagram of an OS-scheme transmission system that has been adapted according to example embodiments of the present invention is illustrated. Example embodiments of the present invention provide a receiver circuit in a receiver 102 of an Orthogonal Signalling (OS) transmission system 100 that detects each received OS signal using a bank of correlators and demaps the correlator output values into a set of soft bits 103, where the soft bits 103 are fed into a soft-decision channel decoder 104. In some examples, this demapper operates in a receiver circuit for performing soft-decision demodulation in a transmission system 100 comprising a transmitter 105, a channel 106 and a receiver 102, wherein the transmitter signals a set of bits 107 comprising k bits by transmitting an OS transmission signal 108 that is selected from a set of $2^k$ possible signals according to the values of the k bits. The receiver 102 uses a bank of $2^k$ correlators to detect the transmission of each possible signal, and wherein the $2^k$ magnitudes of the correlator outputs 109 are provided as a set of inputs to the demapper circuit 113 The demapper circuit 113 calculates a set of aposteriori soft signals 110 based on statistics from data analyser 116 and parameters 111 derived from a plurality of aggregated correlator output magnitude distributions.

In some examples, the aggregation operation is not directly in the flow from received correlator outputs to soft-demodulated LLRs. Instead, in some examples including the illustrated example, the aggregation may be performed upon the statistics of the channel, for example in advance during an offline look up table process, or for example in advance using an online channel estimation process. For completeness it is confirmed that only the distribution parameters (e.g., s and sigma) extracted from the aggregation that are used in the direct flow from input to output. In some examples, the demapper circuit 113 is referred to as a soft demapper, since it generates soft signals. These soft signals may then be converted into soft bits 103, according to an example process that is demonstrated in the flowchart of FIG. 35 and is described later.

In this way, examples of the present invention provide a mathematically rigorous and robust circuit architecture and method of converting the magnitudes output by a bank of $2^k$ correlators into a likelihood of each of the corresponding $2^k$ orthogonal communication sequences and then converting these into the likelihoods of each of the k bits having a value of '0' or '1', thereby addressing the problem described in the background section.

In examples of the invention, investigations were carried out on the distributions of a demodulator's correlator outputs (also referred to as 'cross-correlation values') in order to identify the possibilities of using the distribution characteristics for the soft demapping of correlator outputs into soft signals that may be used to generate soft bits. Also, as part of soft demapping, a circuit was developed (in Matlab) that converts the magnitudes of the correlator outputs into a set of soft magnitudes in a form of logarithmic-likelihood ratios (LLRs), in one example embodiment, by using a plurality of aggregated correlator output magnitude distributions.

Figure 35A:
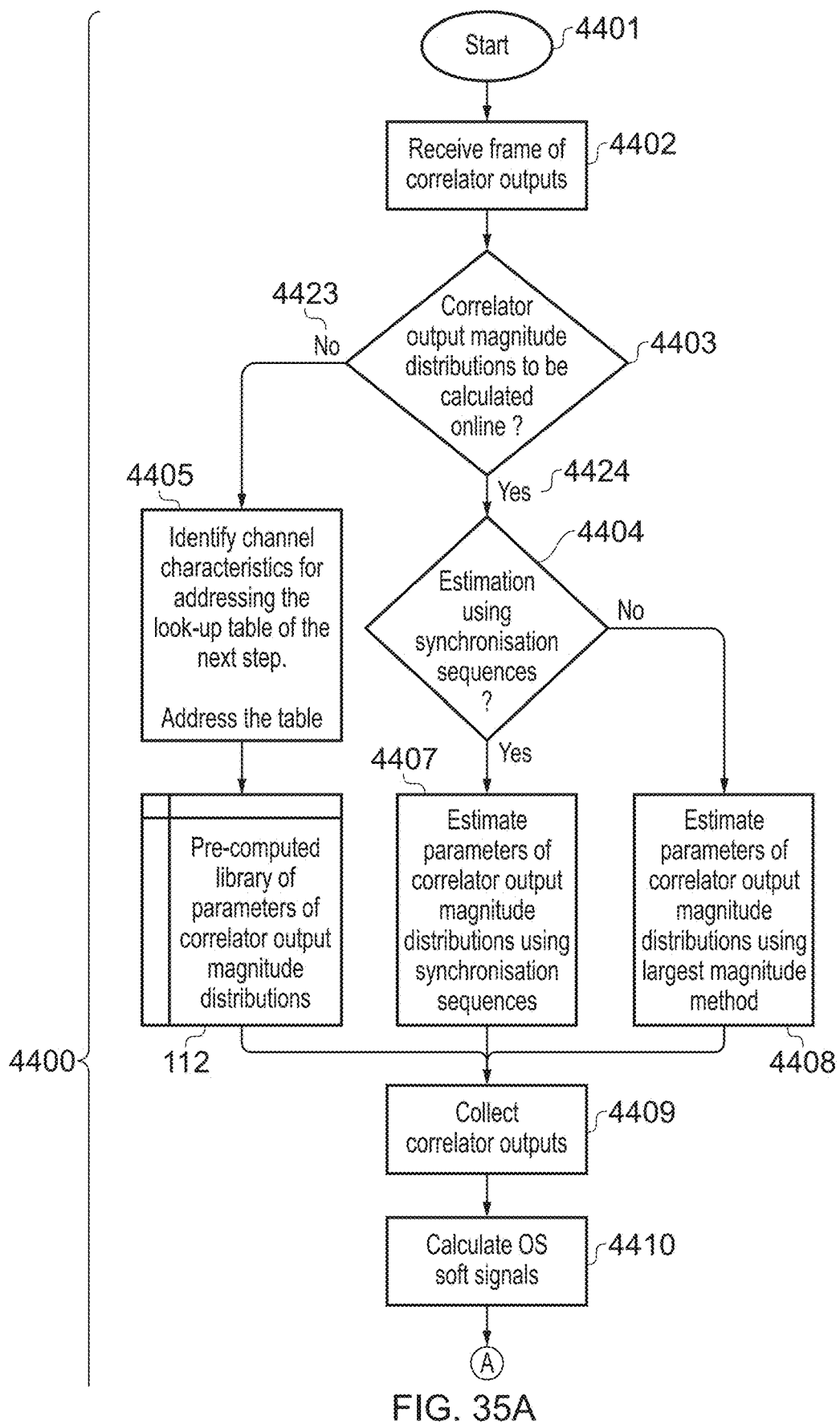
FIG. 35A and FIG. 35B illustrate a flowchart of a soft demapping approach for an OS scheme, according to some example embodiments of the invention.

Examples of the invention focus on two parts of FIG. 1, namely: characterising the 'Modulation-channel-specific library of correlator distributions' look up table 112 (also identified in step 4405 in FIG. 35A), and development of the demapper circuit 113 arranged to convert the correlator outputs to OS symbol LLRs (also identified in step 4410 in FIG. 35A).

A skilled artisan in this field may implement some of the hereafter described circuits in hardware, firmware or software, such as CRC, encoder 101, bits-to-symbols circuit, modulator, demodulator, correlator and decoder. Hence, the various ways that these circuits can be implemented will not be described in any more detail than is necessary for a skilled person to replicate the concepts described herein.

Data

In order to model the transmitter and the channel, six datasets of correlator output values of a demodulator were used, obtained with different channel conditions, where the datasets were provided by [5]. These datasets are based on three signal-to-noise ratio (SNR) values of 0 dB, −3 dB and −7.5 dB, and based on two channel models: the additive white Gaussian noise (AWGN) channel and the multipath (MP) channel. The data is generated based on an M-ary orthogonal signalling (OS) transmission scheme for M=16 (as shown in FIG. 1), where M is a power of 2. This means that every k=$\log_2$(M)=4 bits is converted in bits to symbol circuit 114 into an OS symbol in the transmitter 105. The datasets are represented in this document using the following notations: AWGN_0 dB, AWGN_-3 dB, AWGN_-7.5 dB, MP_0 dB, MP_-3 dB, MP_-7.5 dB.

Referring for example to FIG. 26, an AWGN_0 db dataset 3500 for an example OS scheme illustrates a first 20 rows out of 8100, according to some example embodiments of the invention. For example, FIG. 26 shows the first twenty rows 3501 of the dataset AWGN_0 db, where each dataset has 8100 rows of data. Each row in a dataset has one symbol (with a value 3502 in a range [0,M−1] or [0,15]) and corresponding one of M=16 transmitted codes (with indices in a range [0,M−1] or [0,15]) where there is a cross-correlation magnitude 3503 for each of the 16 codes. Although this example embodiment uses M=16, it is envisaged that the concepts and definitions described herein can be applied to any value of M=$2^k$.

Amongst the M=16 correlator outputs per symbol, the correlator output with the transmitted code index is assumed to be equal to the symbol value as the "correct" correlator output, as shown by the bold numbers in FIG. 26. The remaining M−1=15 correlator outputs in the row for that symbol are assumed to be the "incorrect" correlator outputs, as demonstrated by the non-bold correlator values in FIG. 26. For example, the $16^{th}$ row 3504 in FIG. 26 has a symbol value '5' (perhaps for a 4-bit message "0101"), for which the transmitted code with the index 5 is the correct correlator, with a magnitude of 49.9. For the same symbol, codes of indices in the range [0, 4]∨[6, 15] are the incorrect correlator outputs, with magnitudes in the range [6.0, 13.2]. The analogy of correct and incorrect can be understood in this high-SNR example, where the code with the highest cross-correlation magnitude nearly always has the 'correct' index.

Distribution of Correlator Outputs

As shown in FIG. 1, the demapper circuit 113 is arranged to receives the magnitudes of the correlator outputs 109 as an input, and has knowledge of the parameters 111 of the aggregated correlator output magnitude distributions (which are shown as an additional input in FIG. 1) and converts the correlator outputs to OS symbol LLRs. Hereafter, the term 'circuit' is intended to encompass any electronic circuit or component or arrangement of logic gates, modules, function in hardware or firmware, as well as any function implemented as a software operation, noting that various implementations of the concepts described herein may be implemented using either hardware, firmware, software or any combination thereof, for example depending upon the prevailing application, use, etc., as would be understood to those skilled in the art. In order to support the later discussion of the "Convert to OS LLRs" circuit, this section details the correlator output distributions. More specifically, a later section details an aggregation of the correlator output distributions, according to some example embodiments of the present invention. Following this, a later section details the parameterisation of the aggregated correlator output distributions, allowing the aggregated distributions to be described using a small number of parameter values, according to some example embodiments of the present invention. Finally, a later section discusses how the parameter values may be estimated in practical applications, according to some example embodiments of the present invention.

Number of Distributions

Figure 2:
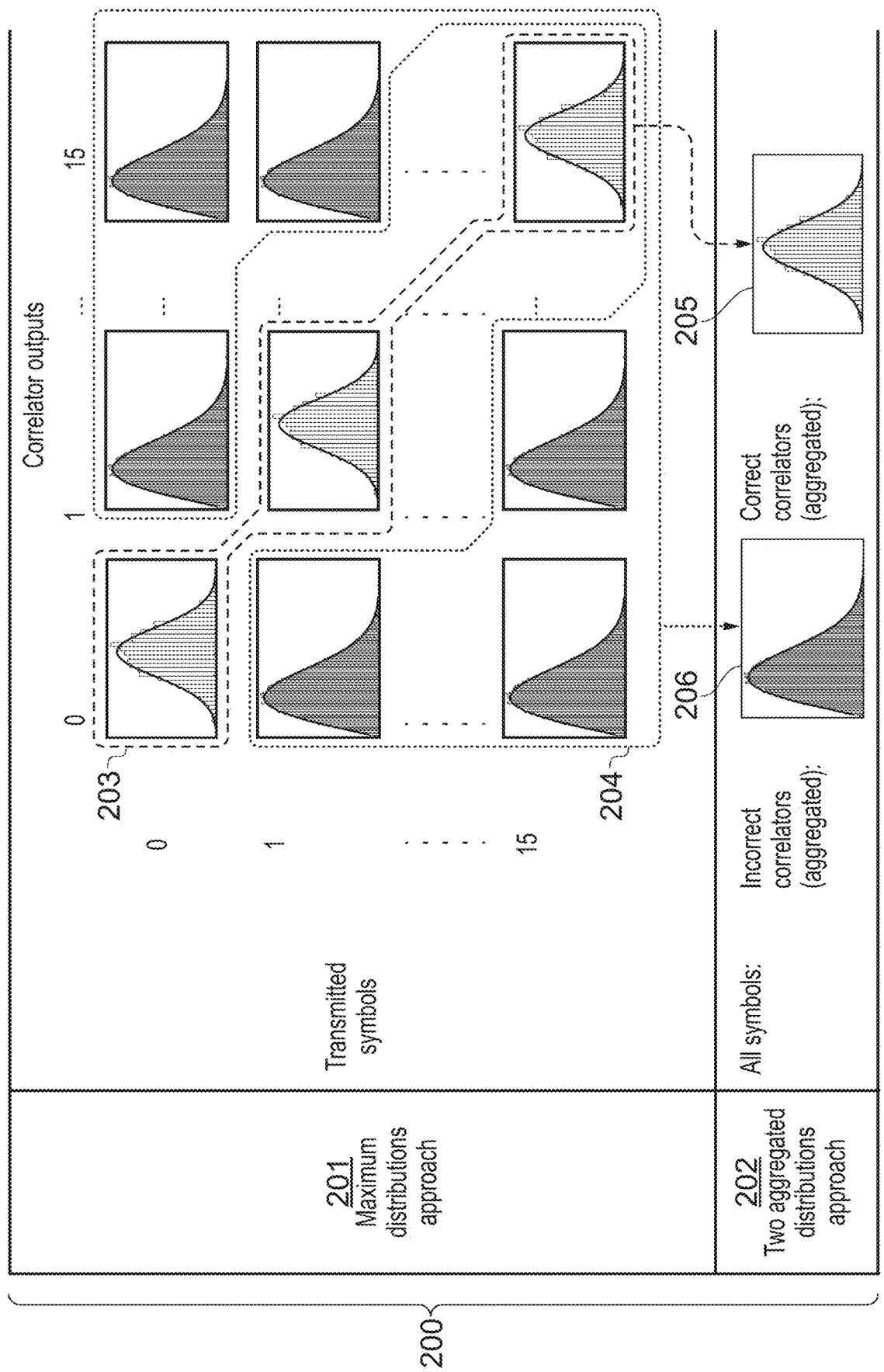
FIG. 2 illustrates examples of: a) maximum, and b) two aggregated, approaches in obtaining distributions of the correlator outputs of the OS-scheme transmission system of FIG. 1.

The maximum number of distributions that can be used to calculate OS LLRs for k-bit transmissions is $2^{2k}$, as explained in the following. Given the relatively large number of symbols (resembling transmissions) in each of the six datasets (with 8100 rows), there are several rows for each symbol value, and hence there exists several sets of M=16 correlator outputs per symbol value. For example, there are four rows 3505 in FIG. 26 with a symbol value of '7'. The way to obtain the maximum number of distributions is to, for every symbol value and from all dataset rows with this symbol value, obtain the distribution of all correlator values with code index '0', obtain the distribution of all correlator values with code index '1', and so on to code index M−1=15. This way, every symbol value, will have M=16 distributions of correlator outputs, where one corresponds to the correct correlator outputs and the other M−1 (or fifteen) correspond to the incorrect correlator outputs. This is shown at 200 in FIG. 2, where FIG. 2 illustrates a) maximum distribution 201, and b) two aggregated distribution 202, approaches in obtaining distributions of the correlator outputs. As there are M=16 symbol values, there will be an overall of M*M or $2^{2k}$=256 distributions for one dataset using this approach, as shown in FIG. 2. In this figure, the rows in the top (maximum distribution) approach 201 correspond to different symbol values, and columns show different code indices. Notably, the distributions on the diagonal line 203 belong to the correct correlator outputs, and the incorrect correlator outputs are characterised by the remaining $2^{2k}$-$2^k$ distributions 204 in FIG. 2.

It is also possible to aggregate the $2^{2k}$ distribution into just two distributions for calculating symbol LLRs: (i) the aggregation of the distributions of all the correct correlator output values 205, and (ii) the aggregation of the distributions of all the incorrect correlator output values 206, as illustrated and referred to as a two aggregated distributions approach 202. Here, in this two aggregated distributions approach 202, the distributions will not be specific to a single symbol and instead show the characteristics of data corresponding to all symbols. Also, the incorrect distribution will not be specific to a single code index and represents incorrect correlator outputs for all code indices. This contrasts with the maximum distributions approach 201, which had a separate distribution for each pair of 'sent symbol—correlator index'. In the two aggregated distributions approach 202, the incorrect 206 and correct 205 distributions provide collective representations of their corresponding distributions in the maximum distributions approach 201, as shown in FIG. 2. The maximum distributions approach 201, compared to the two aggregated distributions approach 202, therefore provides a more specific representation of the correlator output values. However, the maximum distributions approach 201 comprises $M^2$=256 distributions, each of which is parameterised by a few parameters, which in some examples of the invention may be considered to introduce excessive complexity. A further concern in some examples may be that the maximum distributions approach may be over tuned and may not be robust to varying channel conditions. Note that an assumption of the two aggregated distributions approach 202 is that the correct distributions of the M=16 symbols are all similar to each other and that the remaining incorrect distributions are all similar to each other. In experiments the inventors of the present invention found that this assumption is sufficiently valid to enable good operation.

In summary, in some examples, a two aggregated distributions approach 202 is proposed, wherein the plurality of aggregated correlator output magnitude distributions is two, and wherein the first aggregated correlator output magnitude distribution approximates the aggregation 205 of the $2^k$ distributions on the diagonal line 203 of the output magnitudes of the $2^k$ correlators when the corresponding one of the $2^k$ possible signals was selected as the transmission signal, and wherein the second aggregated correlator output magnitude distribution approximates the aggregation 206 of the $2^{2k}$-$2^k$ distributions 204 of the output magnitudes of the $2^k$ correlators when the corresponding one of the $2^k$ possible signals was not selected as the transmission signal.

Fitting Distributions to Data

In some examples of the invention, in order to fit distributions to the correlator outputs from the six datasets of correlator output values of a demodulator used to model the transmitter and the channel, each dataset is divided into two sets of values: the set of all correct correlator outputs and the set of all incorrect correlator outputs, according to the two aggregated distributions approach described above. Through investigations, to each of the two correlator sets of data, and for all datasets, several distributions (such as normal, Rayleigh, Rician, etc) have been fit using Matlab's fitdist command. The complete list of distributions considered can be found at: https://www.mathworks.com/help/stats/fitdist.html#btu538h-distname. Based on visual observation it was concluded that normal and Rayleigh distributions are good fits for the correct and incorrect sets of correlator data, respectively. In the example investigations, since the normal and the Rayleigh distributions are both special cases of the Rician distribution, it was also concluded that the Rician distribution fits both correct and incorrect data. All the other distributions accepted by the fitdist command (a total of 24 accepted distributions) did not fit well to the data, unless they were also generalisations of the Rician distribution. More specifically, it was found that the Nakagami and Weibull distributions were also good fits for the incorrect data, but they do not also generalise the normal distribution and so they do not offer good fits for the correct data.

Given that the Rician distribution is a generic case of both normal and Rayleigh distributions, the Rician distribution was chosen in some examples of the invention so that comparisons can be made between correct and incorrect sets of correlator outputs. The Rician distribution has two parameters, the non-centrality parameter(s) and the scale parameter ($\sigma$), with similar analogies to the mean and variance parameters of normal distributions. Therefore, for each dataset there will be four distribution parameters of the correlator outputs; $s_{corr}$ and $\sigma_{corr}$ of the correct correlator outputs distribution, and $s_{incorr}$ and $\sigma_{incorr}$ of the incorrect correlator outputs distribution. Note that Rician distributions with certain conditions are special cases of some distributions in the chi family of distributions. For example, assuming a random variable R is Rician distributed with a non-centrality parameters and a scale parameter $\sigma$=1, R also follows a noncentral chi distribution with two degrees of freedom, and $R^2$ will have a non-central chi-squared distribution with two degrees of freedom and a non-centrality parameter $s^2$. Therefore, a set of correlator output values with a Rician distribution of σ=1 can be modelled using the mentioned chi and chi-squared distributions.

Figure 3:
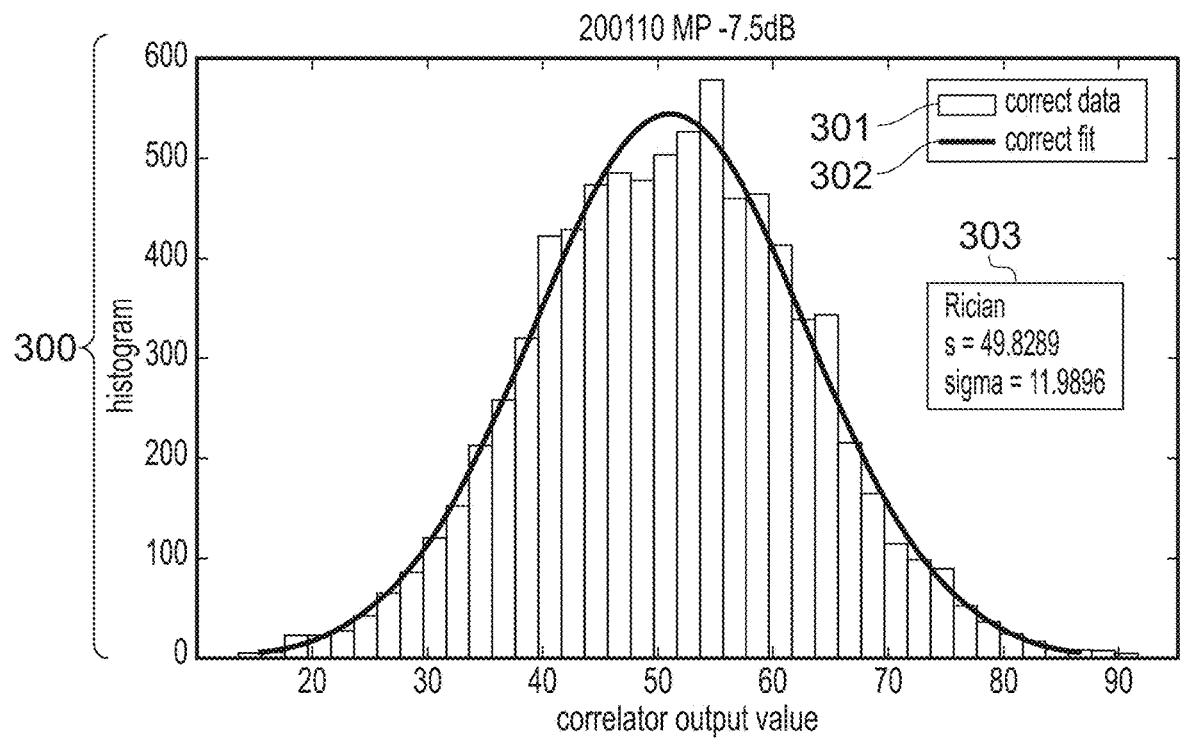
FIG. 3 illustrates a multipath (MP) channel dataset of MP −7.5 dB with correct correlated data for the OS scheme of FIG. 1, using a histogram & Rician distribution fit.
Figure 4:
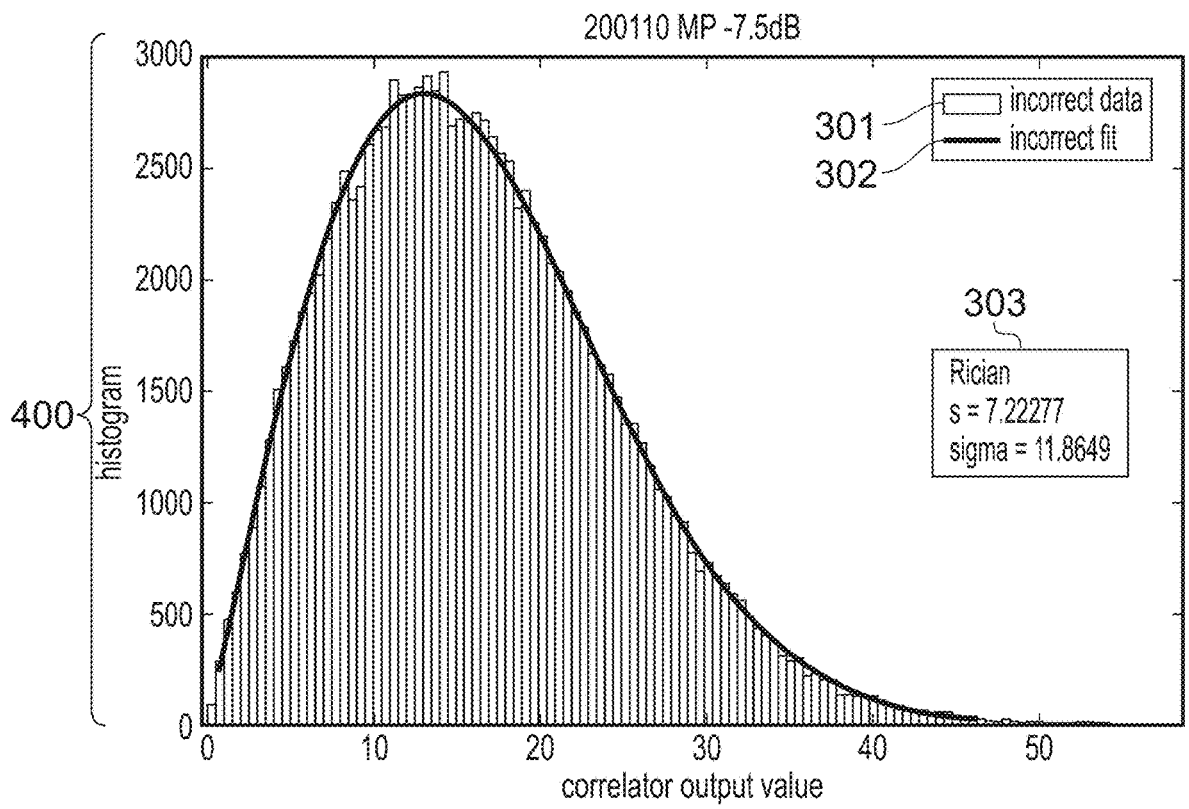
FIG. 4 illustrates an MP −7.5 dB dataset incorrect correlated data for the OS scheme of FIG. 1, using a histogram & Rician distribution fit.

Referring now to FIG. 3 and FIG. 4, FIG. 3 illustrates a multipath (MP) channel dataset of MP −7.5 dB with correct correlated data for the OS scheme of FIG. 1, using a histogram & Rician distribution fit and FIG. 4 illustrates an MP −7.5 dB dataset incorrect correlated data for the OS scheme of FIG. 1, using a histogram & Rician distribution fit. In order to demonstrate the distribution of correlator output data graphically, two graphs are plotted for each dataset, correct data 300 is illustrated in FIG. 3 and incorrect data 400 is illustrated in FIG. 4 for the MP_-7.5 dB dataset of the OS-scheme transmission system of FIG. 1. Each graph has a histogram of the data 301 and a Rician distribution fitted 302 to the histogram. The number of histogram bins were chosen automatically by the Matlab function histogram, and the function histfit was used to plot both the histogram and the distribution.

Referring now to FIG. 5A, FIG. 5B, FIG. 5C and FIG. 6A, FIG. 6B, FIG. 6C, FIG. 5A-FIG. 5C illustrates the distributions of OS-scheme of FIG. 1 correlator outputs for an additive white gaussian noise (AWGN) channel of the datasets of FIG. 3 and FIG. 4, and FIG. 6A-FIG. 6C illustrates the distributions of OS-scheme of FIG. 1 correlator outputs for a Multipath communications channel for the datasets of FIG. 3 and FIG. 4. The distributions for all datasets have been included in FIG. 5A, FIG. 5B, FIG. 5C and FIG. 6A, FIG. 6B, FIG. 6C, which illustrate magnitude and phase distributions of the 16OS-scheme correlator outputs for the AWGN and Multipath channels. Note that the bins are narrower for the incorrect data because the incorrect data sub-sets contain M−1=15 times more samples than the correct data sub-sets.

There is an overlap of correlator values between the correct and incorrect distributions for the MP_-7.5 dB dataset, as shown in FIG. 3 and FIG. 4. Values of the correct distribution starts from around '15', which happens to be far in the middle of the incorrect distribution—near where the mode lies. Also, the incorrect distribution ends in values at around '55', that is in the middle—and close to its mode—of the correct distribution. Overlaps between the correct and incorrect distributions means it is likely that the correct correlator output value is close to, and may be smaller than, the incorrect correlator output values in the same received set of M=16 codes.

By looking at the distributions for other SNRs (illustrated in FIG. 5A, FIG. 5B, FIG. 5C and FIG. 6A, FIG. 6B, FIG. 6C), it can be seen that not all SNRs exhibit overlaps between correct and incorrect distributions. Since the incorrect correlators have always their minimum values near zero, the incorrect distributions have bins starting from values close to zero, regardless of what the SNR is. However, as the SNR goes down from 0 dB, the maximum output values of the incorrect correlators in the distribution increase. Hence, smaller SNRs will have a greater range of incorrect correlator output values. Also, in the correct correlator distributions as the SNR goes down the minimum values decrease, and the maximum values increase. In other words, smaller SNRs will have a greater range of correct correlator values, too, but from both small and large sides of the distribution. Therefore, the smaller the SNR the more chance there will be overlap between values of the correct and incorrect correlator outputs. This confirms the concept that with smaller SNRs, choosing the correct code index becomes more difficult.

Thus, in some examples of the invention, a representation of the two aggregated correlator distributions method 202 is proposed, wherein the first and second aggregated correlator output magnitude distributions are each represented by a set of distribution parameters. For example, in some instances, the set of distribution parameters may comprise a non-centrality parameter s and a scale parameter a 303 of FIG. 3.

Estimation Methods

The analysis of the later-described OS-PSK Soft Demapping and EXIT Chart implementation assumes a testbench environment, in which prior knowledge of the true values of the transmitted bits 107 and OS symbols 115 of FIG. 1 is available. In practical known receivers, this knowledge will not be available and the distribution parameters s and σ 111 must be estimated in its absence. In order to obtain the distribution parameters 111 of correlator output values, online or offline approaches (as illustrated at 4403 in FIG. 35A) can be taken. In an online approach, a receiver data analyser circuit 116 is responsible for analysing the correlator outputs from the demodulator 118 received at run-time, finding the best distribution to fit to the data, and calculating parameters of the distributions, with the benefits from real-time tuning of distribution parameters.

Offline Approaches

In an offline approach, such as shown in FIG. 1 and in FIG. 35A, the correlator distributions may be calculated offline and used to build a library of correlator distributions on all applicable modulation-channel combinations. For example, the six datasets mentioned earlier in this document can be used as models for different channel conditions and modulation schemes. A configuration-time switch 117 can be configured to choose the right set of data based on the system's modulation scheme and channel type. In some examples, this could be performed as an extension of any other channel estimation tasks performed by the demodulator 118. For example, the outputs of these channel estimation tasks could be used to index a look-up table of pre-computed correlator output distributions. More specifically, an offline estimation of correlator distributions may be used to record correlator outputs for several channel conditions and used to build a library, say in a form of a look-up table (LUT) 112, of those distributions. Then, during actual data transmissions, an offline channel estimation method 4405 identifies the current state of the channel and chooses the corresponding distribution from the look-up table 112.

Another offline approach example would be to use a single set of correlator distributions in all cases, irrespective of the varying channel conditions. This single set of correlator distributions could be recorded during a worst-case scenario, perhaps at the lowest SNR, where reliable synchronisation can be achieved. When the channel conditions match this worst-case scenario, the use of the corresponding correlator distributions will ensure the best possible performance. When the channel conditions are better than this worst-case scenario, the chance of decoding success can be expected to increase, even though the assumed correlator distributions are pessimistic compared to the true distributions.

Online Approaches

Referring now to FIG. 35A, and as an alternative to using datasets to estimate the distributions offline, online example methods 4407 and 4408 are described, which calculate the distribution parameters in the early stages of a real data transmission flow 4400, such as when a channel estimation task is in progress. The first online channel estimation method 4407 is through correlating received synchronisation signals with known synchronisation signals. Let's take an example: suppose that for the transmission of 4-bit messages (k=4) the demodulator 118 knows that before transmitting data, the transmitter sends a synchronisation sequence of '0000', '0001', . . . , '1111', which has M=16 messages and correspond to symbol values 0 to M−1=15, respectively. Therefore, the demodulator 118 expects that, amongst the M=16 correlators, the correlator with index '0' should, in the first received transmission, output the highest cross-correlation magnitude. In the same way, correlator with index '1' is expected to output the highest magnitude in the second transmission, and so on until the last symbol is transmitted.

Using the first online channel estimation method 4407, as the receiver 102 is aware of the true symbol values, it can associate every set of M=16 correlator outputs of a transmission to its symbol value. The synchronisation sequence can be transmitted a few times, so that for each symbol value there will be a number of M=16 correlator output sets, (in the same manner as illustrated in FIG. 26, but with a different time order), and hence distributions can be estimated based on a required sample size. This online technique is sometimes referred to herein as the correlator distribution estimation using synchronisation sequences of the first online channel estimation method 4407. With this first online channel estimation method 4407, the maximum distributions approach 201 of FIG. 2 can be used to obtain $2^{2k}$ distributions, or the two aggregated distributions approach 202 may be employed to obtain the two correct 205 and incorrect 206 aggregated correlator distributions, as shown in FIG. 2. It is also generally possible to use a number of distributions between 2 and maximum $2^{2k}$ values, which is explained in an example later. Following distribution aggregation, a distribution fitting method (such as the histfit function of Matlab) may be used to estimate the s and σ parameters 303 of FIG. 3 for each aggregated distribution.

FIG. 35A also identifies a second online technique that can operate concurrent to the data transmissions, referred to as the largest-magnitude correlator distribution estimation of the second online channel estimation method 4408. In this second online channel estimation method 4408, an assumption is made that the correlator with the largest output magnitude, in normal channel conditions, corresponds to transmitted message value. As any correlator in any transmission is outputting either the largest magnitude or not the largest one, recording the values for each of the two cases for all the received transmissions 4402 under consideration provides two distributions for any correlator: the distribution when that correlator provides the output with the largest magnitude and the distribution when that correlator provides an output that does not have the largest magnitude. This is shown in the middle columns 3601 of FIG. 27, which illustrates the correlator output distributions of the largest-magnitude method.

Figure 27:
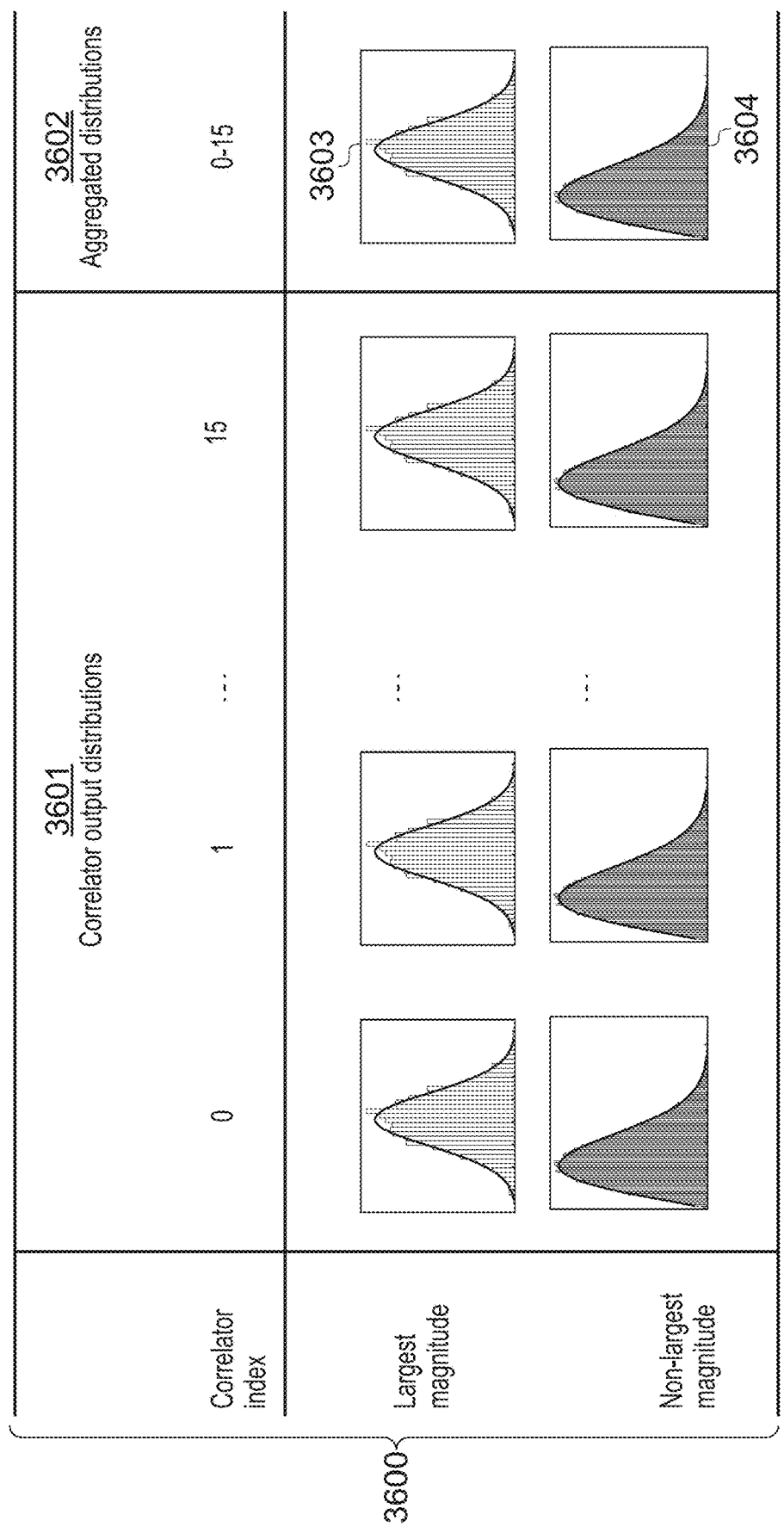
FIG. 27 illustrates a correlator output distribution of a largest-magnitude method, according to some example embodiments of the invention.

Referring now to FIG. 27, a correlator output distribution 3600 of a largest-magnitude method, according to some example embodiments of the invention. There is a total of M*2=32 distributions of largest and non-largest correlator output magnitudes, shown in the middle columns 3601 of FIG. 27. As illustrated, the number of distributions here is between 2 and the maximum $2^{2k}$. As shown, it is also possible to aggregate 3603 all the largest-magnitude distributions (M=16 of them) and aggregate 3604 all the non-largest-magnitude distributions (also M=16 of them), each set into a separate distribution producing two distributions, as shown in the right-hand column 3602 in FIG. 27. Again, following distribution aggregation, a distribution fitting method (in some examples such as the histfit function of Matlab) may be used to estimate the s and σ parameters for each aggregated distribution. It is then assumed that the s and σ parameters of the aggregated largest-magnitude distribution provides a reasonable estimate of the corresponding parameters 303 of FIG. 3 of the aggregated correct distribution. Likewise, it may be assumed that the s and σ parameters of the aggregated not-largest-magnitude distribution provides a reasonable estimate of the corresponding parameters 303 of FIG. 3 of the aggregated incorrect distribution.

Note that the largest-magnitude correlator distribution estimation approach in the second online channel estimation method 4408 of FIG. 35A could be further refined by completing a first estimation of the s and σ-parameters, then using these to calculate LLRs as detailed in the 'calculating symbol LLRs' section below, before they are provided to a channel decoder 104 in FIG. 1. In some examples, the channel decoder 104 of FIG. 1 can then attempt to remove any errors in the LLR sequence and use, say, a Cyclic Redundancy Check (CRC) to determine if it has been successful. If not, then the channel decoder 104 can provide feedback LLRs to the Data Analyser circuit 116 of FIG. 1. These LLRs can then be considered and, in some instances, may cause the classification of the correlator outputs between the largest-magnitude and not-largest-magnitude groups to be overridden. More specifically, a correlator output having the largest magnitude for a particular transmission may be swapped for another that does not have the largest magnitude, when forming the largest-magnitude group, if the feedback LLRs provide a sufficiently strong suggestion that the magnitudes do not reflect the correct transmission.

Summary

In summary, three methods to estimate the correlator output magnitude distributions have been described with respect to FIG. 35A:
   the offline channel estimation method 4405, of using correlator datasets 112, with a) $2^{2k}$ (max.), and b) 2 (min.), number of distributions;
   the online method of using synchronisation sequences of the first online channel estimation method 4407, with a) $2^{2k}$ (max.), and b) 2 (min.), number of distributions; and
   the online method of largest-magnitude correlator outputs of the second online channel estimation method 4408, with a) 2M, and b) 2, number of distributions In each of the above three methods, the approach using two distributions comprises of a first aggregated distribution of all the correlator output magnitudes where, each correlator output, in its transmission, is 'assumed' to correspond to its transmitted signal, amongst all the M correlator outputs of the same transmission. Likewise, there is a second aggregated distribution of all the correlator output magnitudes where, each correlator output, in its transmission, is 'assumed' not to correspond to its transmitted signal. In other words, regardless of which of the above three methods is used, the two aggregated distributions in each method, are assumed to refer to the same two sets of correlator outputs across all three methods.

To explain the above approaches in a different way, the M correlator outputs of any one transmission may be divided into the following two groups. The first group comprises of the single correlator output that corresponds to one of the M possible signals that is selected as the transmission signal. The second group comprises of the M−1 correlator outputs that correspond to the M−1 possible signals, where none is selected as the transmission signal. Assuming several transmissions take place, the magnitudes of the first group of aggregated correlator outputs for several transmissions can be represented by a single distribution which is referred to as the first aggregated correlator output magnitude distribution. In the same way, the second aggregated correlator output magnitude distribution represents the second group of aggregated correlators for several transmissions. Therefore, using any of the three methods of distribution estimation listed above, the approach with two distributions refers to the first and the second aggregated correlator output magnitude distributions.

In investigations carried out by the inventors and as detailed below, the correlator distributions of the offline channel estimation method 4405 are measured from the available datasets and stored in look up tables 112, in order to minimise the effect of estimation error. Furthermore, the two aggregated distribution approach (of the two first and second aggregated distributions) is adopted due to its generality, as compared to other approaches with more distributions, and its robustness to varying channel conditions.

In summary, methods have been described for estimating the parameters of the first and second aggregated correlator output magnitude distributions, wherein one of the following is employed:

the first set of distribution parameters of the first aggregated correlator output magnitude distribution are estimated in the first online channel estimation method 4407 of FIG. 35A by fitting a first probability distribution to the magnitudes of correlator outputs obtained by correlating received synchronisation signals with known synchronisation signals;

the first set of distribution parameters of the second aggregated correlator output magnitude distribution are estimated in the first online channel estimation method 4407 of FIG. 3A by fitting a second probability distribution to the magnitudes of correlator outputs obtained by correlating received synchronisation signals with signals other than the known synchronisation signal;

the first set of distribution parameters of the first aggregated correlator output magnitude distribution are estimated in the second online channel estimation method 4408 of FIG. 35A by fitting a third probability distribution to the magnitudes of correlator outputs having the greatest magnitude among sets of $2^k$ correlator outputs obtained by the bank of $2^k$ correlators;

first set of distribution parameters of the second aggregated correlator output magnitude distribution are estimated in the second online channel estimation method 4408 of FIG. 3A by fitting a fourth probability distribution to the magnitudes of the $2^k-1$ correlator outputs that do not have the greatest magnitude among sets of $2^k$ correlator outputs obtained by the bank of $2^k$ correlators; or the first set of distribution parameters of the first and second aggregated correlator output magnitude distributions are selected in the offline channel estimation method 4405 of FIG. 35A from a look-up-table 112 of FIG. 1.

In examples of the invention, it has also been demonstrated that the first, second, third or fourth probability distributions may be represented using the Rician distribution.

Calculating OS LLRs

Logarithmic Likelihood Ratios (LLRs) are a form of soft decision, which express not only what the most likely value of an uncertain decision is, but also how likely this value is. LLRs can have any real value and are often used to represent likelihood of bits in having values of zero or one. When bits are represented by zeros and ones, they are referred to as 'hard bits', and if they are represented using LLRs they are known as 'soft bits', and those LLRs are referred to as 'bit LLRs'. However, it is known that LLRs can also be used to represent analogue signal values or symbols, as opposed to digital bits. In such a case, those LLRs may be referred to as symbol LLRs and the signals represented by the symbol LLRs may be known as 'soft signals', as opposed to 'hard signals' when the analogue signal values are used without forming into another representation. More specifically, if there are M number of possible values for a symbol, then the associated probabilities may be expressed using a set of M LLRs, where each LLR compares the probability of a particular value having occurred, against the probability that that value did not occur.

The inventors of the present invention developed a Matlab function that takes correlator output magnitudes as the set of inputs to the soft demapper circuit and turns them, using the correlator output distributions, into symbol LLRs (which sometimes may be referred to as soft magnitudes) as the set of apriori soft signals, as shown by Convert to OS LLRs demapper circuit 113 in FIG. 1. Therefore, it can be said that the output magnitudes 109 of the $2^k$ correlators in FIG. 1 are combined with the s and σ parameters 111 of the first and second aggregated correlator output magnitude distributions in order to obtain the set of apriori soft signals 110 comprising $2^k$ soft magnitudes. Note that if non-Rician distributions were adopted to model the aggregated output magnitude distributions, then the corresponding parameters 111 may be used in this LLR calculation operation instead. The following discussion uses the case where k=4 and M=16 as an example. However, it is envisaged that the concepts described herein can be extended readily to other values.

In FIG. 1, the demapper circuit 113 arranged to convert the correlator outputs to OS symbol LLRs takes at a time M=16 correlator output magnitudes 109 (both correct and incorrect) of one received symbol and returns M=16 corresponding symbol LLR values as soft signals 110, and performs this for all received 4402 symbols of a frame. Each of these M=16 symbol LLRs correspond to the same received symbol (i.e., a 4-bit message, k=4) and they collectively demonstrate a probabilistic representation of the 4-bit message. Later in the receiver 102, the Convert to Bit LLRs circuit 119 turns the M=16 symbol LLRs or soft signals 110 of the original 4-bit message into k=4 bit LLRs, as the set of extrinsic soft bits 103, where each bit LLR corresponds to one bit of the 4-bit message. In summary, each transmitted symbol 115 leads to the generation of a set of M=16 symbol LLRs or soft signals 110 in the receiver, which are then converted to a set of k=4 bit LLRs, or soft bits 103.

Hereafter, the description will first focus on the operation of the demapper circuit 113 arranged to convert the correlator outputs to OS symbol LLRs, which outputs M=16 OS LLRs or soft signals 110 per transmitted symbol 115. The description will then focus on the operation of Convert to Bit LLRs circuit 119 of FIG. 1, which outputs k=4 bit LLRs, or soft bits 103 per transmitted symbol.

The developed Matlab function, which implements the conversion to OS symbol LLRs 4410 of FIG. 35A, instead of accepting just 16 correlator values, returns symbol LLRs for any number of M correlator values fed to it as a vector, as in step 4409 of FIG. 35A. In some examples, this function takes the following values as inputs: the vector of the correlator values, the modulation parameter M (M=16 in this work), non-centrality and scale parameters of the two correct and incorrect distributions ($s_{corr}$, $\sigma_{corr}$, $s_{incorr}$, $\sigma_{incorr}$). The function also outputs the same number of symbol LLRs as the length of input correlator vector.

Figure 5A:
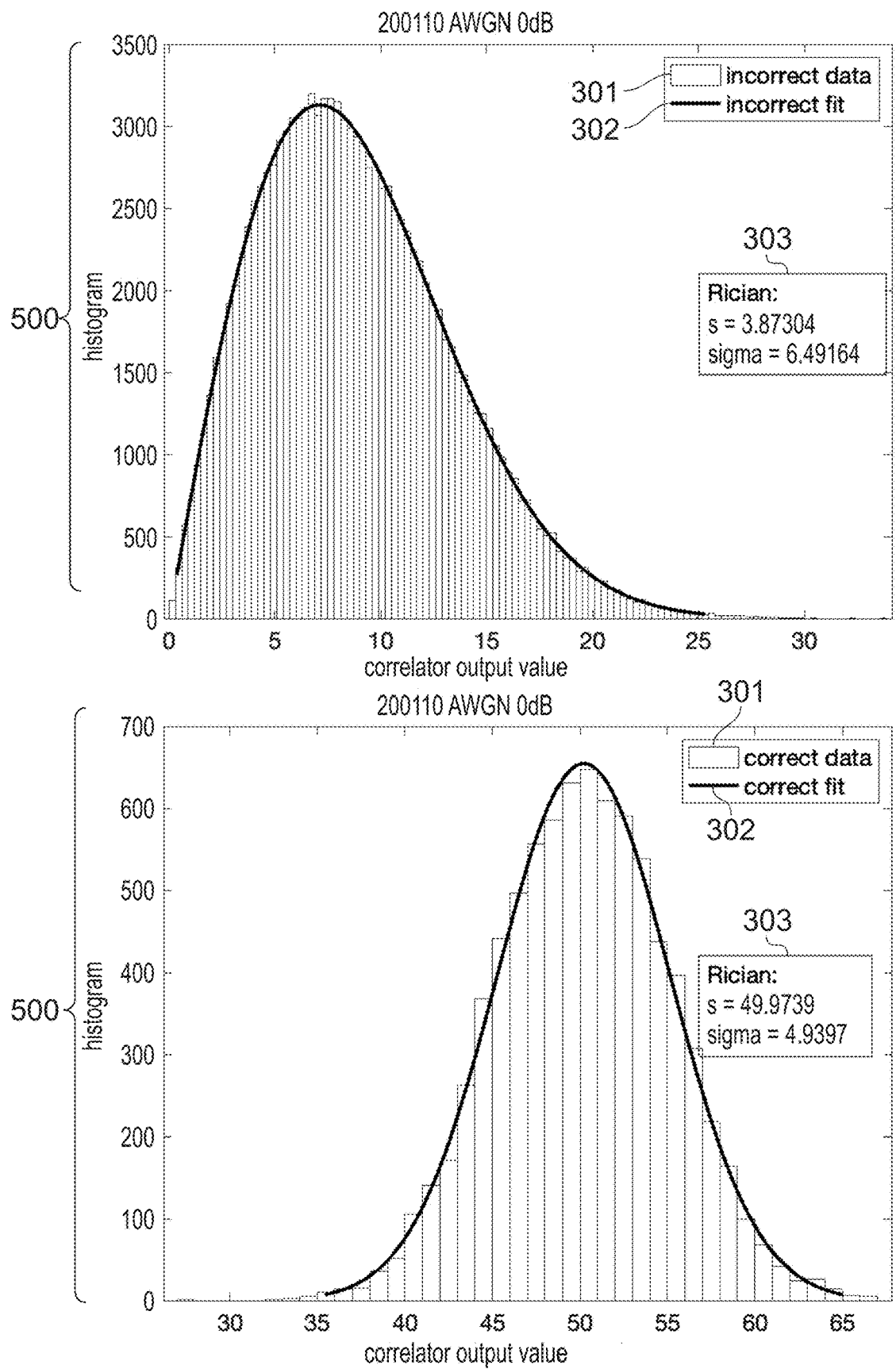
FIG. 5A, FIG. 5B, and FIG. 5C illustrate the distributions of OS-scheme of FIG. 1 correlator outputs for an additive white gaussian noise (AWGN) channel of the datasets of FIG. 3 and FIG. 4.
Figure 5B:
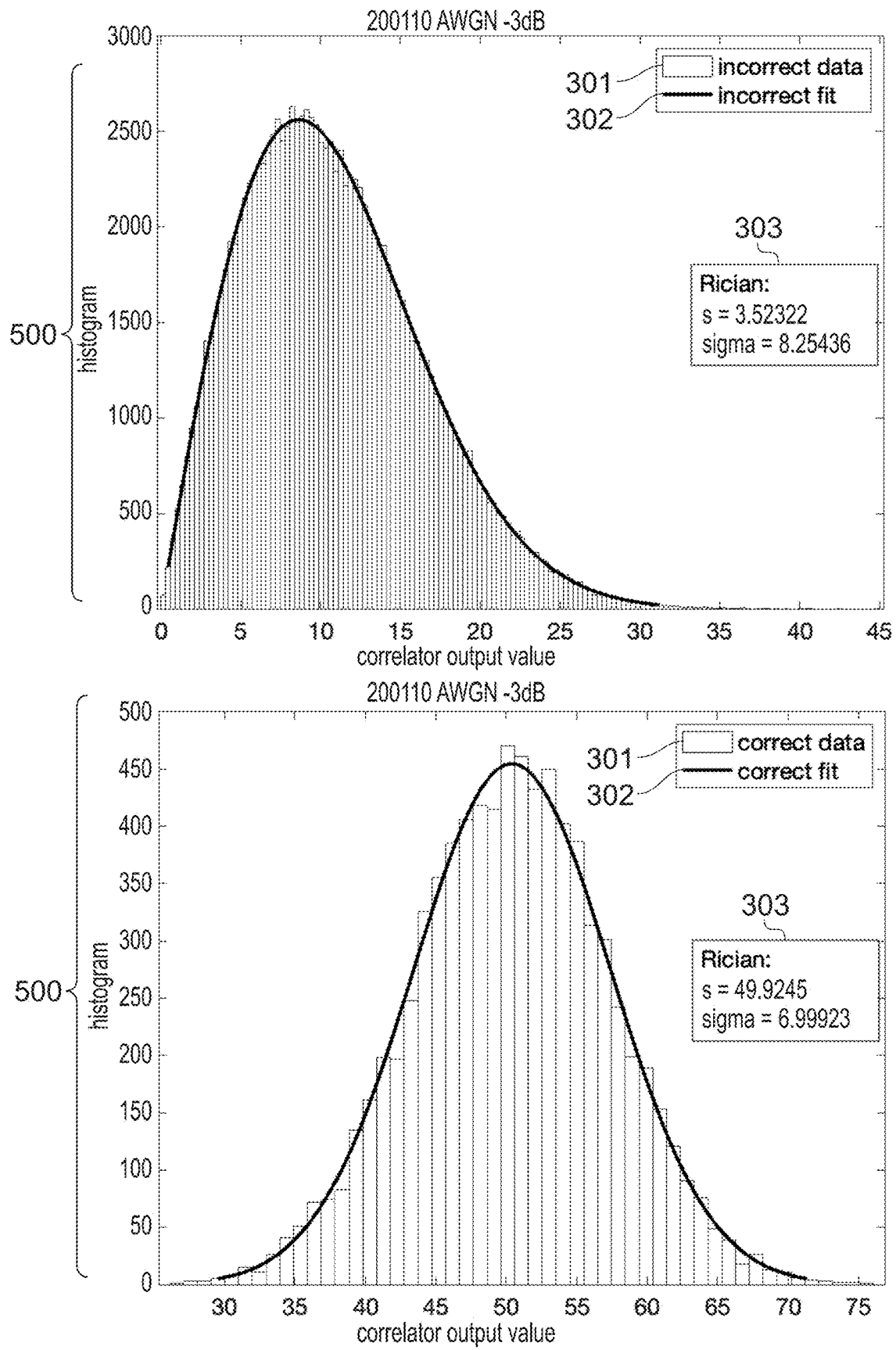
Figure 5C:
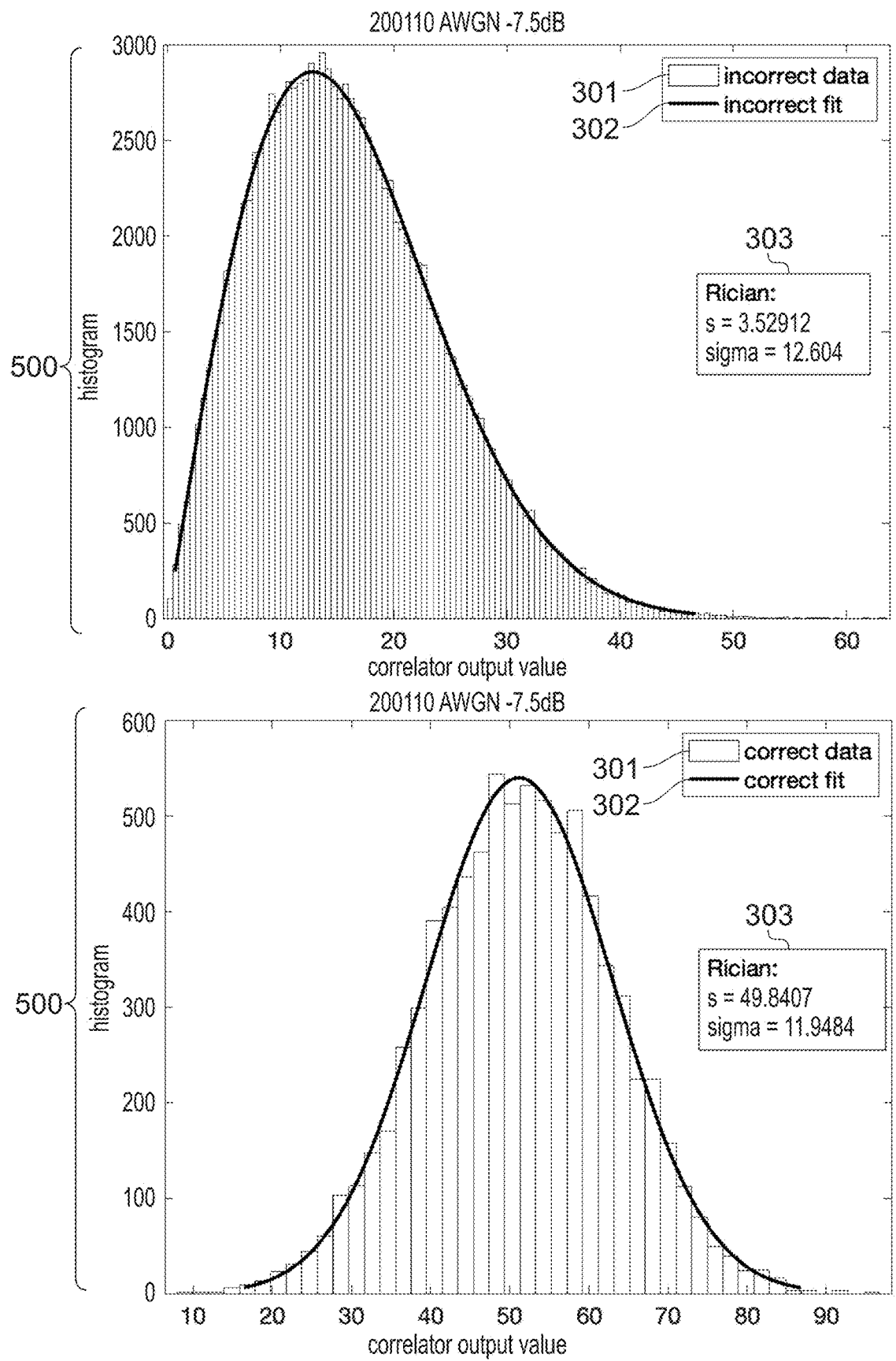
Figure 6A:
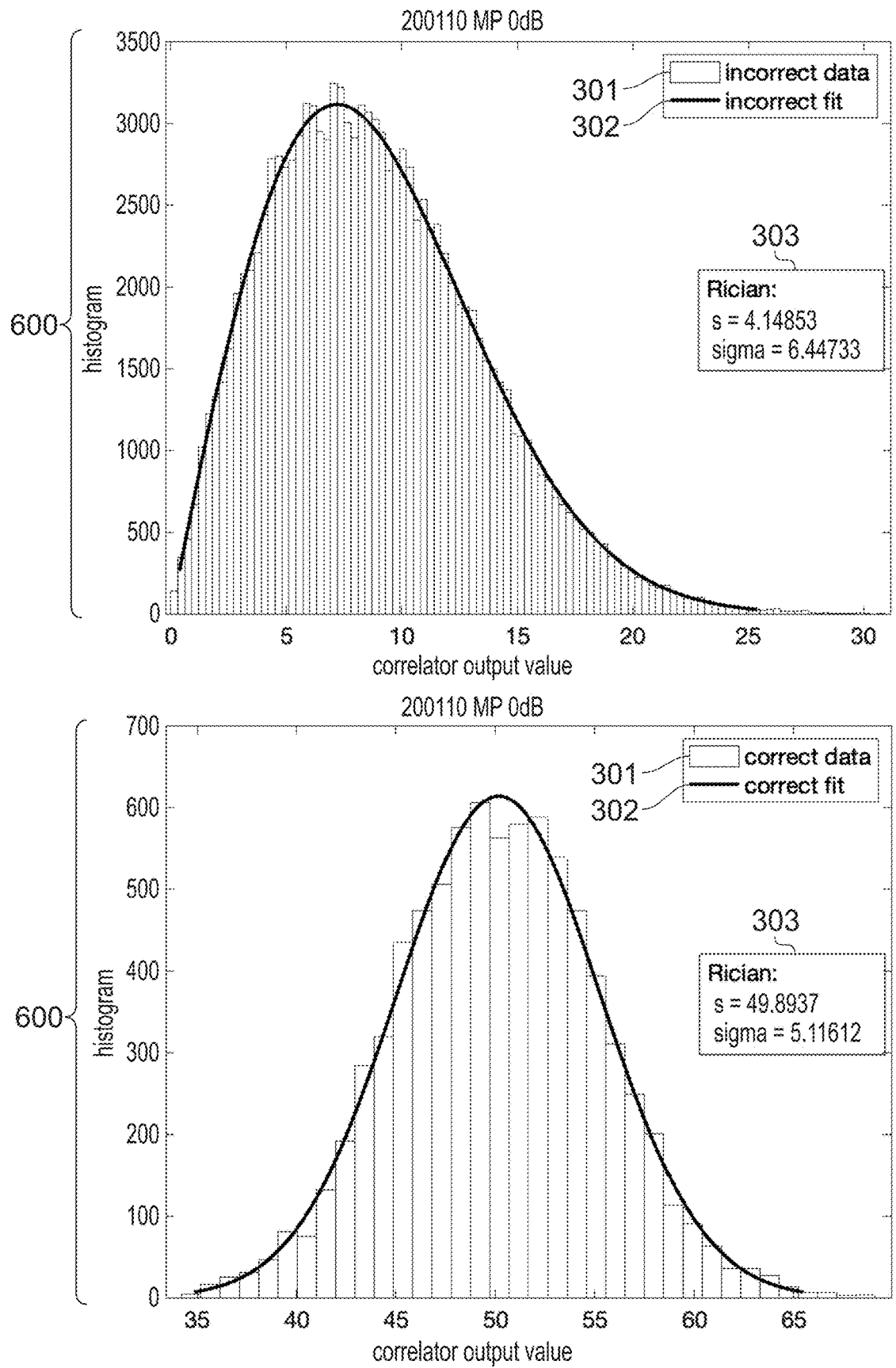
FIG. 6A, FIG. 6B, and FIG. 6C illustrate the distributions of OS-scheme of FIG. 1 correlator outputs for a Multipath communications channel for the datasets of FIG. 3 and FIG. 4.
Figure 6B:
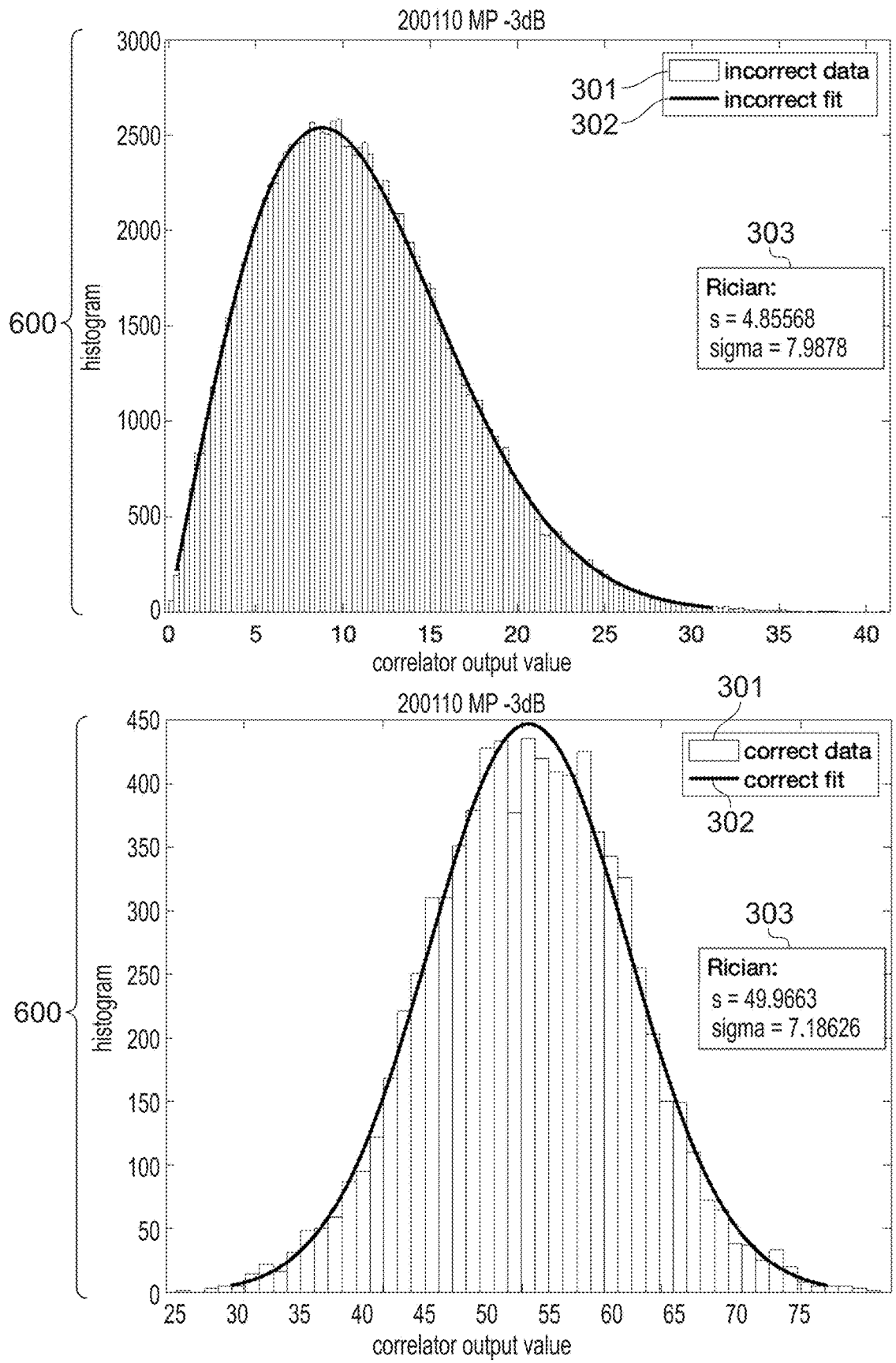
Figure 6C:
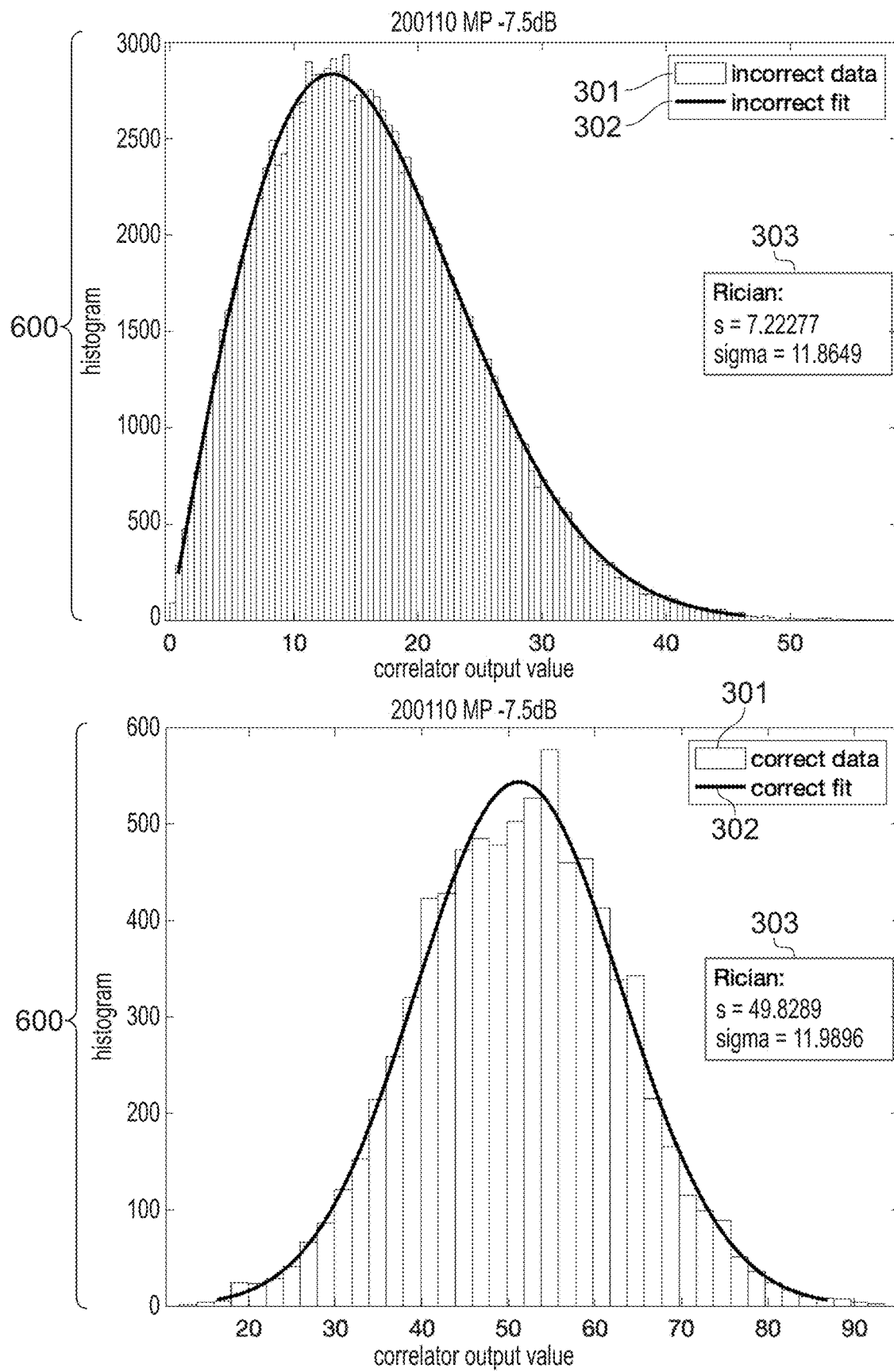
Figure 7A:
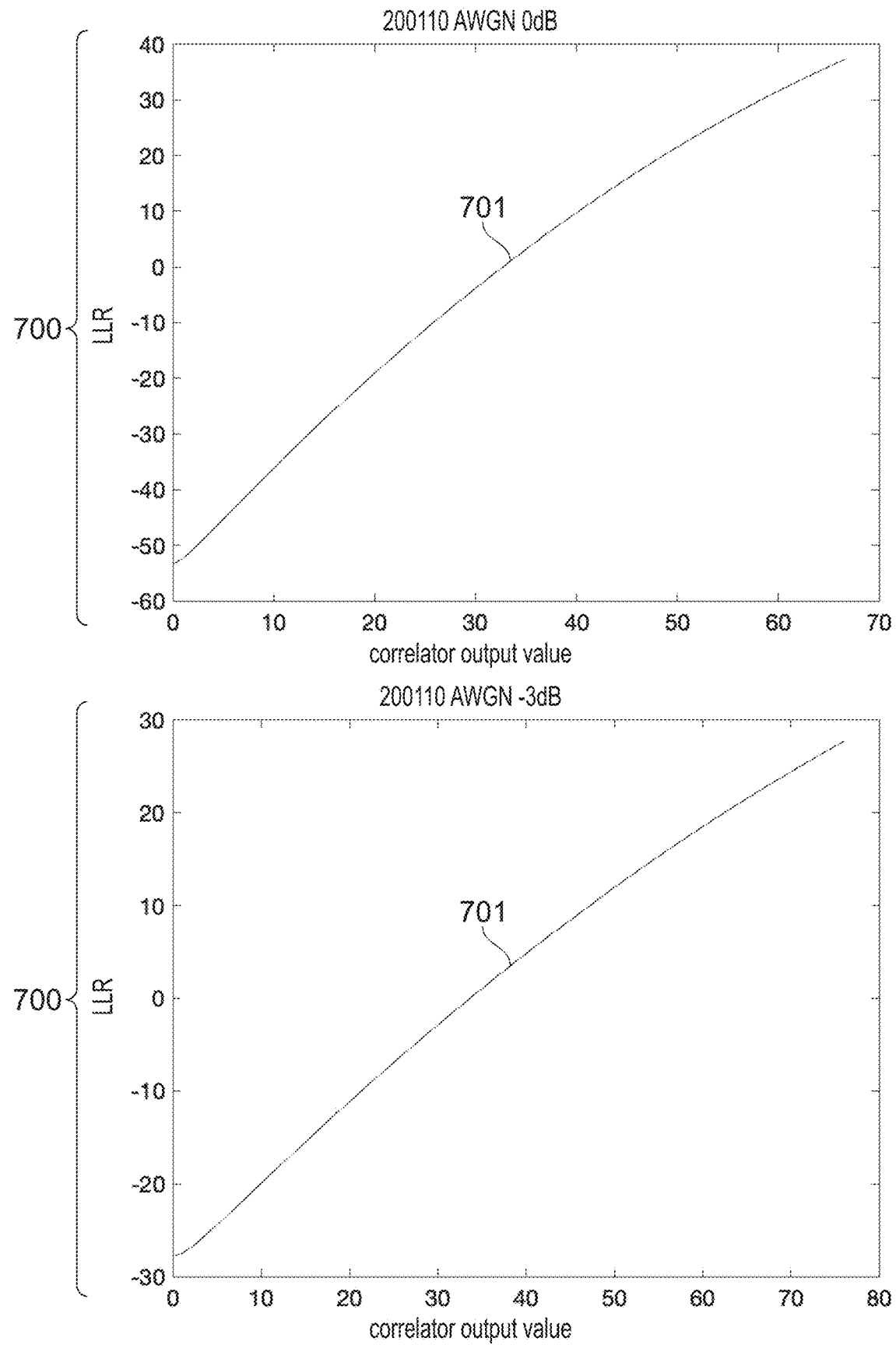
FIG. 7A and FIG. 7B illustrate a conversion to OS symbol LLRs for the AWGN channel for the OS-scheme datasets of FIG. 5A, FIG. 5B, and FIG. 5C.
Figure 7B:
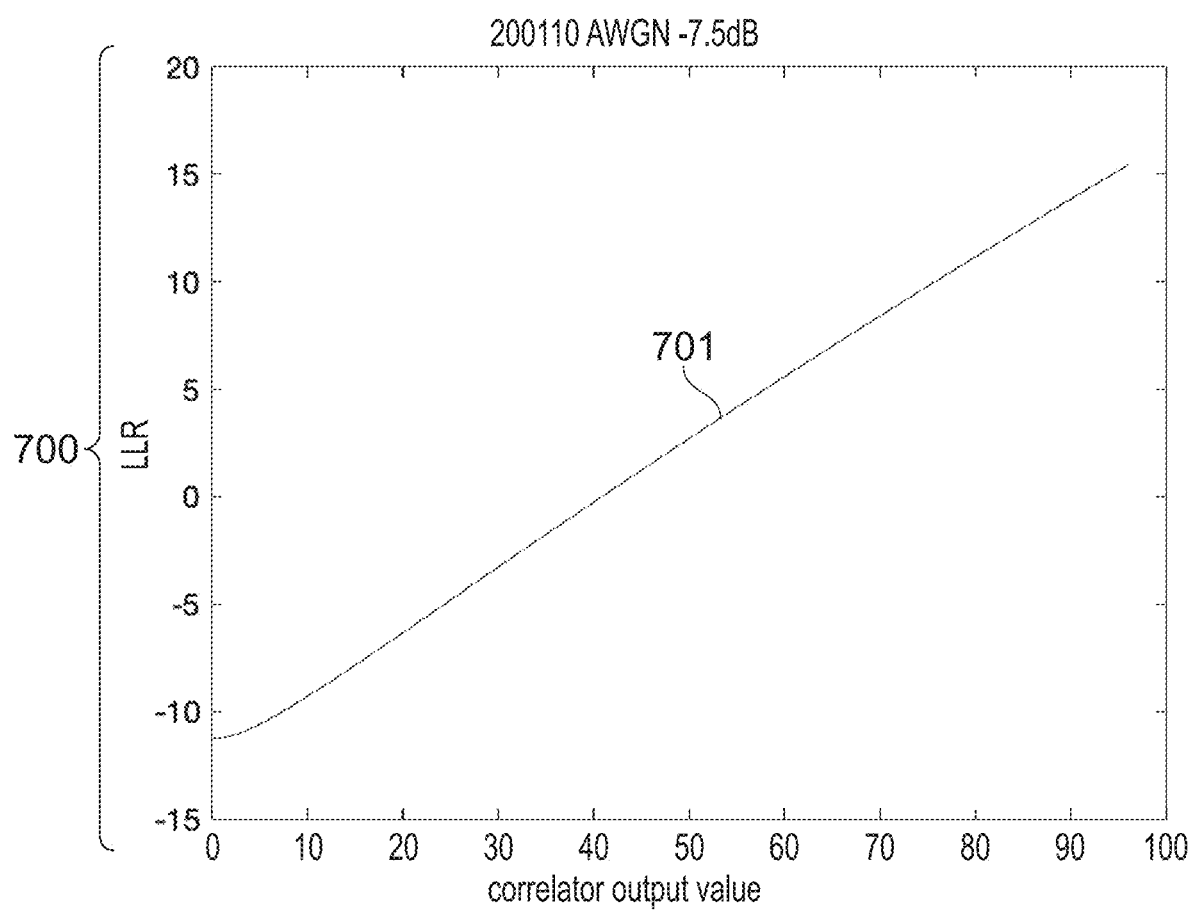
Figure 8A:
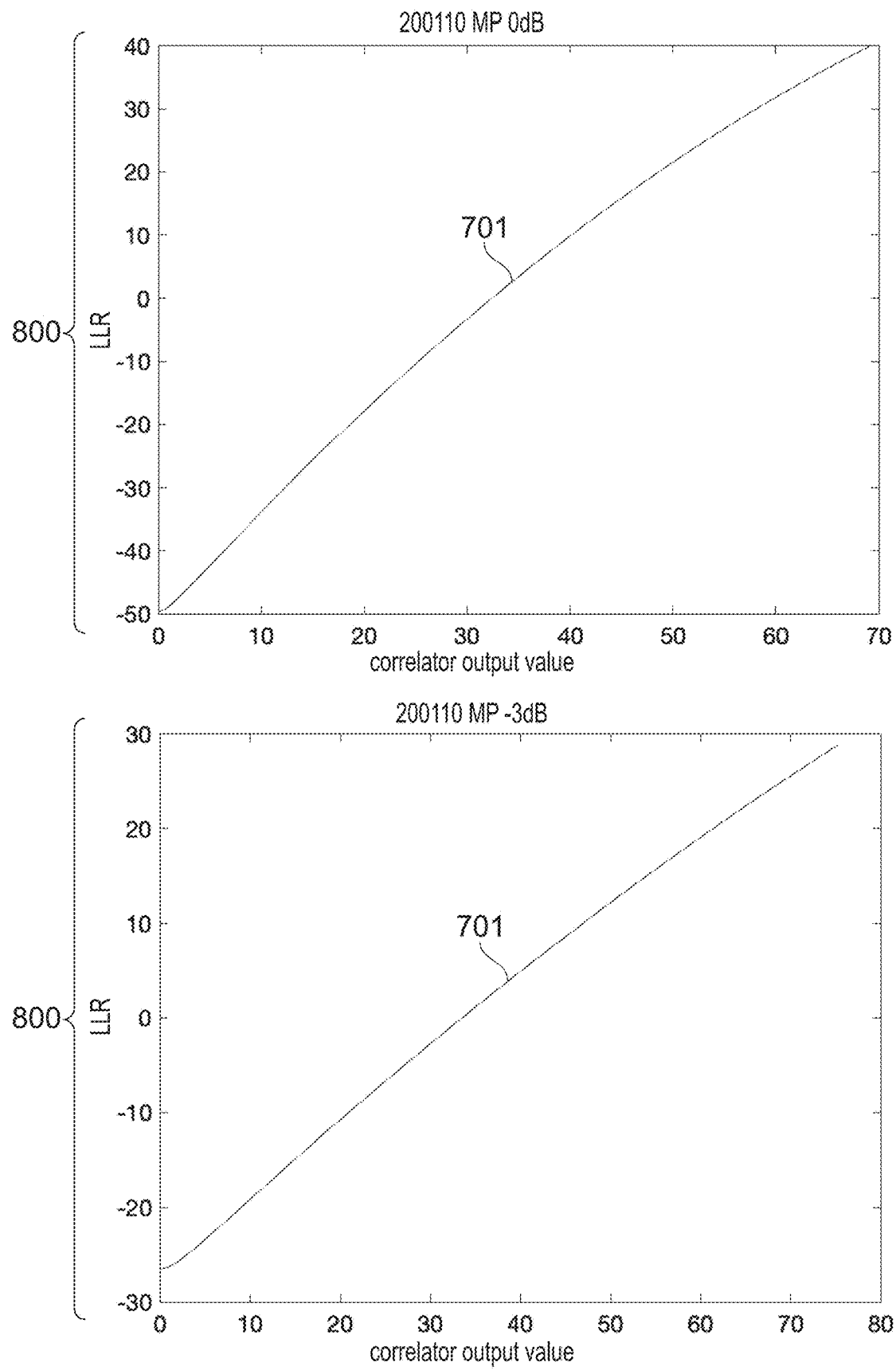
FIG. 8A and FIG. 8B illustrate a conversion to OS symbol LLRs for a Multipath communications channel for the OS-scheme datasets of FIG. 6A FIG. 6B, and FIG. 6C.
Figure 8B:
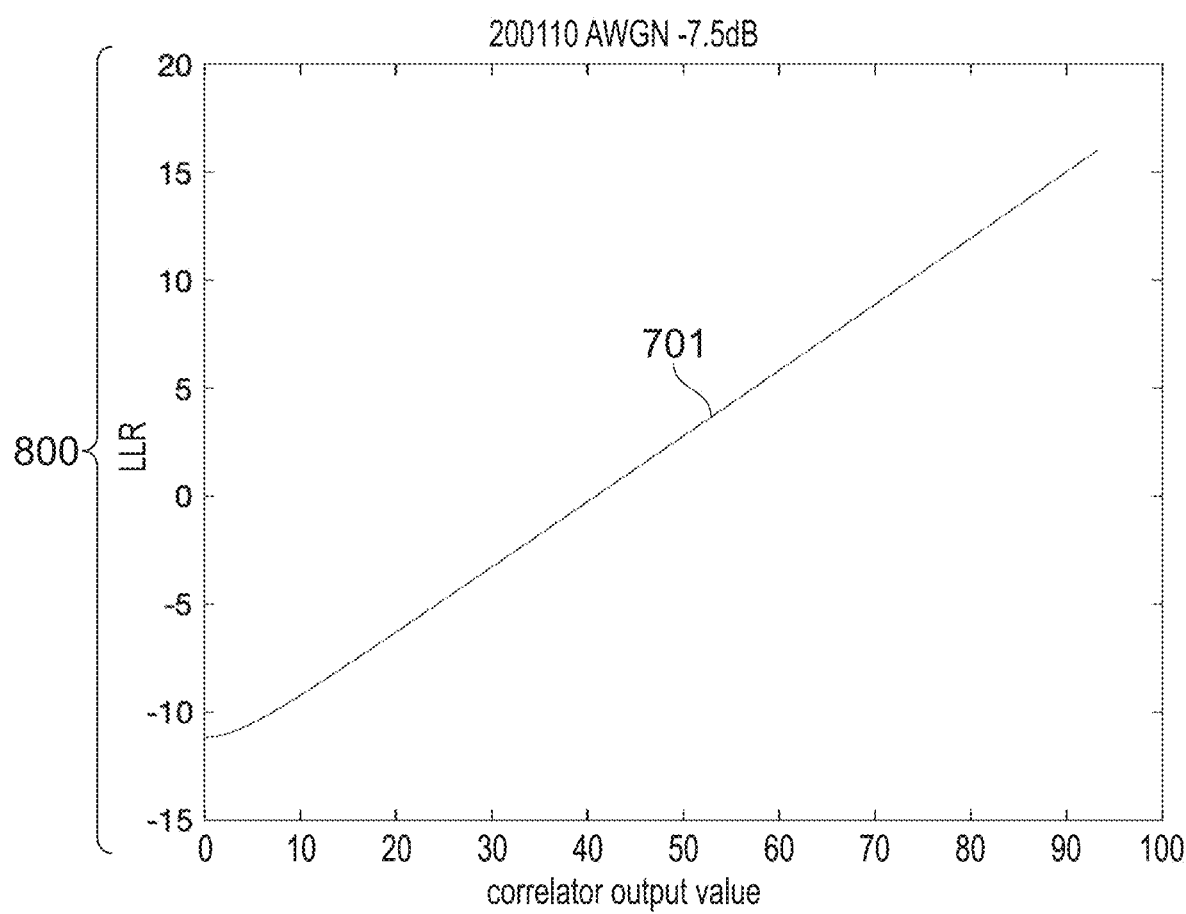

Referring now to FIG. 7A-FIG. 7C, graphs 700 illustrate a conversion to OS symbol LLRs for the AWGN channel for the OS-scheme datasets of FIG. 5A, FIG. 5B, and FIG. 5C. Concurrently, referring also to FIG. 8A and FIG. 8B, graphs 800 illustrate a conversion to OS symbol LLRs for a Multipath communications channel for the OS-scheme datasets of FIG. 6A, FIG. 6B, and FIG. 6C. Graphs 700 illustrate the symbol LLR AWGN values 701 datasets and graphs 800 illustrate the symbol LLR Multipath values 701 datasets provided by the developed Matlab function across an entire range of correlator output values; from zero to the maximum (that is the maximum value of the correct correlator outputs). In a similar manner to the correlator output distributions, the range of correlator output values increases as SNR goes down. For example, for the AWGN channel while the minimum correlator output value is zero for all SNRs, the maximum correlator output values increase from near 70 for the 0 dB-SNR dataset to near 100 for the −7.5 dB-SNR dataset. As expected, the functions represented by the symbol LLR plots are all strictly increasing. This is expected as there should not be an LLR value for more than one correlator output value. The range of symbol LLRs, from both positive and negative ends, decrease as SNR goes down. This is expected as the certainty of signals to represent certain values (shown by the correlator outputs) must decrease as the power of noise increases with respect to the signal power, and this is captured by the probabilistic nature of the LLR values.

The definition and derivation of the symbol LLRs is as follows:

$$\text{symbol } LLR \triangleq \ln\left[\frac{Pr(\text{correct} \mid \text{correlator output})}{Pr(\text{incorrect} \mid \text{correlator output})}\right] \quad [1]$$

Applying Bayes theorem gives $$\text{symbol } LLR = \ln\left[\frac{Pr(\text{correlator output} \mid \text{correct}) \times Pr(\text{correct})}{Pr(\text{correlator output} \mid \text{incorrect}) \times Pr(\text{incorrect})}\right] \quad [2]$$

Here, the conditional probabilities are characterised by the Rician distribution, resulting in: Pr (correct)=1/M and Pr (incorrect)=(M−1)/M. Making these substitutions gives $$\text{symbol } LLR = \quad [3]$$
$$\ln\left[\frac{RicianPDF(\text{correlator output}, s_{correct}, \sigma_{correct})}{RicianPDF(\text{correlator output}, s_{incorrect}, \sigma_{incorrect}) \times (M-1)}\right]$$

In summary, a method for OS demodulation 118 has been described, wherein the output magnitudes 109 of the $2^k$ correlators of FIG. 1 are combined with the first set of distribution parameters 111 of the first and second aggregated correlator output magnitude distributions in order to obtain a set of apriori soft signals 110 comprising $2^k$ soft magnitudes, as in step 4410 of FIG. 35A.

In accordance with a second aspect of the invention, an example implementation of the Convert to Bit LLRs circuit 119 of FIG. 1. is described, to explain how the two conversion functions may be evaluated.

Conversion to Bit LLRs and EXIT Chart Evaluation: OS Scheme

Figure 9:
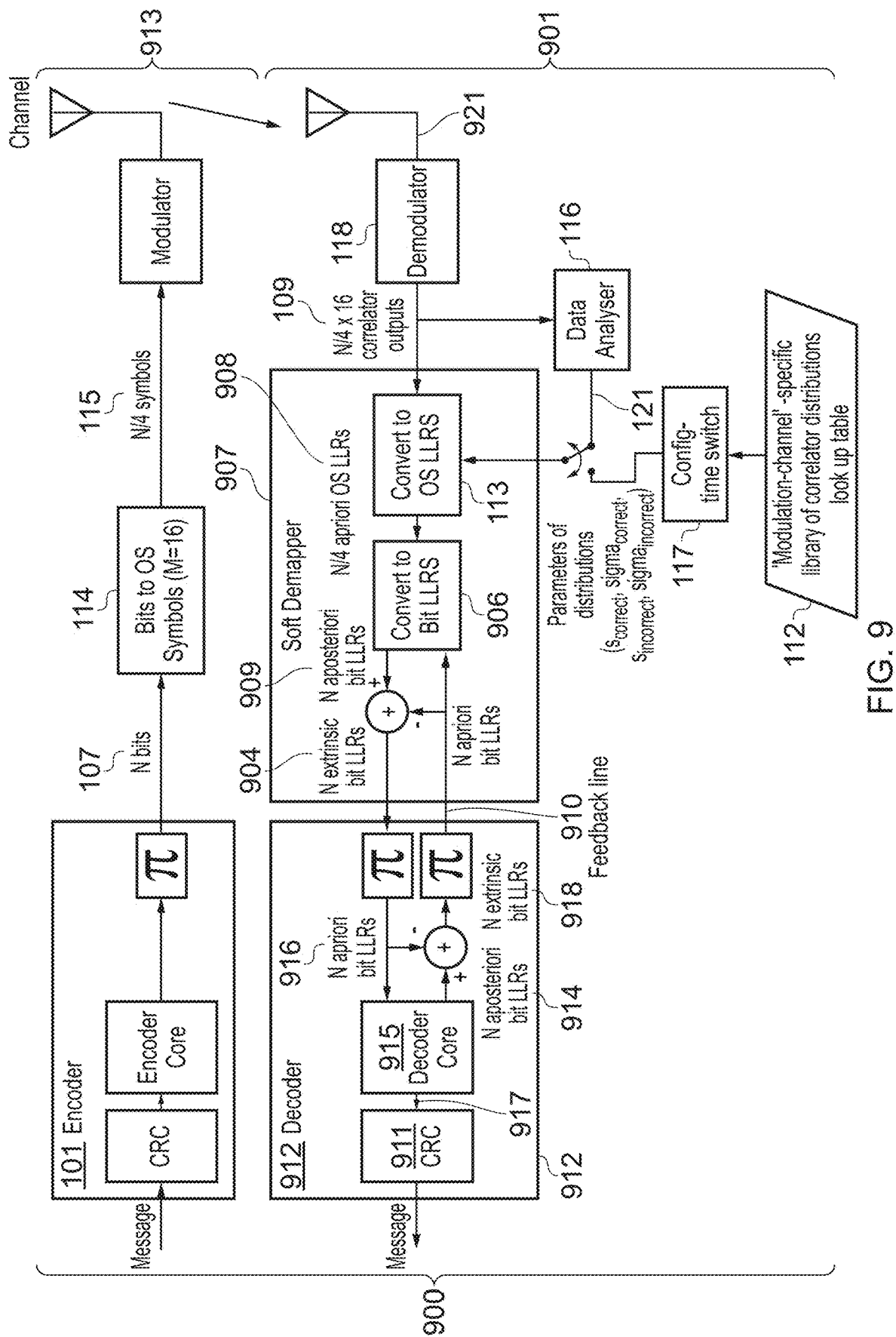
FIG. 9 illustrates a top-level block diagram of an alternative OS-scheme transmission system adapted according to example embodiments of the present invention.

Referring now to FIG. 9, a top-level block diagram of an alternative OS-scheme transmission system 900 adapted according to example embodiments of the present invention is illustrated. For testing purposes, the alternative OS-scheme transmission system 900 was developed in Matlab to perform, in the receiver chain 901, soft demapping of the output magnitudes 109 of a demodulator's 118 correlators into extrinsic bit LLRs 904 is performed in the soft demapper circuit 907, giving compatibility with the iterative decoding principle. A testbench (again developed in Matlab) evaluates the functionality of the new soft demapping function by measuring the quality of the extrinsic bit LLRs, and presents the quality results in the form of extrinsic information transfer (EXIT) charts.

In this example, the Convert to Bit LLRs circuit 906 is developed to provide compatibility with an iterative decoding setup alongside the demapper circuit 113, arranged to convert the correlator outputs to OS symbol LLRs, in order to build the soft demapper circuit 907 or soft demapping functionality.

Iterative Decoding Principle

Again, each set of M=16 OS LLRs from a total of N/4×16 OS symbol LLRs (k=4) 908 generated by the demapper circuit 113 and corresponds to one 4-bit message. Given that k=4 bit LLRs is sought for each 4-bit message (one bit LLR per message bit), each set of M=16 OS LLRs needs to be converted into a set of k=4 bit LLRs. Therefore, a total of N bit LLRs 909 may be obtained from N/4×16 OS LLRs from the Convert to Bit LLRs circuit 906, as shown in FIG. 9. While this conversion by default can be performed without using feedback from the decoder—when the feedback bit LLRs 910 in FIG. 9 are removed or hard-wired to provide zero-valued LLRs—the conversion can also benefit (as in step 4418 of FIG. 35A) from the feedback bit LLRs 910, according to the principles of iterative decoding. In this example, M=16 is used, although the inventors recognise and appreciate that the concepts and definitions herein described can be applied to any value of $M=2^k$.

Use (as in step 4418 of FIG. 35B) of feedback during the conversion (as in step 4413 of FIG. 35B) to bit LLRs usually happens after the decoder 912 has failed (as in step 4421 of FIG. 35B) the cyclic redundancy check (CRC) in the CRC decoder 911 at the end (as in step 4416 of FIG. 35B) of its decode process. The decoder 912, in such a case, instead of asking for a hybrid automatic repeat request (HARQ) retransmission from the transmitter 913, may want to try a further attempt of symbol-bit LLR conversion in the Convert to Bit LLRs circuit 906 with the hope that the use (as in step 4418 of FIG. 35B) of feedback bit LLRs 910 may cause the decode to pass (as in step 4422 of FIG. 35B) in a subsequent attempt, and hence time, bandwidth and power is saved with respect to a retransmission. The Convert to Bit LLRs circuit 906, or simply the Bit LLRs circuit, stores 4411 the N/4×16 OS LLRs in a memory unit until the iterative decoding process is concluded (as in step 4422 of FIG. 35B), whereupon it clears the memory. After a second round of OS-symbol-to-bit LLR conversion, if the decoder 912 fails (as in step 4421 of FIG. 35B) CRC in the CRC decoder 911 again, it may still want to try more conversion attempts (as in step 4421 of FIG. 35B). This is because further iterations of demap-decode uses (as in step 4418 of FIG. B) a feedback value that is based on a history of past LLRs, and hence it is more likely that the decoder 912 will pass (as in step 4422 of FIG. 35B). If the CRC decoder 911 keeps failing (as in step 4421 of FIG. 35B), eventually the decoder 912 may decide to ask for a retransmission (HARQ (as in step 4422 of FIG. 35B) from the transmitter 913, or even abort the current code circuit, instead of another (as in step 4421 of FIG. 35B) iteration of demap-decode. This process of going through multiple iterations of decoding 912 and conversion in the Convert to Bit LLRs circuit 906 (as in step 4413 of FIG. 35B) of symbol to bit LLRs (in the soft demapper circuit 907) is known as the iterative decoding principle or the turbo principle [1].

Terminology: Types of LLRs

While the generation of one set of N bit LLRs may go through several iterations of demap-decode (due to consecutive CRC failures as in step 4421 of FIG. 35B), generation of another set(s) of bit LLRs may pass (see step 4422 of FIG. 35B) CRC in the first round and need no iteration. In any round of demap-decode, either the first round with no feedback (as in step 4412 of FIG. 35B), or the proceeding rounds (as in step 4421 of FIG. 35B) with feedback (as in step 4418 of FIG. 35B), the values on signals between the decoder circuit 912 and soft demapper circuit 907 can be classified into three types: apriori LLRs, extrinsic LLRs, and aposteriori LLRs. Apriori LLRs are always inputs and contain pre-existing information with respect to the circuit they are fed into. Extrinsic LLRs are always outputs and contain new information based on the calculation performed in the circuit they are generated from. Aposteriori LLRs are also outputs but are representative of all information (including both the pre-existing and new information) from the first iteration and for all symbols for the same code.

Decoder core 915 with soft output typically generate aposteriori information in the form of aposteriori LLRs 914 as outputs. This could be in the form of using internal memory to update their state of the message information over time, hence collecting all information. It could also be that what decoders receive as input are themselves representative of all information, and hence so the decoder's output in the form of aposteriori LLRs 914. Although the decoders typically output aposteriori LLRs, as shown 914 in FIG. 9, the type of data exchanged between the decoder 912 and the soft demapper circuit 907 is extrinsic LLRs. If this were not the case, and the two circuit interchanged aposteriori data, there would have been positive feedback causing the data to diverge and become corrupt [1].

A Dataflow Example

One example of how the three different types of LLRs flow between the decoder 912 and the soft demapper circuit 907 is shown in FIG. 9 and also explained with respect to FIG. 35A. Assume that a new code is received 4402 at the receiver chain 901: code A. As in step 4409 of FIG. 35A, the demodulator 118 has generated a set of N/4×16 correlator output magnitudes 109 of code A, and at step 4410 of FIG. 35A, the same number of OS LLRs is output from the demapper circuit 113 that is arranged to convert the correlator outputs to OS symbol LLRs. The Convert to Bit LLRs circuit 906 receives these OS symbol LLRs 908 as apriori data and converts (as in step 4413 of FIG. 35B) them into N bit LLRs 909. The Convert to Bit LLRs circuit 906 also stores 4411 a copy of the OS LLRs in its internal memory, to reuse (as in step 4419 of FIG. 35B) them in case iterative decoding 4421 is applied. At this time (represented by step 4412 of FIG. 35B), the feedback bit LLRs 910 contains no LLRs (or equivalently carries N zero-valued LLRs) as this is the first time that data corresponding to code A is processed in the soft demapper circuit 907. Generally, in some examples of the invention, the Convert to Bit LLRs circuit 906 generates its output based on both the received N/4×16 OS symbol LLRs 908 and the N feedback bit LLRs 910 received from the feedback line. Given that the feedback bit LLRs 910 are representative of pre-existing data—even though zero-valued (as in step 4412 of FIG. 35B) in the first iteration—the output of the Bit LLR circuit 906 will be N bit LLRs 909 of the aposteriori type.

Since the decoder 912 provides feedback bit LLRs 910, and there is a closed-loop flow of data between the decoder 912 and the soft demapper circuit 907, the decoder 912 expects extrinsic type of input LLRs as part its processing, as opposed to aposteriori LLRs, which would create a positive feedback loop [1]. Therefore, the soft demapper circuit 907, which is setup in the closed loop with the decoder 912, subtracts the feedback N apriori bit LLRs 910 from the N aposteriori bit LLRs 909 output of the Convert to Bit LLRs circuit 906 to generate N extrinsic bit LLRs 904, as in step 4414 of FIG. 35B. As mentioned, the first iteration (as in step 4412 of FIG. 35B) of the Convert to Bit LLRs circuit 906 for code A, will have zero-valued apriori bit LLRs for the feedback bit LLRs 910, and hence the extrinsic bit LLRs 904 output from the soft demapper circuit 907 will be equal to the output of the Convert to Bit LLRs circuit 906 in the first iteration. The demapper's extrinsic bit LLRs 904 output from the soft demapper circuit 907 is de-interleaved $(\pi^{-1})$ in the decoder 912 and is fed into the decoder core 915 subsequently as N apriori bit LLRs 916 of the apriori type for the decoder 912. Following this, the decoder 912 can use these apriori LLRs 916 to generate a vector of decoded bits 917, which are then fed to the CRC decoder 911 shown in FIG. 9. If the CRC decoder 911 check passes 4422, then the transmission process is completed successfully.

Figure 35B:
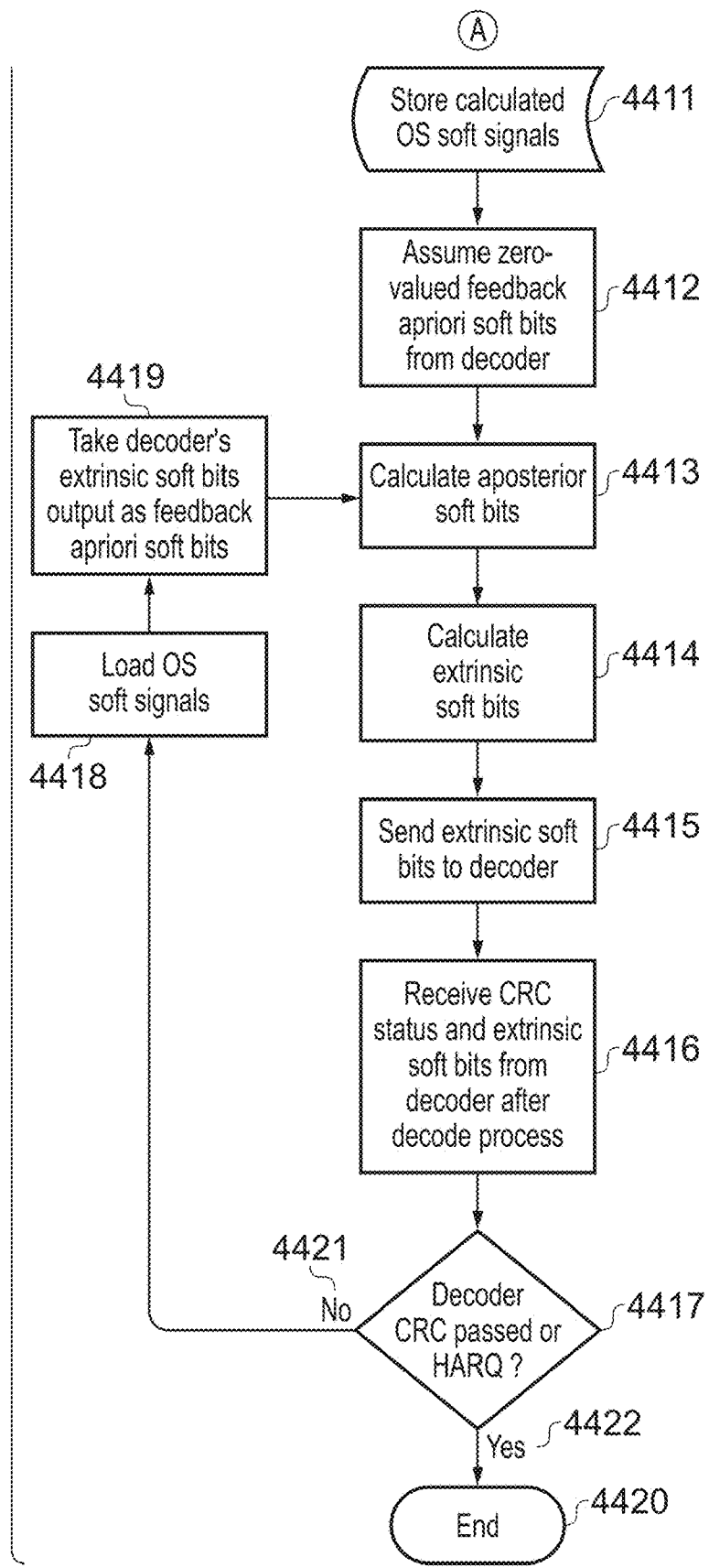

In FIG. 35B, if the decoder 912 fails (see 4421) due to CRC decoding 911 for code A and decides to apply iterative decoding, the decoder 912 can generate a sequence of N feedback bit LLRs 910. The result, for example the LLR feedback output in the form of aposteriori LLRs 914 of the decoder core 915 will be aposteriori, and for the same reason explained earlier to avoid positive feedback in the closed loop with the soft demapper circuit 907, the decoder 912 subtracts the input apriori bit LLRs 916 from decoder core's 915 aposteriori LLR feedback output 914. The resulting sequence of N extrinsic LLRs 918 are interleaved $(\pi)$ and fed back (as in step 4418 of FIG. 35J) to the soft demapper circuit 907 as apriori feedback bit LLRs 910 through the feedback line, which will possibly have non-zero values this time. The Convert to Bit LLRs circuit 906 then uses the feedback bit LLRs 910 for a second OS-symbol-to-bit LLR conversion (as in step 4413 of FIG. 35B) for code A, when it also uses (as in step 4419 of FIG. 35B) the code A's OS LLRs that it had stored 4411 in its memory from the previous iteration. The Convert to Bit LLRs circuit 906 will still keep the same OS LLRs in its memory, as the CRC decoder 911 may fail 4421 for a second time and a third OS-symbol-to-bit LLR conversion (as in step 4413 of FIG. 35B) may be required. The end of the iterative decoding is decided by the decoder 912, which may occur due to, either a CRC pass (resulting in a successful transmission process), or reaching a maximum number of decoding iterations (whereupon the transmission process is abandoned and deemed unsuccessful). Following the processing of code A, the next block of code (code 'B'), may have been received 4402 in the receiver chain 901, and the above process will be repeated for code B.

Calculating Bit LLRs

In the earlier description of conversion to bit LLRs for an OS scheme, it was explained how OS symbol LLRs 908 are generated from the correlator output values. where, it is explained how bit LLRs 909 are calculated (as in step 4413 of FIG. 3) from the apriori OS symbol LLRs 908 and the fed-back apriori bit LLRs 910 in an iterative decoding approach.

No Feedback from the Decoder

First, in a scenario where there is no feedback bit LLRs 910 from the decoder, or equivalently, the apriori feedback bit LLRs 910 to the soft demapper circuit 907 have values of zero, a 4-bit message m exists for which k=4 bit LLRs need to be found; one bit LLR for each of the message bits. In some examples, the 4-bit message can have any value from the set of 4-bit binary combinations {0000, 0001, ..., 1111} 3701, as shown at 3700 in FIG. 28, which illustrates 4-bit message combinations and corresponding OS symbol LLR parameters. The following parameters may also be used to represent the bit LLRs of the message: $LLR_3^{bit,out}$, $LLR_2^{bit,out}$, $LLR_1^{bit,out}$, $LLR_0^{bit,out}$ which correspond in the same order from the most significant bit (MSB) to the least significant bit (LSB) of the message. For inputs to the Convert to Bit LLRs circuit 906, there is M=16 OS symbol LLRs values, where each value corresponds to one of the M=16 message combinations 3702. The OS symbol LLRs 3703 are represented using the parameters $LLR_0^{sym,in}$, $LLR_1^{sym,in}$, ..., $LLR_{15}^{sym,in}$, as listed in FIG. 28. Therefore, on one side there exists M=16 OS symbol LLR values corresponding to M=16 message combinations, and on the other side the M=16 symbol LLRs are to be used to obtain k=4 bit LLRs for the 4-bit message.

Calculation

Referring now to FIG. 29, terms in a bit LLR calculation are illustrated at 3800, when there is no feedback from a decoder, according to some example embodiments of the invention. Here, the calculation (as in step 4413 of FIG. 35B) of the bit LLRs is better understood using an example. If it is assumed that $LLR_i^{sym}=LLR_i^{sym,in}$ for all i in the range [0,M–1] or [0,15]. If bit 0 (LSB) of the transmitted message was a "1", like messages "0001" or "1011", it may be expected that the demodulator 118 will express a collective probability of all the message combinations with their LSB equal to "1" (column 8 in FIG. 29) that is relatively higher than the collective probability of the message combinations with their LSB equal to "0" (column 7 in FIG. 29), when the channel conditions are favourable. In the same way, if bit 1 of the message had a value of "1", like "0010" or "1111", it may be expected that the demodulator 118 will express a collective probability of all the message combinations with their bit 1 equal to "1" (see column 6 in FIG. 29) that is higher than those with their bit 1 equal to "0" (see column 5 in FIG. 29). The same can be said for the cases when message bits were "0". The decoder is not aware of the actual values of the message bits, but attempting to determine them by considering combining probabilities (represented in LLRs) in a way that leads to a final message combination that is most likely amongst all to be the actual message. The left-hand side columns 3801 of FIG. 29 show the different message combinations for the 4-bit message (k=4). The right-hand side columns 3802 show how each of the M=16 symbol LLRs relate in the bit LLR calculation (as in step 4413 of FIG. 35B) for each bit of the 4-bit message.

In order to calculate (as in step 4413 of FIG. 35B) the bit LLR value for one bit, the M=16 symbol LLRs is first divided into two groups of 8 LLRs each, according to FIG. 29. For each bit of the 4-bit message (with an index in the range [0,k–1] or [0,3]), there are M/2=8 message combinations where the same bit index has a value "1", and M/2=8 combinations where the same bit index has a value "0". For example, for bit 3 (MSB) of the 4-bit message, message combinations {0000, 0001, ..., 0111} has their MSB equal to "0", and message combinations {1000, 1001, ..., 1111} has their MSB equal to "1". The LLR values corresponding to the first and second sets of 8 message combinations of the message's MSB are therefore {$LLR_0^{sym}$, $LLR_1^{sym}$, ..., $LLR_7^{sym}$} and {$LLR_8^{sym}$, $LLR_9^{sym}$, ..., $LLR_{15}^{sym}$}, and are shown in columns 1 and 2 of FIG. 29, respectively. It is also known that the logarithmic-likelihood ratio is defined as:

$$LLR \triangleq \ln\left[\frac{\Pr(\text{bit}=0)}{\Pr(\text{bit}=1)}\right], \qquad [4]$$

and that multiplications and divisions in the probability domain correspond to additions and subtractions in the LLR domain, respectively. Therefore, the bit LLR value, for instance for bit 3, will be the LLR probability of bit 3 when it is "1" subtracted from LLR probability of bit 3 when it is "0", that is $LLR_3^{bit,out}=L_3^{bit,0}-L_3^{bit,1}$ as shown 3803 in FIG. 29.

In order to calculate each of the parameters $L_3^{bit,0}$, $L_3^{bit,1}$, $L_2^{bit,0}$, ..., in the bottom row 3804 of FIG. 29, the corresponding LLR values need to be combined, which will be LLR parameters in column 1 for $L_3^{bit,0}$ as an instance. To obtain the probability of the event that any message combination amongst a given set of combinations occurs, the probabilities of all combinations within the given set must be added. This is because the message combinations are mutually exclusive—only one message combination is the actual value of a 4-bit message. For instance, the probability that the message is one of the values {"0000", "0101", "1010" } is Pr["0000" U "0101" U "1010" ]=Pr["0000" ]+Pr["0101" ]+Pr["1010" ].

The addition of probabilities can be approximated using the Jacobian logarithm in the LLR domain. The Jacobian logarithm is:

$$\log(a+b)=\max(\log(a),\log(b))+\log(1+e^{-|\log(a)-\log(b)|}), \qquad [5]$$

and assuming a and b are mutually-exclusive probabilities, they can be combined using their LLR values by writing log(a+b)=max($LLR_a$,$LLR_b$)+. This operation is called the 39axstar operation, and the sign ⓢ is used to denote it. The addition of probabilities can be represented using the 39axstar operator in the LLR domain. For instance, $L_3^{bit,0}$ is defined as $L_3^{bit,0}$ $LLR_0^{sym}$ ⓢ $LLR_1^{sym}$ ⓢ ... ⓢ $LLR_7^{sym}$, which contains the terms in column 1 of FIG. 29. In the same way, other parameters $L_3^{bit,1}$, $L_2^{bit,0}$, ... can be calculated from their corresponding columns in FIG. 29.

With feedback from the decoder

As explained previously, for every 4-bit message (k=4) there are k=4 apriori feedback bit LLRs 910 fed back from the decoder 912 to the Convert to Bit LLRs circuit 906, as shown in FIG. 9. The following parameters are used to represent the apriori soft bits 910 (feedback bit LLRs), $LLR_3^{bit,in}$ $LLR_2^{bit,in}$, $LLR_1^{bit,in}$, $LLR_0^{bit,in}$ which correspond, in order, to MSB down to LSB of the message.

Given that the soft demapper circuit 907 is now receiving multiple inputs, they can be enumerated according to the following:

the M output magnitudes of the correlators referred to as the first set of inputs to the soft demapper circuit 907. These are used to generate a first set of apriori soft signals comprising M OS symbol LLRs 908;

the second set of inputs to the soft demapper circuit 907 may be defined to be a second set of apriori soft signals comprising the k feedback bit LLRs 910 (or k soft bits).

Now the question is how these k=4 new values of soft bits or feedback bit LLRs 910 can be used, along with the previous M=16 OS symbol LLRs 908, to improve the k=4 feedback bit LLRs 909 as the output of the Convert to Bit LLRs circuit 906. In FIG. 28, it was shown that each of the M=16 OS symbol LLRs 908 represent a probability corresponding to one, out of M=16, of the message combinations shown in the left-hand side columns 3801 of FIG. 29. However, in this scenario, what is the relation of the k=4 apriori feedback bit LLRs 910 with respect to each message combination? In some examples, it is known that a positive LLR means the bit is more likely a "0", and a negative LLR means it is more likely a "1". Now, if the actual message was "0001", it may be expected that the apriori LLRs corresponding to bits 1-3 were positive, and the LLR value corresponding to bit 0 was negative. Therefore, the value $LLR_3^{bit,in}+LLR_2^{bit,in}+LLR_1^{bit,in}-LLR_3^{bit,in}$ may be expected to be positive for the message "0001". In the same way, it can be said that if the message, for instance, was "1010", it may be expected that the following is positive: $-LLR_3^{bit,in}+LLR_2^{bit,in}-LLR_1^{bit,in}+LLR_0^{bit,in}$. This explanation can hold for all M=16 message combinations: if a message combination is the actual received message, its corresponding apriori bit LLR combination is expected to be positive. FIG. 30 illustrates at 3900 4-bit message combinations, with corresponding OS symbol LLR parameters and apriori bit LLR combinations. The apriori bit LLR combinations 3901 are listed and the division by 2 in each combination is required for the calculation (as in step 4413 of FIG. 35) of output bit LLRs.

The above explanation can be taken further by saying that if a message combination is the actual message, its corresponding apriori bit LLR combination is expected to have the largest value amongst all other bit LLR combinations 3901. Therefore, by calculating the M=16 apriori bit LLR combinations of the left-hand side columns 3801 of FIG. 29 and FIG. 30, the largest of which directs the decoder to the message combination where according to the k=4 bit LLRs has the highest chance of being the actual message.

So far, in some examples and for the M=16 message combinations of the left-hand side columns 3801 of FIG. 29 and FIG. 30, there are two sets of M=16 soft signals that demonstrate the likelihood of the message combinations to represent the actual 4-bit message; the symbol LLRs 3703 and the apriori bit LLR combinations 3901, as shown in FIG. 30. As both sets are in LLR representation, they can be added together to become a single set of LLRs corresponding to the message combinations. Therefore, if the symbol LLR parameters in FIG. 30 are defined to be $LLR_i^{sym}=LLR_i^{sym,in}+LLR_i^{sym}$, bit for all i in the range [0,M−1] or [0,15], the bit LLRs generated by the Convert to Bit LLRs circuit 906 can then be calculated using the methodology explained for FIG. 29. The resulting (as in step 4413 of FIG. 35) bit LLRs 909 are aposteriori LLRs, as they represent all information, including both the newly received OS symbol LLRs 908 from the upstream and the old apriori feedback bit LLRs 910 received from the decoder 912.

Summary

In summary, the demapper circuit 113 and Convert to Bit LLRs circuit 906 have been described that are arranged to convert the correlator outputs to OS symbol LLRs and for generating (as in step 4413 of FIG. 35B) aposteriori soft bit LLRs 909, wherein a second set of apriori soft signals comprising k soft bits 910 are provided as a second set of inputs to the circuit. Furthermore, the circuit combines all apriori soft signals to generate a set of $2^k$ aposteriori soft signals and wherein the set of $2^k$ aposteriori soft signals are combined to obtain the set of aposteriori soft bit LLRs 909. Finally, the aposteriori soft bit LLRs 909 are combined with the soft bits or feedback bit LLRs 910 of the second set of apriori soft signals, in order to obtain a set of extrinsic bit LLRs 904 comprising k soft bits, as in step 4414 of FIG. 35B.

The flow 4400 of the soft demapper for the OS scheme, as demonstrated in the flowchart of FIG. 35A and FIG. 35B, may be summarised as follows. Initially at step 4401, the demapper receives 4402 a set of signals as the outputs of the demodulator that correspond to a transmitted frame. Then, in some examples, it is decided which of the three different methods of estimating the distributions of the correlator outputs, are to be employed. If the offline method is chosen at step 4423, the characteristics of the channel, such as the signal-to-noise ratio and channel type (e.g., AWGN), are identified in the offline channel estimation method 4405. The result of the identification is then used to address a pre-computed table, say pre-computed table 112 of FIG. 1, of distribution parameters of the correlator output magnitudes. If, in contrast, an online method of distribution estimation is chosen at step 4424, the choice will be either the use of synchronisation sequences in the first online channel estimation method at step 4407, or applying the largest magnitude method of the second online channel estimation method at step 4408 following a decision at 4404. Whichever estimation method is employed, the estimated parameters of the magnitude distributions, alongside the collected correlator output magnitudes of step 4409 of FIG. 35A, are used to calculate the OS soft signals of step 4410 of FIG. 35A, which may be in the form of LLRs, as described previously in the section that calculates OS LLRs.

Following that, the calculated 4410 OS soft signals are stored 4411 in internal memory, in case a demap-decode round of iterative decoding is required later. In a first iteration of a possible iterative decoding process, there is no value on the feedback path from the decoder. Hence, this feedback will be all zero-valued, as in step 4412 of FIG. 35B. Next, the aposteriori soft bits, in the form of LLRs (the OS bit LLRs), are calculated, as in step 4413 of FIG. 35B. This is followed by converting (as in step 4414 of FIG. 35B) the aposteriori soft bits into extrinsic sift bits as the type required by, and sent (step 4415) to, the decoder. After the decoder is finished with the process of decoding the extrinsic information that it received, the demapper receives (step 4416) the CRC status and the decoded soft bits from the decoder. Following a check of the CRC status at step 4417, if the check failed 4421, turbo decoding may be applied in some examples of the invention and the received 4416 decoded soft bits may be treated (as in step 4419 of FIG. 35B) as apriori information fed back from the downstream decoder. Also, the OS soft signals, which had been calculated at step 4410 previously, are loaded (as in step 4418 of FIG. 35B) from memory as another set of apriori information for the calculation of soft bits. The symbol-bit LLR conversion uses all apriori information to make a second calculation at step 4413 of soft bits as bit LLRs. The demap-decode iterations of turbo decoding are ended at step 4422 either by a CRC pass or by abandoning further decoding operations of the current frame, which may lead into, for example, a hybrid automatic repeat request (HARQ) re-transmission. At this point, the demapping of the current frame is ended at step 4420.

Testbench

Previously a method of providing the decoder 912 with extrinsic bit LLRs 904 of the received message, for example in the form of soft bits, has been described, by converting 4413 OS symbol LLRs 908 to bit LLRs 909 using the iterative decoding principle. Here, an evaluation of the conversion to extrinsic bit LLRs 904 is described. Different approaches can be used to evaluate the result of the Convert to Bit LLRs circuit 906—which is also the extrinsic bit LLRs 904 output of the soft demapper circuit 907. One approach is to observe the bit error rate (BER) when using the soft decision demapping, and have it compared against the BER of the same transmission but with a hard demapping of correlator output values into hard bits instead of LLRs. Other approaches characterise the generated extrinsic bit LLRs 904 from the soft demapper circuit 907, such as measuring mutual information (MI) histogram and measuring mutual information averaging, which is described later.

It is noted that, as some of the above approaches rely on comparisons of the decoded bits 919 against transmitted bits 920, they are only applicable in lab-environment testbenches where transmitted bits 920 are accessible, as opposed to real systems where only received 4402 data 921 are in hand. Examples of these lab-only evaluation methods are BER and MI histogram measurements. However, although these methods are only applicable to lab environments, they provide a good measure in evaluating the quality of the extrinsic bit LLRs 904 output of the soft demapper circuit 907.

High-Level Operation

Figure 10:
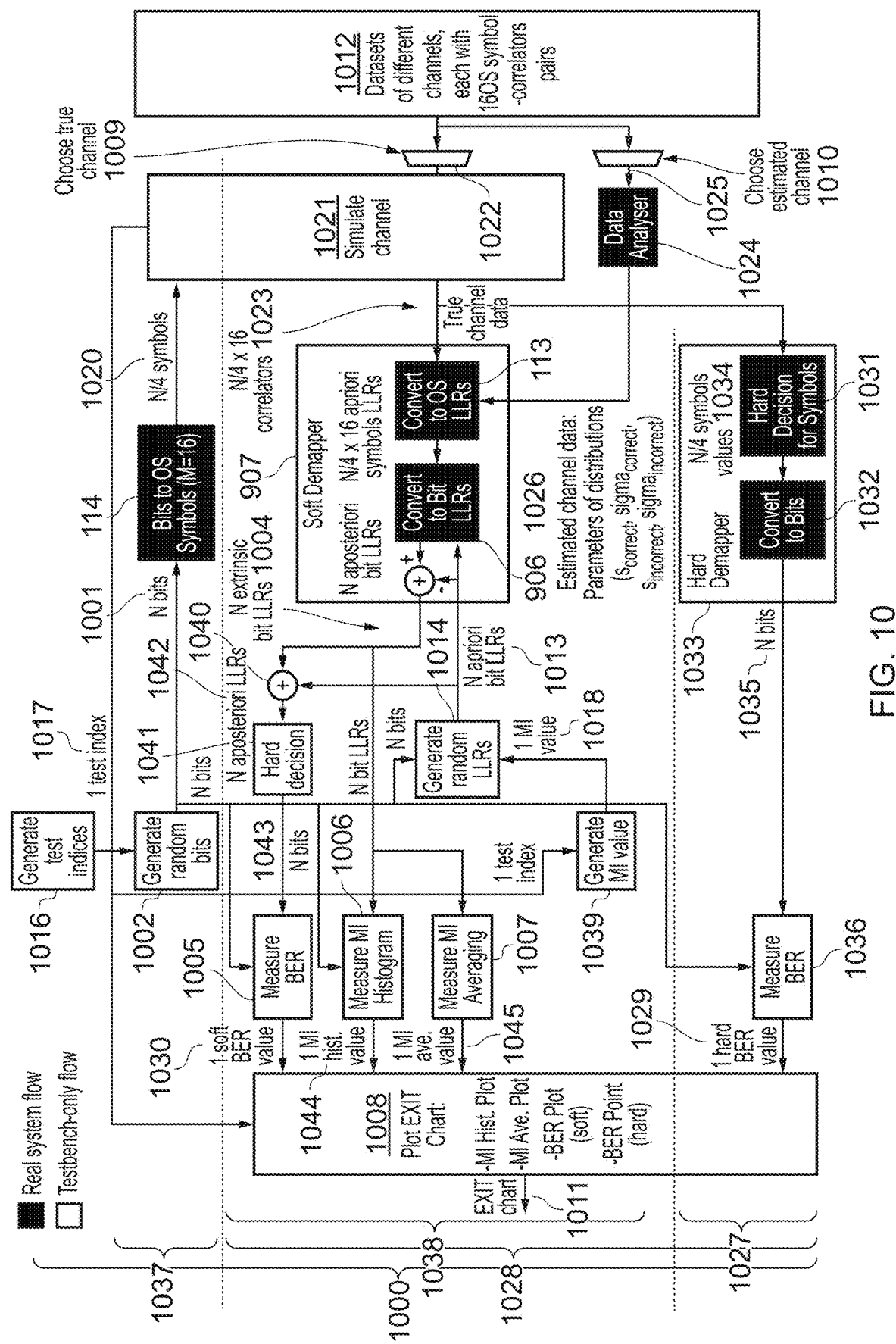
FIG. 10 illustrates a testbench block diagram for an example 16OS scheme (orthogonal signalling with M=16).

A testbench was developed in Matlab to measure the quality of the extrinsic bit LLRs 904 output from the soft demapper circuit 907 when it uses the above-described conversion to bit LLRs. A block diagram of the testbench 1000 for the 16OS scheme (orthogonal signalling with M=16, and the datasets taken from [5]) is illustrated in FIG. 10. As shown, there are no encoders or decoders: instead, encoded bits 1001 are simulated using random bits from a uniformly distributed random number source 1002. Also, the data that is meant to be fed into a decoder in real systems, is generated from the soft demapper circuit 907, and goes through a few measurements (such as BER 1005 and MI calculations 1006, 1007). The results of the measurements are used by a final processing function 1008, which plots an EXIT chart. In FIG. 8, the blocks and flows in the set 113, 114, 906, 907, 1001, 1004, 1013, 1020, 1023, 1024, 1026, 1031, 1032 and 1035 correspond to parts of the testbench that are in common with a real transmitter-receiver communication system 900. The remaining blocks and flows are only specific to the lab testbench and are typically absent from real systems.

Figure 12:
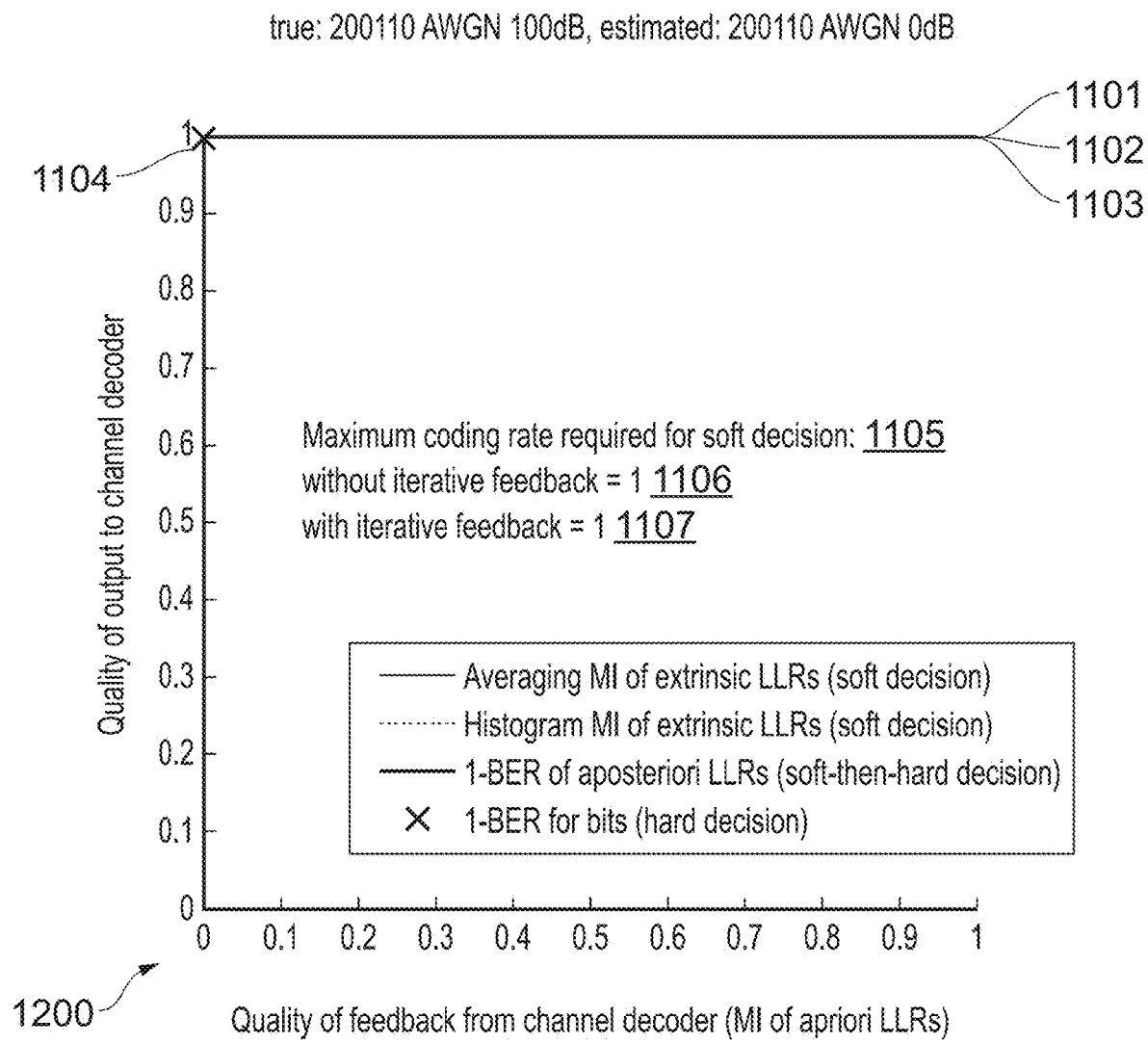
FIG. 12 illustrates EXIT charts for the 16OS-scheme dataset [5] with different estimated and true signal-to-noise ratio (SNR) values on an AWGN channel.
Figure 13A:
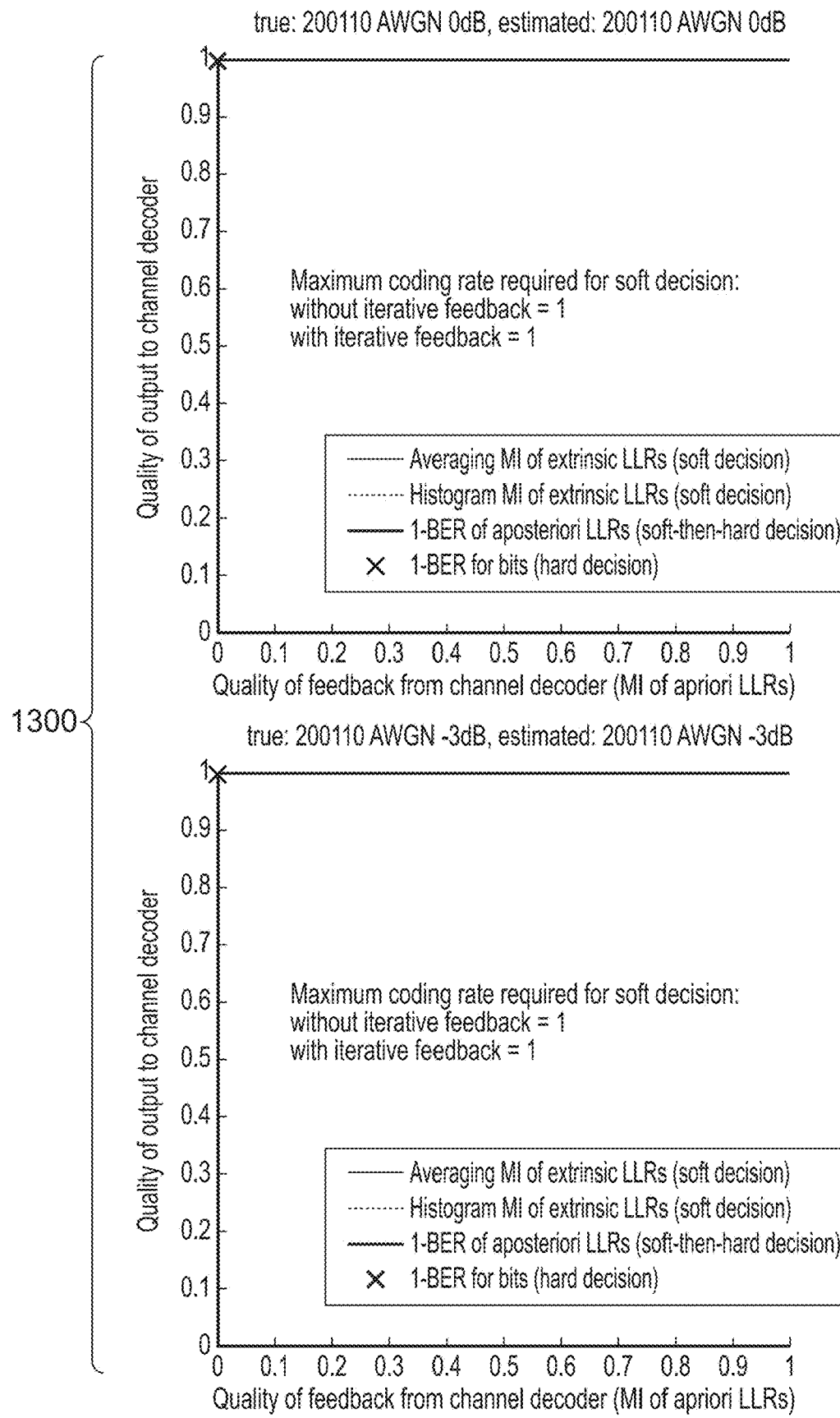
FIG. 13A and FIG. 13B illustrates EXIT charts for the 16OS-scheme dataset [5] with the same estimated and true SNR values on the AWGN channel.
Figure 13B:
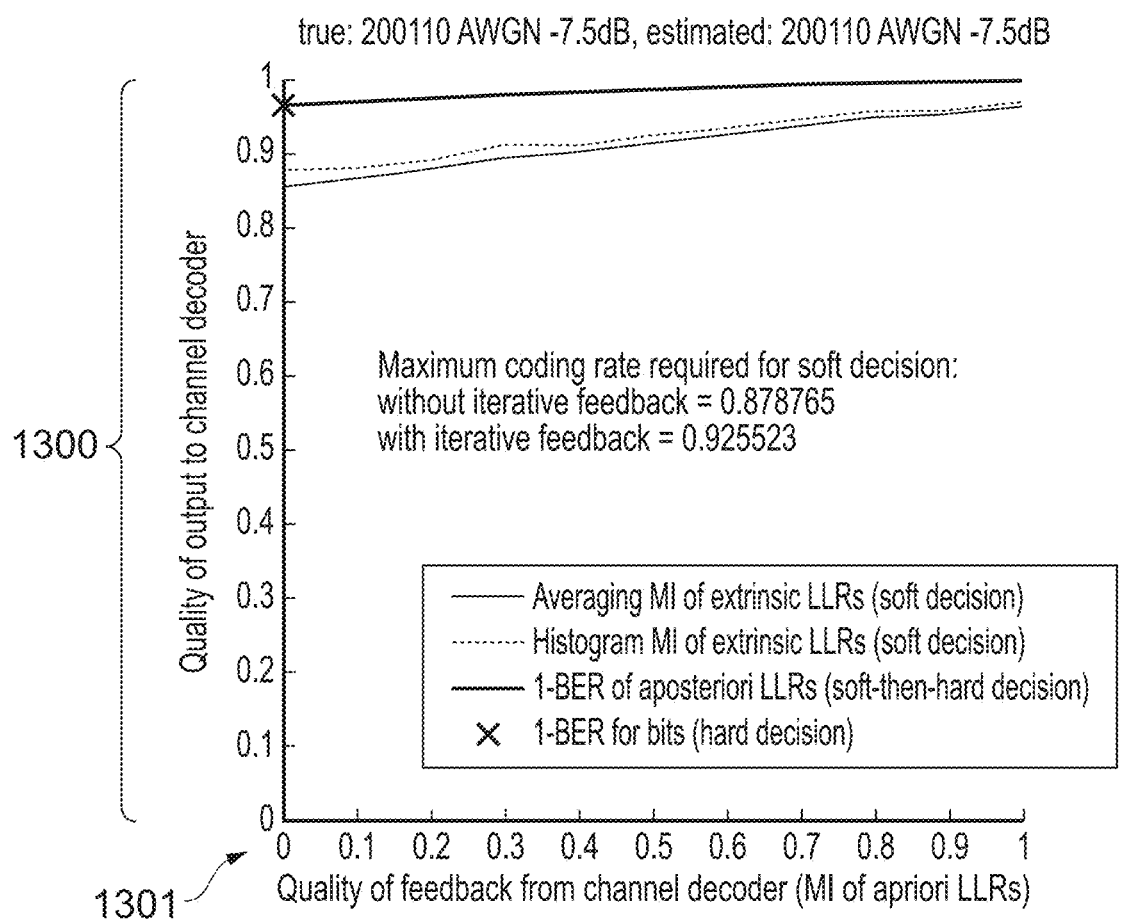
Figure 14A:
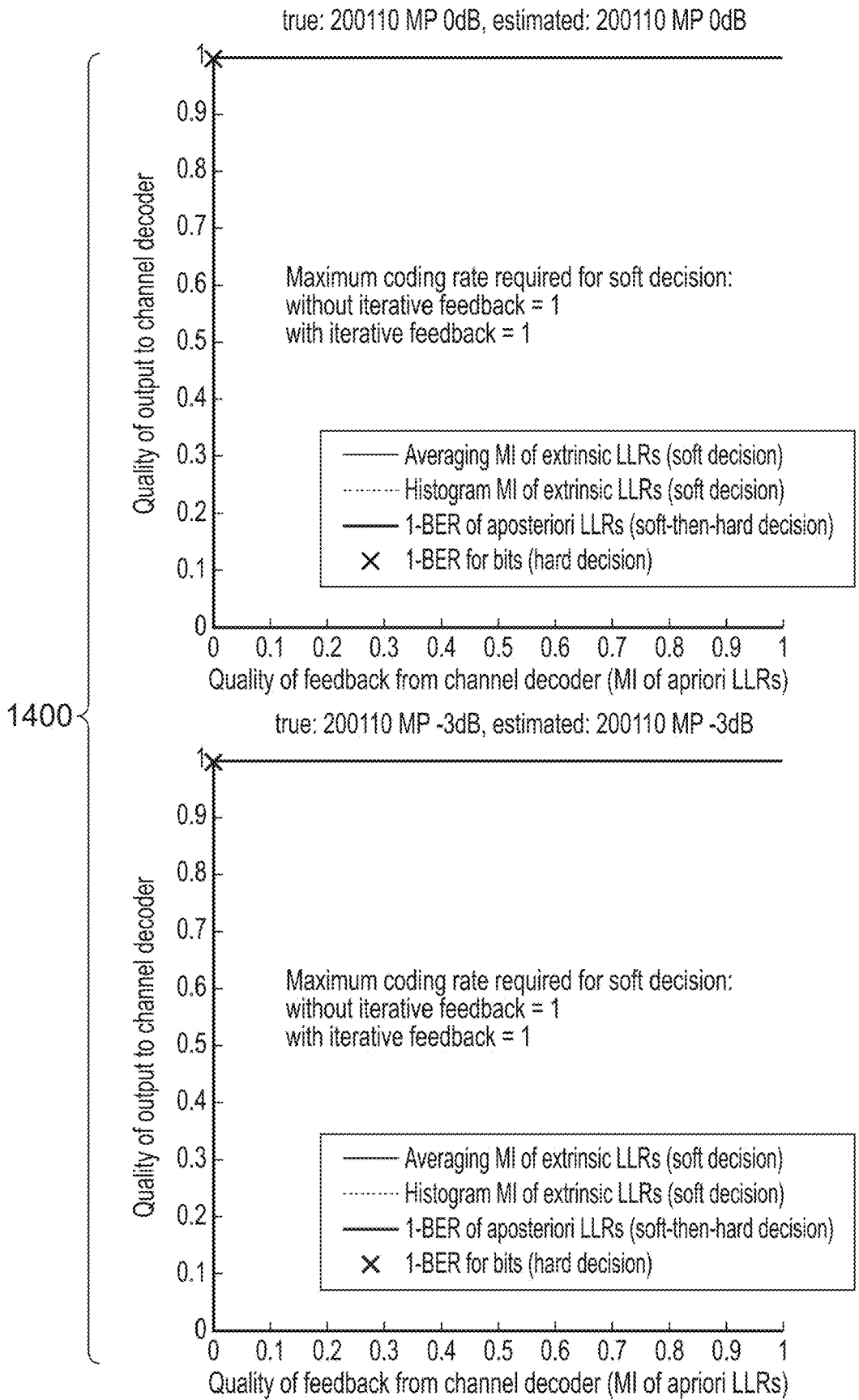
FIG. 14A and FIG. 14B illustrates EXIT charts using the 16OS-scheme dataset [5] with the same estimated and true SNR values on the Multipath channel.
Figure 14B:
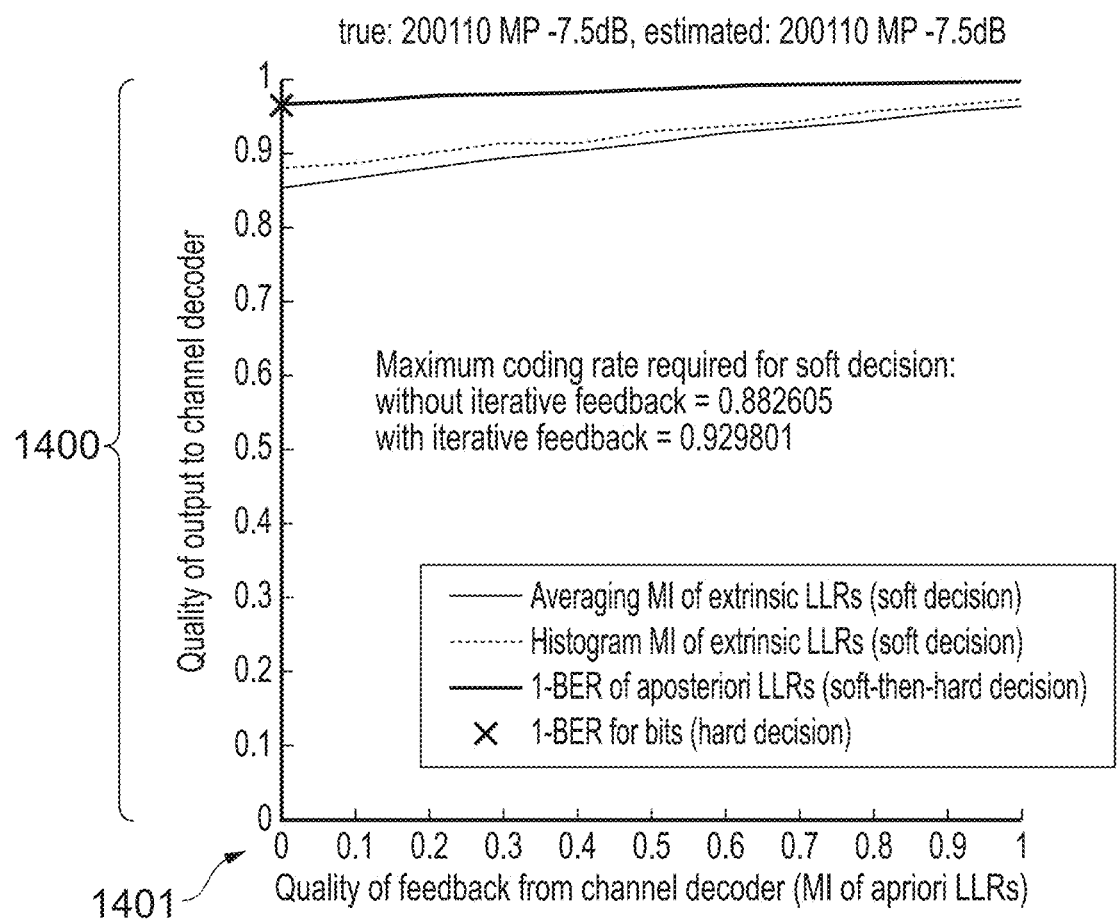

Every execution of the testbench is based on the choice of a true channel and an estimated channel and generates one EXIT chart 1011. In a practical system, it may not be possible for the receiver chain 901 to perfectly estimate the channel characteristics. This is represented in the testbench of FIG. 8 by using a first channel model (referred to as the true channel model 1009) to simulate the transmission and by using a second (potentially different) model 1010 to provide the channel characteristics that are obtained by the (potentially imperfect) channel estimator. Indeed, in some applications, channel estimation may be entirely absent from the receiver chain 901 and a fixed set of (worst-case) channel characteristics may be assumed, irrespective of what the true channel characteristics are. The user of the testbench will choose the two channel models as inputs 1009, 1010, as shown in the right-hand side in FIG. 8, and will expect the output EXIT chart 1011 that is specific to the two chosen channels, as shown in the left of the block diagram. The testbench 1000 was applied to several true and estimated channel combinations, with their EXIT charts illustrated in FIG. 10 to FIG. 12. In these figures, each EXIT chart has the same true and estimated channel types, but sometimes different SNRs. The true and estimated channels in each EXIT chart are both based on either the additive white Gaussian noise (AWGN) model, or the multipath (MP) model. While FIG. 10 has a different SNR between its true and estimated channels, FIG. 11A and FIG. 13B and FIG. 12 have the same SNRs each. FIG. 9 is an example EXIT chart when both true and estimated channels are based on the AWGN_-7.5 dB dataset.

Mutual Information

EXIT charts demonstrate a characterisation of the unit that they were generated from, which could be a demapper, or a decoder. In examples described herein that seek the evaluation of a soft demapping model, all EXIT charts 1100, 1200, 1300, 1400 illustrated in FIGS. 11-14 belong to soft demapper circuit 907. In these charts, the X axis is the mutual information of the apriori bit LLRs 1013: which is a measure of the quality of the feedback (which would come from the channel decoder in a real system, but which comes from a Generate random LLRs circuit 1014 in the testbench 1000) and fed into the Convert to Bit LLRs circuit 906. The mutual information between two random variables quantifies the amount of information in one variable that can be obtained by observing the other variable, and MI values are in the range [0,1]. An MI value of MI=0 means that there is no feedback from the decoder, and the feedback line will comprise a sequence of N zero-valued bit LLRs. Any value of MI>0 corresponds to cases when feedback from the decoder is present, and larger values of MI mean the feedback values have greater quality. The Y axis in the EXIT charts 1100, 1200, 1300, 1400 illustrated in FIGS. 11-14, is also a quality measure between zero and one, and corresponds to the output value generated by the soft demapper. In each of these EXIT charts 1100, 1200, 1300, 1400 in this document, there are three plots 1101, 1102, 1103 and one point shown by a cross 1104, and some number figures 1105 on the maximum coding rate achievable for the soft decision approach.

Testbench Flow

To generate the EXIT chart data, the testbench loops over a number of test indices 1016, where each 1017 corresponds, in the EXIT chart 1011, to points in all plots with the same MI value 1018 for the apriori bit LLRs 1013. For each test index 1017 of the test indices 1016, an apriori MI value 1018 is chosen. The system is simulated using this MI value 1018, demapper output of N extrinsic bit LLRs 1004 quality parameters (such as BER 1005) are measured, and eventually some points in the EXIT chart 1011 are identified. For example, the execution of the testbench with MI=0.3, produces one point for each of plot 1101, plot 1102 and plot 1103 in the EXIT chart 1100 in FIG. 9.

Transmitter

In each simulation with a test index 1017, encoded bits 1001 are generated from a uniformly-distributed random number source 1002 and fed into the bits to symbol circuit 114, which converts bits into symbols based on a modulation with 16 symbols (M=16). Hence, for N encoded bits 1001 there will be N/4 symbols (k=4) 1020 to be modulated.

Datasets

The models used in this testbench for different modulation schemes and channel types are represented by the datasets that were included in the previous correlator distribution investigation and conversion to symbol LLRs for an OS scheme, with the addition of one extra dataset. These datasets are provided by [5] and are presented using the following notations: AWGN_100 dB, AWGN_0 dB, AWGN_-3 dB, AWGN_-7.5 dB, MP_0 dB, MP_-3 dB, MP_-7.5 dB. Each of these datasets is a large matrix of 8100 rows, where each row contains (a) a symbol value 3502 in the range [0,M–1] or [0,15], and (b) M=16 correlator output magnitudes 3503, which were generated for that symbol value from the mathematical model of the corresponding modulation scheme and the channel. A memory 1012 in FIG. 8 stores and replicates all the above datasets, with in this example there being seven datasets in total.

Models of True and Estimated Channels

In this example, the choice of the true channel 1009 will select one of the available seven datasets and treat that as the modulation-channel simulation model 1021 of the testbench 1000. During the testbench simulation, for every symbol value generated from the Bits to Symbols circuit 114 of FIG. 1, a row with the same symbol value from the Chosen Modulation & Channel Model 1022 of FIG. 10 is randomly chosen and the corresponding 16 correlator values in the same row are output 1023. In this way, the correlation between the correlator outputs is preserved. Note however that the memory in the channel between successive transmissions is not modelled by this approach. However, this is justified because the proposed soft decision demodulator does not exploit this memory and because the spreading sequences used in [5] are designed to mitigate the dispersion that causes this memory. The user also needs to choose the estimated channel. In this example, the Data Analyser circuit 1024 of FIG. 10 fits Rician distributions to all rows from the user-chosen 1010 estimated dataset 1025 and returns four parameters 1026 corresponding to the distributions of the correct and incorrect sets of correlator data, as defined and explained in the previous correlator distribution investigation and conversion to symbol LLRs for an OS scheme. While in this testbench 1000, the channel estimation task of the Data Analyser circuit 1024 is performed concurrent to the simulation, in real systems it could take place online by analysing the received signal, or it could take place offline using very large sets of channel data if a fixed set of channel characteristics is to be assumed. Performing channel estimation offline can avoid large on-line complexity overheads.

Hard Decision Flow

Figure 11:
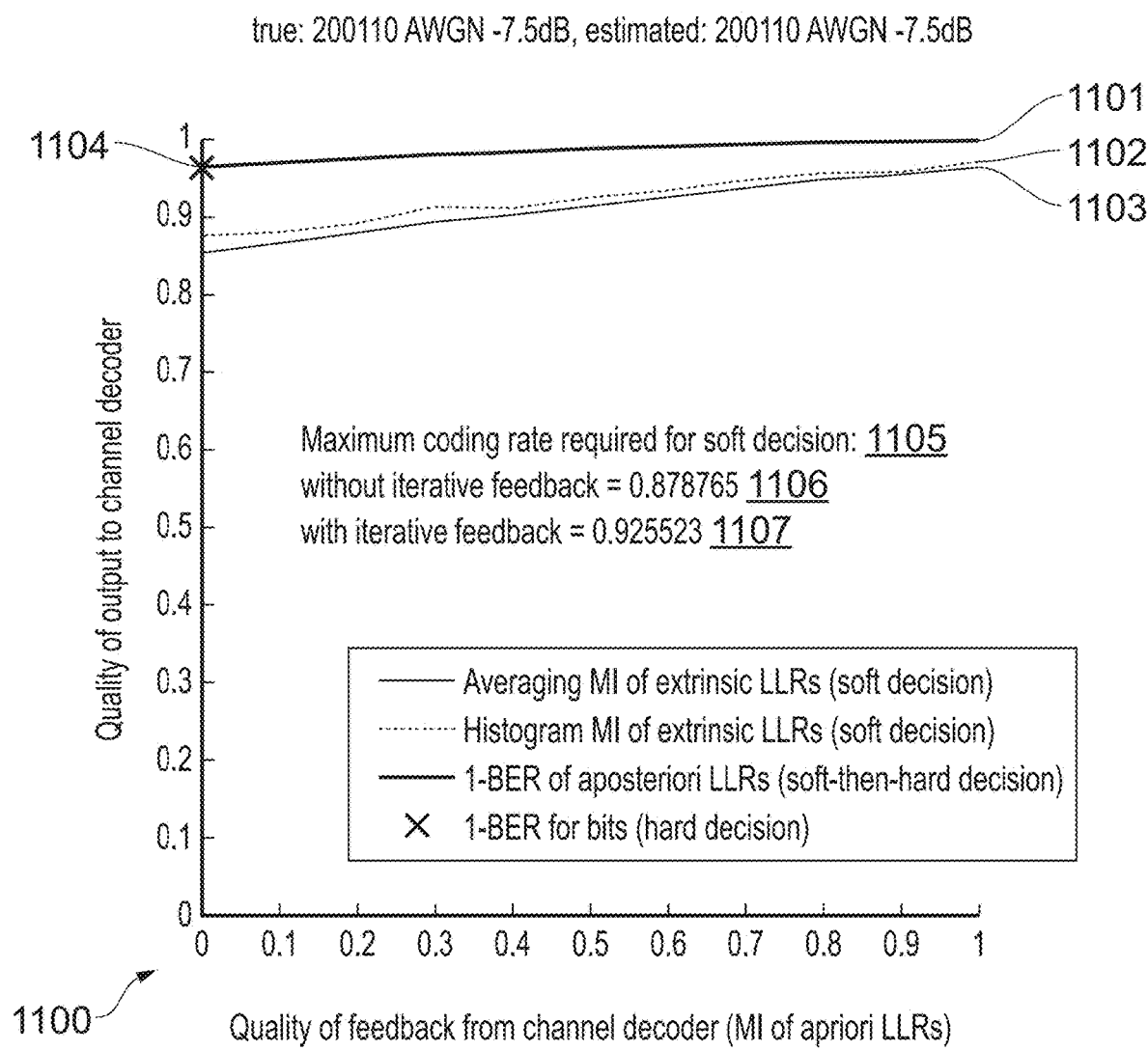
FIG. 11 illustrates a sample extrinsic information transfer (EXIT) chart, for an example 16OS-scheme dataset with true and estimated channels, both as AWGN_−7.5 dB.

In the testbench 1000 a hard decision flow 1027 of the receiver 1028 was included in order to calculate its BER 1029 and compare it against the BER performance 1030 of a soft decision bit LLR model. The Hard Decision for Symbols circuit 1031 receives M=16 correlator values from the channel model and performs a hard decision by taking the index 1034 of the largest correlator value as the 4-bit message value (k=4), which then passes the index to the Convert to Bits circuit 1032 to generate the equivalent bits 1035. For instance, if the largest correlator value amongst the M=16 has an index of '9', the result of a hard demapper circuit 1033 for this symbol will be "1001". When the hard demapper circuit 1033 demapped all symbols into bits, the BER measurement circuit 1036 compares those bits with the true encoded bits 1001 from the transmitter chain 1037 and calculates the BER value using the formula BER=number of bits in error divided by the number of all bits. The BER value 1029 will be a fractional number in the range [0,1]. While smaller BERs represent better performance, the value 1-BER is plotted in the EXIT chart (using a cross point "X") so that it can be compared against other quality measures, whose larger values also demonstrate better performance, and similarly have values between zero and one. The hard decision flow 1027 is independent from the soft decision flow 1038 and its iterative feedback, and for every dataset there will be just one hard BER value 1029 1104. Also, since the hard decision flow 1027 does not use feedback, its BER 1029 can be compared against the case in the soft decision flow when there is no feedback. Due to this, the hard decision BER point is plotted 1104 at apriori MI=0 in the EXIT charts, as shown in FIG. 11.

Quality of LLRs

The soft decision flow 1038 is based on receiving apriori bit LLRs 1013 as feedback to the soft demapper circuit 907, as shown in FIG. 10. Instead of using a decoder model in the testbench, it is sufficient for the purpose of the testbench that the apriori bit LLRs 1013 to the soft demapper circuit 907 are generated differently from a decoder, which in this case are generated by the Generate random LLRs circuit 1014. In order to simulate a real receiver, the generated apriori bit LLRs 1013 must be, with a certain quality, similar to the encoded bits 1001, and hence the Generate random LLRs circuit 1014 takes as input the true encoded bits 1001 in order to create LLRs with such a similarity. These random LLRs are generated according to a Gaussian distribution, as described in FIG. 4 of [1].

Feedback Apriori Bit LLRs: A Function of MI in this Testbench

The quality of the feedback apriori bit LLRs 1013 in the testbench 1000 of FIG. 10 are represented by the MI value as the mutual information. The MI is a statistical measure that can be used to represent how much the demodulated extrinsic LLRs (or feedback apriori bit LLRs 1013) have shared information with respect to the true encoded bits 1001. Therefore, as a statistical measure it can be expected that the MI value is generally calculated to find out the dependence between the encoded and demodulated bits, for example, in lab-environment testbenches where decoder models are present. However, in this example testbench 1000, since feedback apriori bit LLRs 1013 are not generated from a decoder model, but as a function of the true encoded bits 1001, the MI of the encoded and demodulated bits may be defined for different test indices. An MI value 1018 will become an input to the Generate random LLRs circuit 1014 to generate mimicked decoded bits. The Generate random LLRs circuit 1014 contains a mathematical function that produces LLRs whose mutual information with respect to the given input bits is equal to the input MI value. The Generate MI value circuit 1039 uses a test index 1017 to generate an MI value 1018 in the range [0,1].

Soft BER Calculation: Why Aposteriori Data?

Calculating the bit error rate in the soft decision flow 1038 requires aposteriori information from the soft demapper-decoder interface. This is because the output of a soft decoder is typically aposteriori data (as explained previously in the section describing a conversion to bit LLRs and exit chart evaluation for an OS scheme) and hence the aposteriori information would be the closest form to that of a decoder's output. Obtaining aposteriori data from the decoder-demapper interface is shown in FIG. 10 with the summation 1040 of the N extrinsic bit LLRs 1004 and N apriori bit LLRs 1013 from and to the soft demapper circuit 907, respectively. The testbench 1000 then makes a hard decision 1041 on the aposteriori bit LLRs 1042 to provide N bits 1043 from the N aposteriori bit LLRs 1042. Here, a hard decision of binary '0' is made for positive aposteriori LLRs and a hard decision of '1' is used for negative LLRs. The resulting N bits 1043 are compared in terms of BER 1005 against the true N encoded bits 1001 from the transmitter chain 1037 in order to provide a BER measure 1030 for the test index 1017 and the MI 1018 of that execution.

Comparison of Soft and Hard BER Values The comparison of the soft BER value when MI=0 against the hard BER 1029 is valid as both values are calculated based on bits resulting from the same type of (extrinsic) data from their demapping of symbols to bits. This is obvious with the hard decision flow 1027, as there is no feedback in this flow, and hence the data from the hard demapper circuit 1033 is extrinsic. Also, since the soft decision flow 1038 when MI=0 has its feedback apriori bit LLRs 1013 with values of zero, the aposteriori bit LLRs 1042, in this case, are equal to the N extrinsic bit LLRs 1004 generated from the soft demapper circuit 907, as shown in FIG. 10. Therefore, a decrease in BER value from the hard decision flow 1027 to the soft flow 1038 means that the use of LLRs has been able to increase the quality of the receiver by reducing the error rate. In the EXIT chart, this BER performance increase will be the case if the cross point 1104 of the hard BER value happens to be underneath the plot 1101 of the soft decision BER value—as the plot values are in the form of 1-BER. Generating soft decision BER values also shows the effect of increasing the quality of feedback LLRs on the BER performance. For example, FIG. 11 demonstrates that using the example soft demapping approach, the quality of LLRs to the decoder increases as the quality of the feedback LLRs enhances. It may be observed that the soft (decision) demapper circuit 907 produces an equal or better BER than the hard (decision) demapper circuit 1033 in all cases shown in FIG. 12 to FIG. 14B.

MI: Histogram and Averaging Methods

There are two other quality measures that can characterise a soft demapper circuit's output: the mutual information histogram 1102 and the mutual information averaging 1103, as demonstrated in the EXIT charts. Both measures provide mutual information, and both look at the output N extrinsic bit LLRs 1004 of the soft demapper circuit 907 to calculate their MI, as opposed to the BER measure that required aposteriori bit LLRs 1042. The histogram method (equation (2) in [1]) provides the mutual information 1044 between the N extrinsic bit LLRs 1004 and the true encoded bits 1001 from the transmitter chain 1037. This known method does not assume that 'LLR values could not be wrong'—i.e., this known method does not trust LLRs—and checks those LLRs against the true encoded bits 1001. In contrast, the averaging method (the equation immediately below FIG. 4 in [1]) solely looks at the N extrinsic bit LLRs 1004 and provides a measure 1045 of quality without an outside reference. Thus, it provides a quality measure based on trusting LLRs. For this reason, the averaging method works best when the decoding algorithms are optimal.

Upper Bounds on Achievable Coding Rates

The MI histogram method can also be used to provide an upper bound on the achievable coding rate when the soft demapper circuit characterised by the MI histogram is used. The achievable coding rate between a decoder and a demodulator in general (which includes a demapper) is mainly dependent on the following two aspects. The first aspect is how well the decoder and the demapper are matched (see discussion of the 'area gap' in [1] for more details). Like demappers, the behaviour of a decoder can also be characterised using EXIT charts. One can compare a demapper's EXIT chart with that of a decoder to determine how the two match. The second aspect in identifying the achievable coding rate is the block length applied when using the system: shorter block lengths decrease the coding rate required in practice (see [1] for more details).

Regardless of whether a decoder's EXIT chart is present, or a code length is chosen, the demapper's EXIT chart contains figures that define the theoretical upper bound on the coding rate that supports reliable low-BER operation using the demapper. This upper bound differs between the cases when there is iterative feedback in 1107 and when there is no iterative feedback in 1106 in FIG. 11. For example, according to the EXIT chart of FIG. 11, the apriori MI histogram value for when the feedback quality has an MI of zero is 0.87 (rounded towards zero). This means that the maximum achievable coding rate using the example soft decision demapping approach without an iterative feedback for an AWGN_7.5 dB channel is 0.87, shown at 1106. In the presence of iterative feedback (when feedback has MI>0), the area below the MI histogram plot will be the maximum achievable coding rate [1]. In FIG. 11, the area below the MI histogram plot is 0.92 (rounded towards zero), and hence the maximum achievable coding rate in the example soft decision demapping approach when there is iterative feedback for an AWGN_7.5 dB channel is 0.92, shown at 1107

Results: EXIT Charts

High-SNR Charts

The EXIT charts in in FIG. 12 to FIG. 14B show that for SNRs≥−3 dB in all channels (5 charts in total) there is not any bit error: all hard and soft BER values are zero. Also, the MI quality measures of the demapper's extrinsic LLRs, both histogram and averaging methods, have values of 100% for all MI values of the feedback quality. This verifies the soft decision demapping model according to example embodiments of the invention for normal high-SNR conditions: the model successfully provides bit LLRs to the decoder with 100% mutual information with the true bits sent from the transmitter, and with zero bit error rates.

Low-SNR Charts

Without Iterative Feedback: BER

The EXIT charts for small SNRs of −7.5 dB (for example the two charts in total 1301, 1401 in FIG. 13A and FIG. 13B and FIG. 14A and FIG. 14B also demonstrate that the soft decision demapping model according to example embodiments of the invention works as expected. The two EXIT charts of AWGN 1301 and MP 1401 channels in FIG. 13A and FIG. 13B and FIG. 14A and FIG. 14B, each with an SNR value of −7.5 dB, have 1-BER values of 0.97 (rounded towards infinity) for their hard decision, and have slightly better values for their soft decision when there is no iterative feedback. This means that the soft demapping model according to example embodiments of the invention managed to preserve the bit error rate when switching from the hard model to the soft model without feedback.

With Iterative Feedback: Effect of Feedback MI on BER and the Two MI Figures

The low-SNR EXIT charts 1301, 1401 in FIG. 13A and FIG. 13B and FIG. 14A and FIG. 14B also demonstrate that as the quality of feedback LLRs increases (when MI>0), the quality of the demapper circuit's output LLRs, as well as the bit error rate improve. The 1-BER figure approaches to 100% values when the feedback quality MI goes to the value of 1, as may be expected for the case where perfect information is fed back. Also, the demapper circuit's output quality MI figures of histogram and averaging methods, start from values between 85%-90% for feedback MI=0, and become approximately equal to 97% when the feedback MI is '1'. The two MI figures have also values close to each other for all feedback MI values, which means that the two MI measures represent the quality of the feedback LLRs confidently and show that the consistency condition of [1] is met.

Maximum Achievable Coding Rates

Depending on the decoder and the chosen block length, a receiver may be able to converge to parts of its demapper circuit's EXIT charts that has the highest quality values. In the illustrated EXIT charts, the fact that highest BER performance and MI quality values are both near 97%-100% when the feedback MI is equal to 1, means that the proposed demapper circuit approach according to example embodiments of the invention may provide the highest quality LLRs. The low-SNR EXIT charts 1301, 1401, of FIG. 13A and FIG. 13B and FIG. 14A and FIG. 14B also show that the upper bound on the coding rates are 0.88 and 0.93 (rounded to nearest $2^{nd}$ decimal place), for the cases when the iterative feedback is absent and is present, respectively.

OS-PSK Soft Demapping and EXIT Chart Evaluation

In this section, a proposed soft-decision approach in demapping of a demodulator's correlator outputs from an orthogonal signalling-phase-shift keying (OS-PSK) modulation scheme into extrinsic soft bits in the form of logarithmic likelihood ratios (LLRs)—also known as bit LLRs or soft bits is described, according to some examples of the invention. The operation of one example of the proposed soft demapper is demonstrated in the flowchart of FIG. 36.

The previous section presented a soft demapping approach for OS-only correlator outputs. The functionality of some circuits in FIG. 15A has been previously described with regard to earlier figures, so will not be repeated in order not to obfuscate the concepts described here. FIG. 15B introduces the following additional circuits: a Convert to PSK symbol LLRs circuit 1501 and a Symbol-to-symbol LLR circuit 1502. This section also explains how, in the transmission systems captured in FIG. 15A and FIG. 15B, the transmitter chain 1503 applies the direct-sequence spread spectrum (DSSS) technique (using the Spreading Sequence Generator circuit) and the modulator circuit 1504 to convert information bits into OS-PSK modulated data.

Modulation Model

Transmitter Chain

Figure 15A:
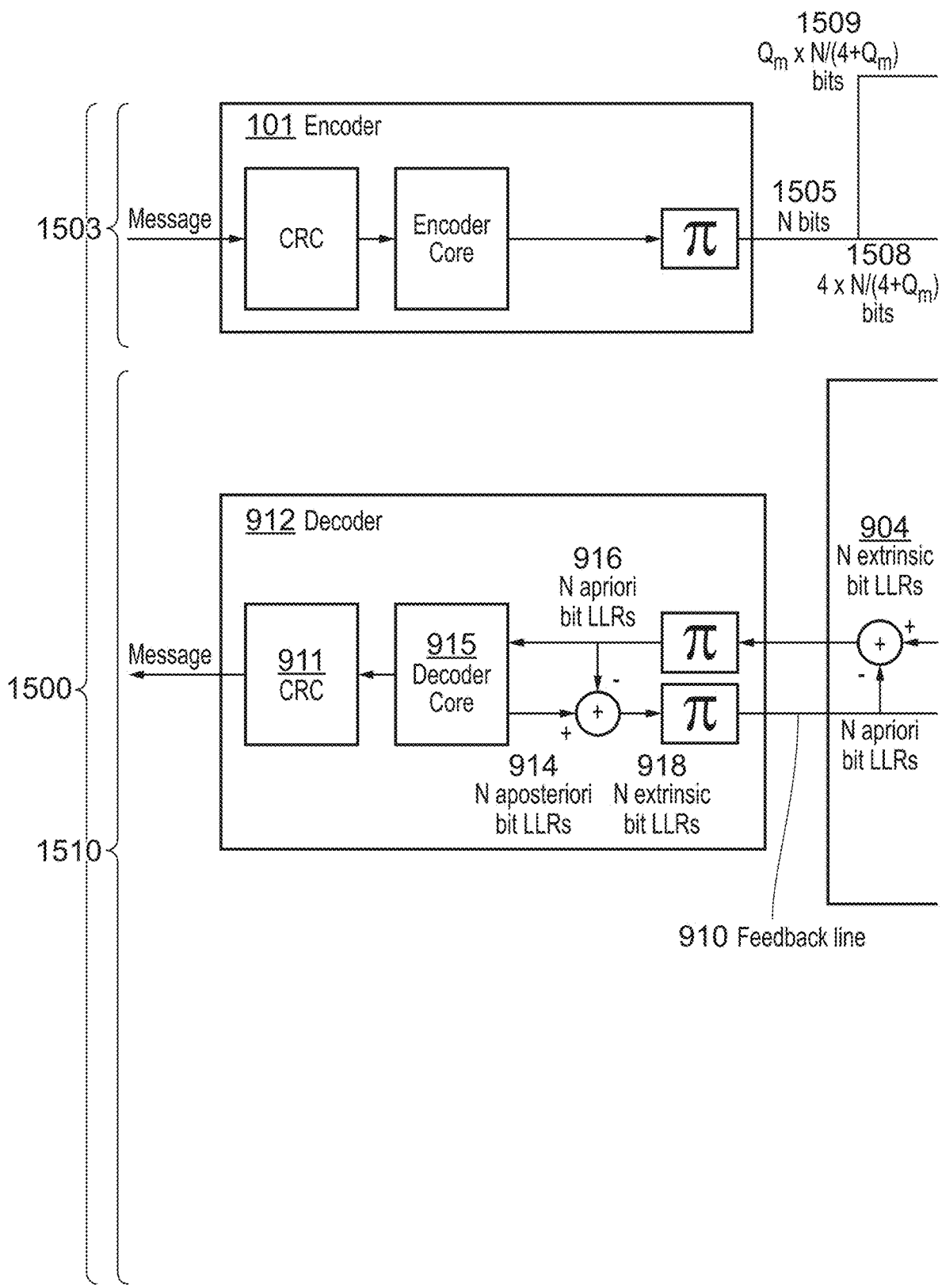
FIG. 15A and FIG. 15B illustrate a top-level block diagram of an OS-PSK transmission system according to another example embodiment of the present invention.
Figure 15B:
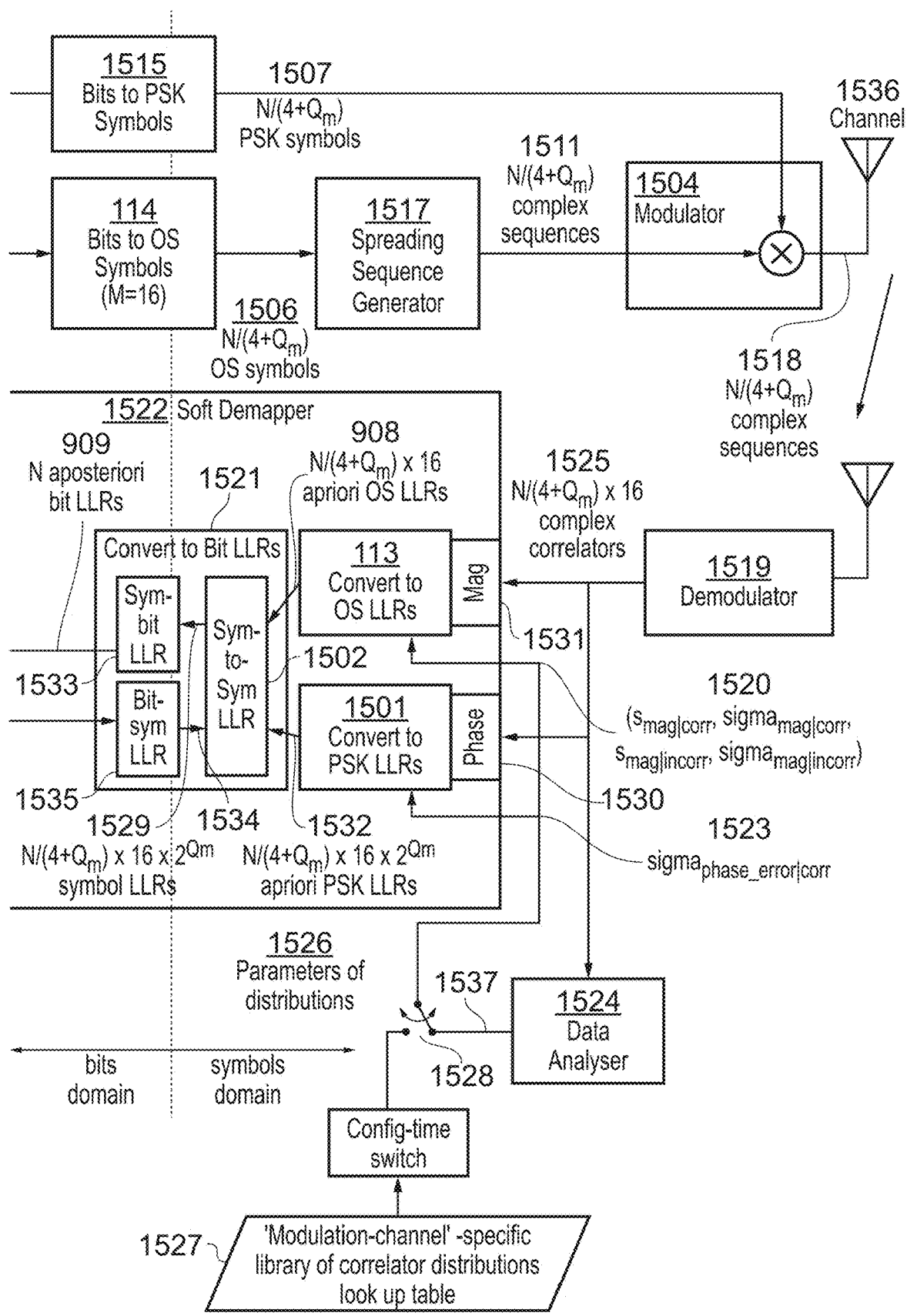

The OS-PSK modulation scheme, as shown in FIG. 15A and FIG. 15B, turns the N encoded bits 1505 into a number of OS symbols 1506 and PSK symbols 1507 according to the work done by [7]. Take the example when the OS scheme has a modulation parameter (referred to as the OS radix) of M=16 (also referred to as the 16OS scheme), which corresponds to k=$\log_2$M or 4 bits per OS symbol. Likewise, consider the case where the PSK modulation parameter (referred to as the PSK bits-per-symbol) has a value of $Q_m$=2, which corresponds to a PSK radix (also known as modulation order) of $2^{Q_m}$=4. A PSK Scheme with $Q_m$=2 is Also called the quadrature PSK (QPSK). In every k+$Q_m$=4+ 2=6 bits of an encoded message, in this example, 4 bits are turned into an OS symbol and 2 bits are converted into a PSK symbol, where both symbols have complex values. Assuming N is an exact multiple of 6, there will be a total of N/(k+$Q_m$) or N/6 OS symbols 1506 and the same number of PSK symbols 1507. In the transmitter chain 1503, the OS-mapped k bits are referred to as the first set of bits 1508 and the PSK-encoded $Q_m$ bits are referred to as the second set of bits 1509.

Note that in this section, in accordance with some examples of the invention, a fixed OS radix of M=16, but with a variable PSK radix, is employed. This approach enabled the inventors to explore the impact of varying the PSK radix. However, it is envisaged that, in other example embodiments, the soft-demapping methodology and concepts described herein can be applied to an arbitrary number of OS bits 'k'.

Indeed, in the extreme, a skilled practitioner could envisage a scheme where the OS radix is M=1 and there are k=0 bits conveyed by the selection of a spreading sequence, and with all N=$Q_m$ bits being conveyed by the phase of the spreading sequence. In this scheme, the transmitter would repeatedly transmit the same spreading sequence, each time with a phase rotation that conveys $Q_m$ bits.

Direct-sequence spread spectrum

In order to improve the signal-to-noise ratio (SNR) at the receiver chain 1510, the DSSS technique is used in the transmitter chain 1503 which multiplies 1517 the OS symbols 1506 by a pseudorandom base sequence of signals represented by complex numbers. The base sequence is called the spreading sequence, and each signal value in the spreading sequence 1511 is known as a chip. The chips have shorter durations compared to the encoded bits 1505, and hence have larger bandwidths. The conversion of the information bits into chips has the effect of scrambling the information bits and widening their frequency spectrum, and hence reducing the overall signal interference when the signals are modulated. The receiver chain 1510 is aware of the spreading sequence and uses it to de-spread the received signal.

Modulation

In the example above, while k=4 bits 1508 amongst 6 bits of the encoded bits 1505 that are turned into an OS symbol 1506 and then turned into a spreading sequence 1511 of complex values, the other $Q_m$=2 PSK-encoded bits 1509 are mapped 1515 into one (amongst four) possible complex PSK symbols 1507 in a quadrature PSK scheme. The four possible QPSK-mapped values have different phases, but the same magnitude, and are equally spaced in a complex plane. The PSK-symbol 1507 of the $Q_m$=2 PSK encoded bits 1509 is multiplied, in the Modulator circuit 1504, by each value in the spreading sequence 1511. The result is a sequence 1518 of complex values, that is a rotated version of the spreading sequence 1511 corresponding to the k=4 OS-encoded bits 1508, where the amount of rotation is according to the value of the other $Q_m$=2 PSK-encoded bits 1509. This final sequence 1518 of complex numbers contains the information for all the k+$Q_m$=6 encoded bits 1505 and is transmitted through the antenna(s).

Data

The receiver chain 1510 will demodulate the signals based on its knowledge of the applied schemes, such as the PSK modulation order (from the value of $Q_m$) and the spreading sequence 1511. The datasets used in this work to evaluate the example soft demapping approach are provided in [6], and are based on a 16OS-QPSK scheme (that is with M=16, $Q_m$=2), and were generated based on a spreading sequence with 50 chips. Subsequent sections propose a technique that allows these 16OS-QPSK datasets to be generalised and used to model any PSK radix. These datasets belong to the same set of channels and SNR values used previously: AWGN_100 dB, AWGN_0 dB, AWGN_-3 dB, AWGN_-7.5 dB, MP_0 dB, MP_-3 dB, MP_-7.5 dB. The AWGN and MP terms refer to the additive white Gaussian noise and the multipath channels, respectively. For example, FIG. 31 illustrates the AWGN_0 db dataset of the 16OS-QPSK scheme [6]: the table shows the first 20 rows out of 8100. Each dataset is comprised of 8100 rows, where each row includes the value 4001 of one 6 bits of the message and the corresponding M=16 pairs 4002 of in-phase (I) and quadrature-phase (Q) correlator values.

Magnitudes of Correlator I-Q Pairs

The I and Q values in each I-Q pair represent the real and imaginary parts of a complex correlator output value, respectively. For instance, in row 1 of FIG. 31, the first correlator output has a complex value of −0.9-6i, where i is the imaginary unit. The magnitude of an I-Q pair resembles the possibility of the pair's index value, with respect to other pairs amongst the 16 in a row (hence a cross-correlation value, like a correlator's output), to represent 4 bits of the original transmitted 6-bit message. Therefore, in a similar manner to the previously described example, the one pair amongst M=16 that has the largest magnitude, is generally expected (in favourable channel conditions) to have its index with a value that is the same as the k=4 least significant (LS) bits of the (k+$Q_m$) 6-bit message. Here, the convention that the PSK bits provide the $Q_m$ most significant bits and the OS bits provide the k least significant bits is adopted. It is envisaged that other conventions may equally be adopted within the inventive concepts herein described, such as the PSK bits providing the k least significant bits. The I-Q pairs with the largest magnitudes in their rows are underlined in FIG. 31A and FIG. 31B. For example, the $9^{th}$ row 4003 in FIG. 31A has its LS k=4 bits of message with a value 7 ('0111'), and the index of the largest-magnitude I-Q pair in this row has also a value of 7. As discussed previously, in one row of a dataset, the I-Q pair with an index equal to the value of the LS k=4 bits of the message may be referred to as the "correct" correlator outputs, and the remaining M−1=15 1-Q pairs as the "incorrect" correlator outputs. To elaborate further, the 'correct' correlator output is provided by the correlator for which the corresponding one of the $2^k$ possible signals was selected as the transmission signal.

Phases of Correlator I-Q Pairs

While the magnitudes of the correlator I-Q pairs contain the information for k=4 bits of the (k+$Q_m$) 6-bit message, the phase values of the I-Q pairs represent the information for the remaining $Q_m$=2 bits. The datasets have their QPSK modulation on the most significant (MS) 2 bits of the message. For example, the 2 MS bits of the message in row 1 4004 of FIG. 31 is '01', which in this example means this message is QPSK-modulated with a phase indexed as 1 amongst indices in the range [0,3](that is [0, $2^{Qm}$−1] in the general case). Depending on the QPSK coding, phase indices map to a particular set of Gray-coded phase values. For instance, with a phase mapping of [π/4, 3π/4, −π/4, −3π/4] to [00, 01, 10, 11], the phase index '01' is mapped to the phase value 3π/4, and hence the correct correlator output I-Q pair in row 1 (FIG. 31) is expected to have a phase with value 3π/4.

Hereafter, a technique that allows these 16OS-QPSK datasets to be generalised and used to model any PSK radix is described. For the sake of simplicity, in these illustrated examples, phase mappings that begin with a phase of 0 will be adopted, such as [0, −π] for binary PSK (BPSK), or [0, π/2, −π/2, −π] for QPSK, and so on.

Distribution of Correlator Outputs
Correlator Output Magnitudes: OS Modulated

Figure 16:
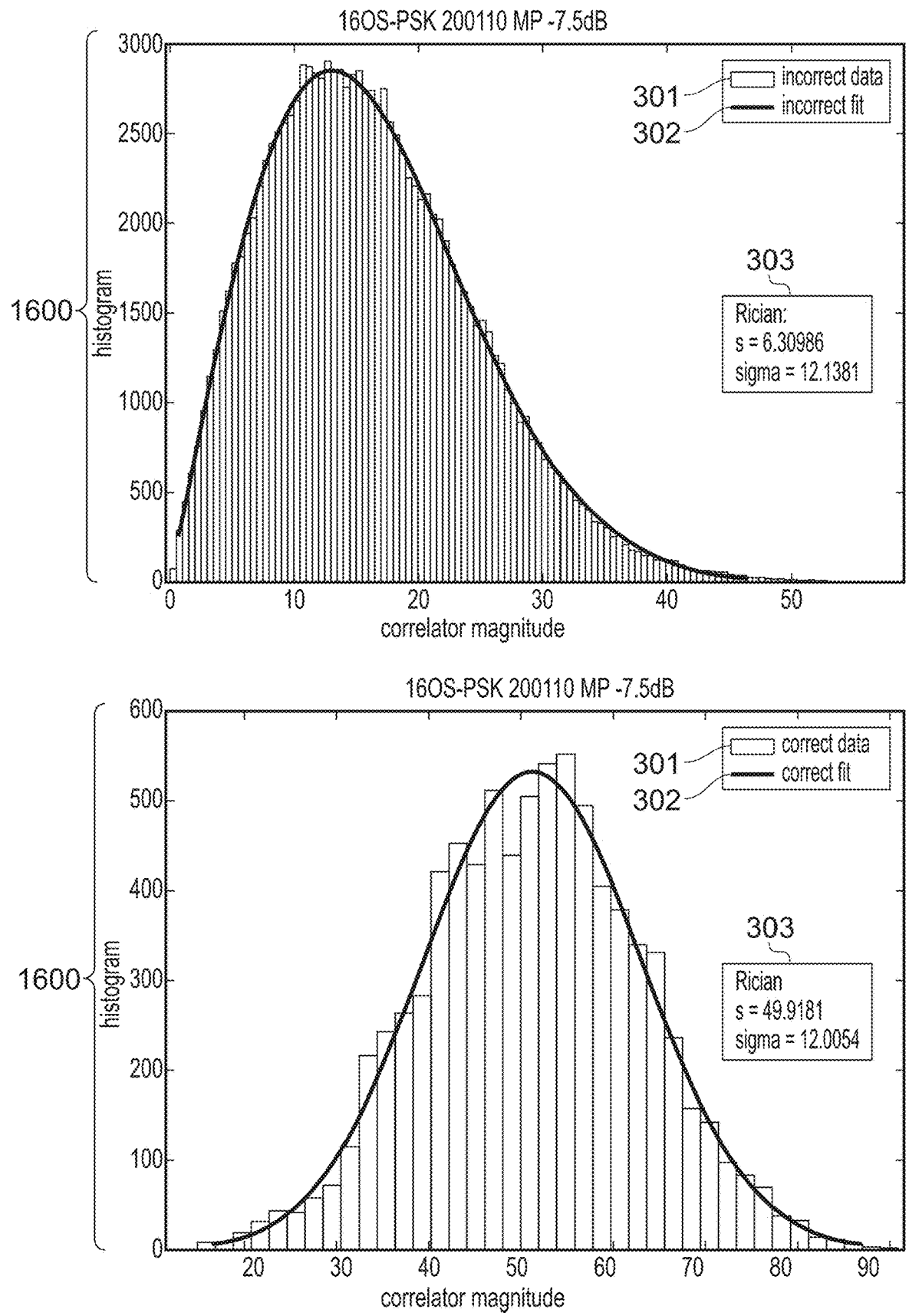
FIG. 16 illustrates distributions of correct and incorrect 16OS-QPSK correlator magnitudes for the MP_-7.5 dB dataset.
Figure 21A:
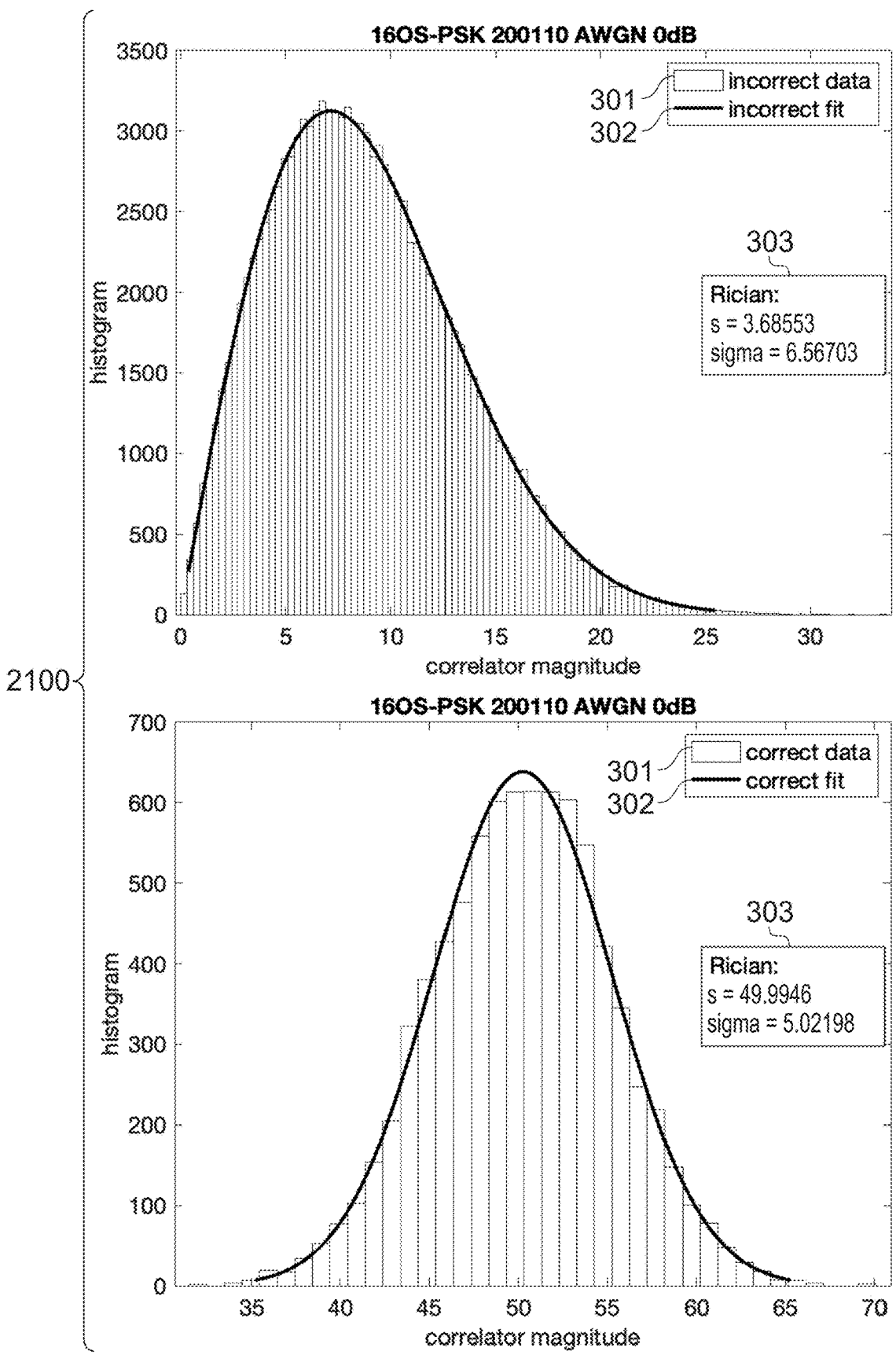
FIG. 21A, FIG. 21B and FIG. 21C illustrate the magnitude distributions of the 16OS-PSK-scheme correlator outputs for the AWGN channel.
Figure 21B:
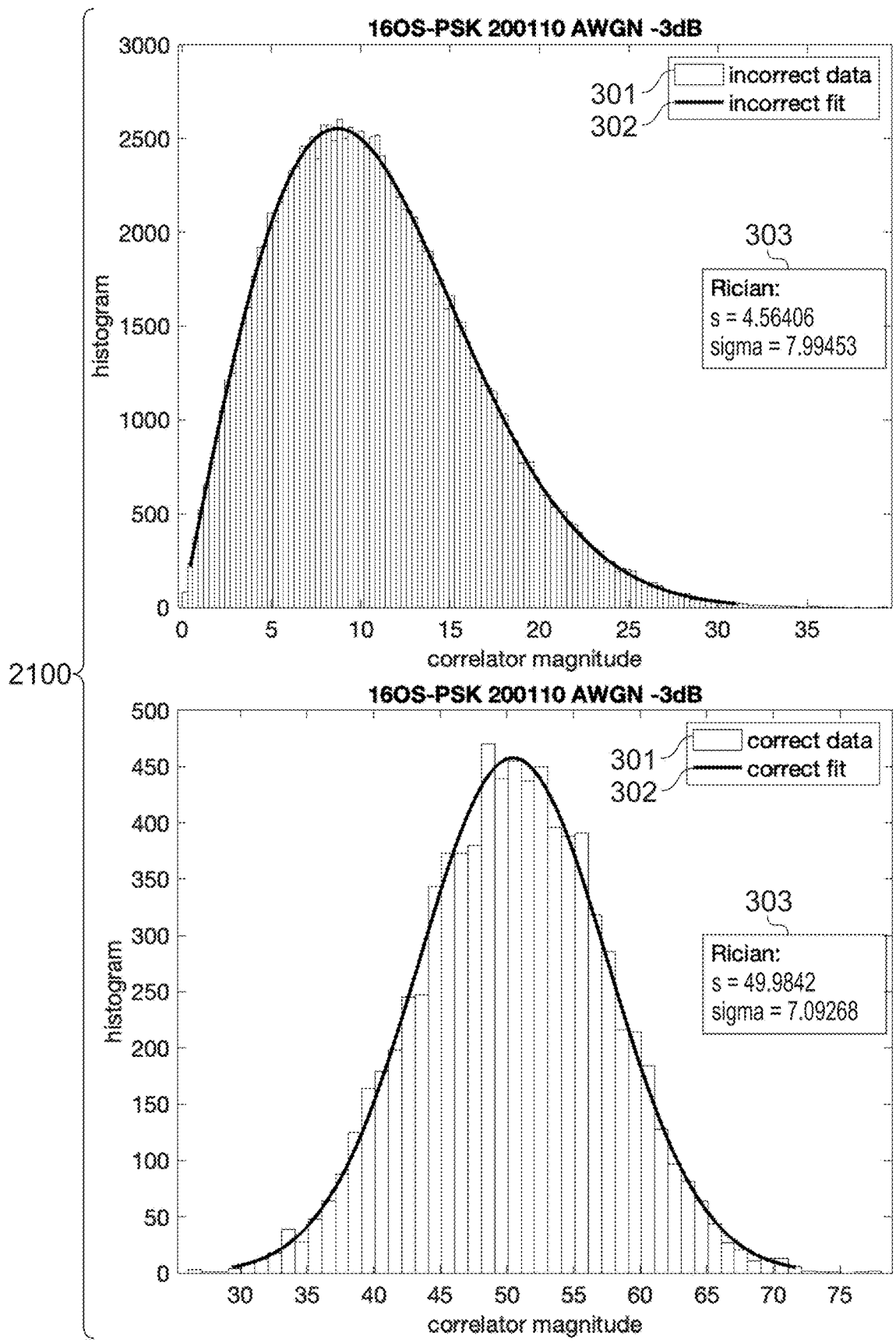
Figure 21C:
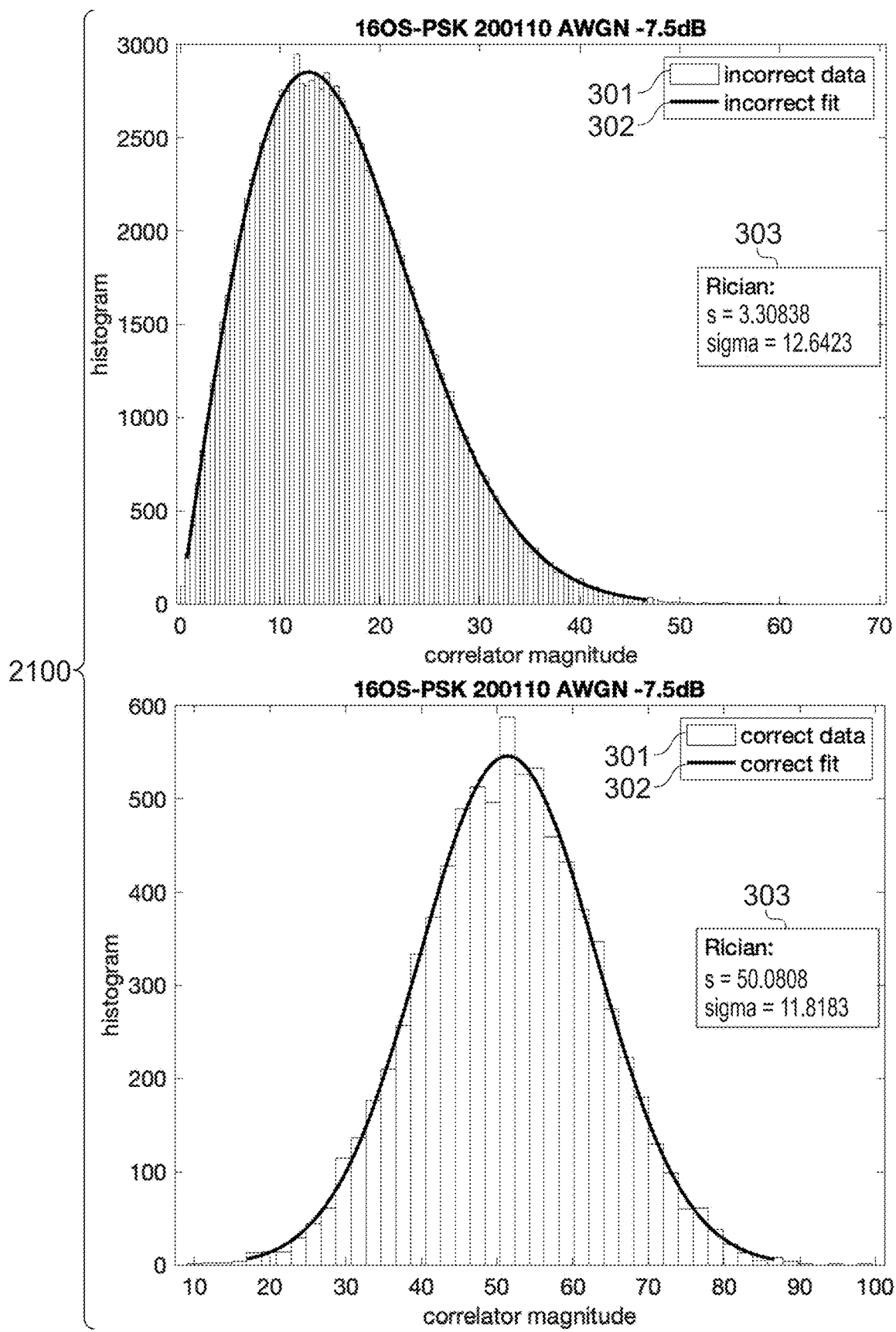
Figure 22A:
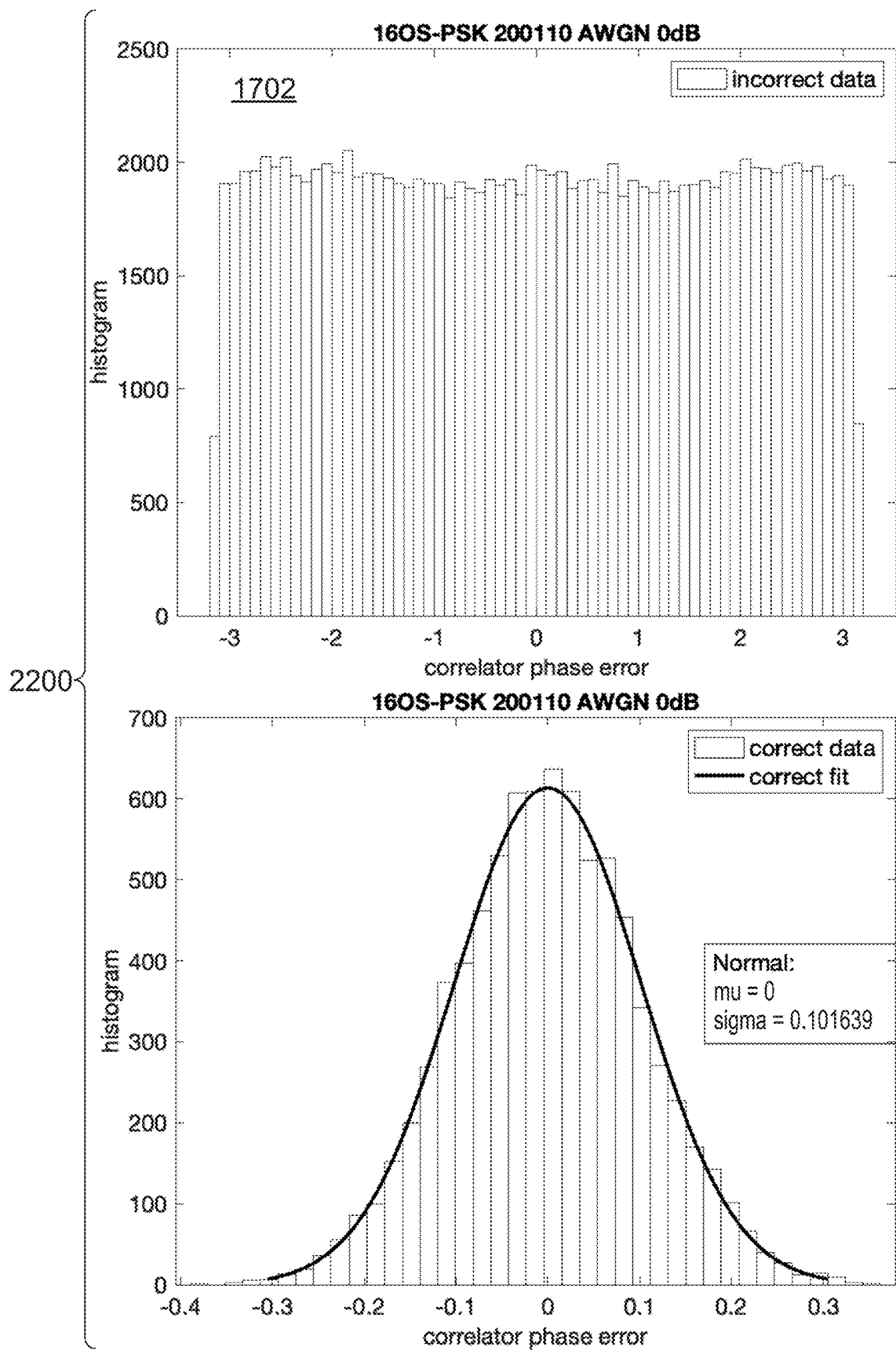
FIG. 22A, FIG. 22B and FIG. 22C illustrate the phase error distributions of the 16OS-PSK-scheme correlator outputs for the AWGN channel.
Figure 22B:
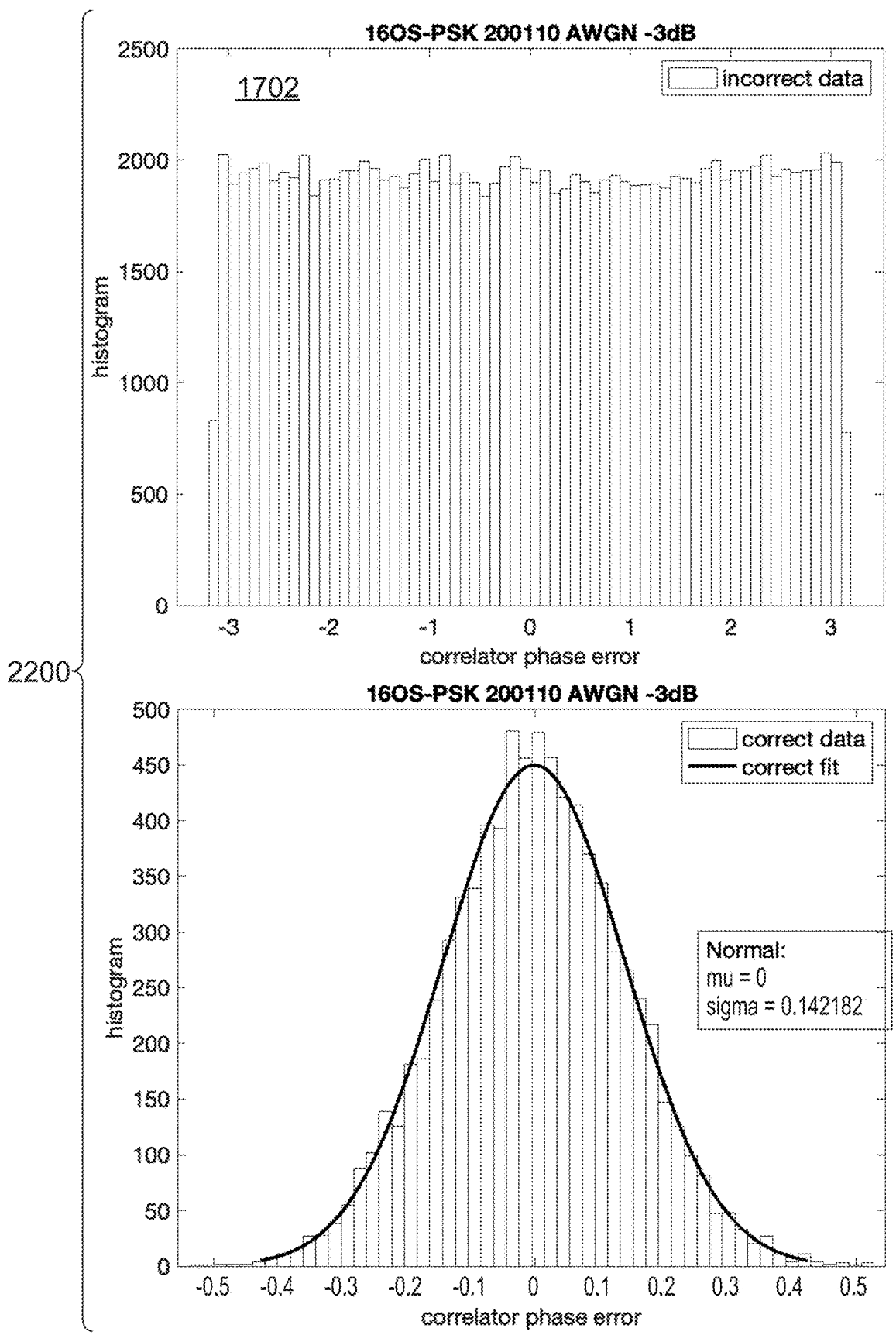
Figure 22C:
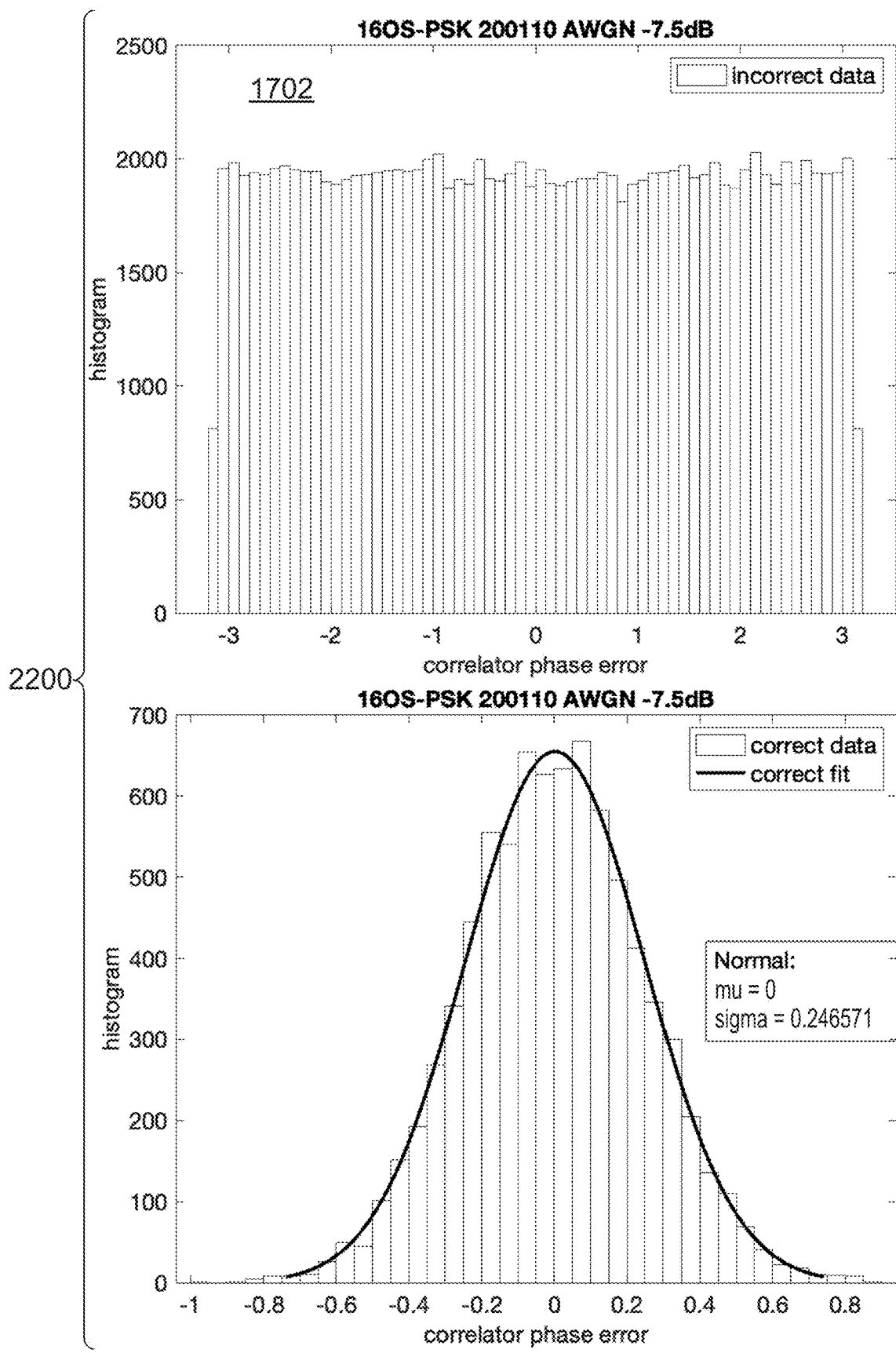
Figure 23A:
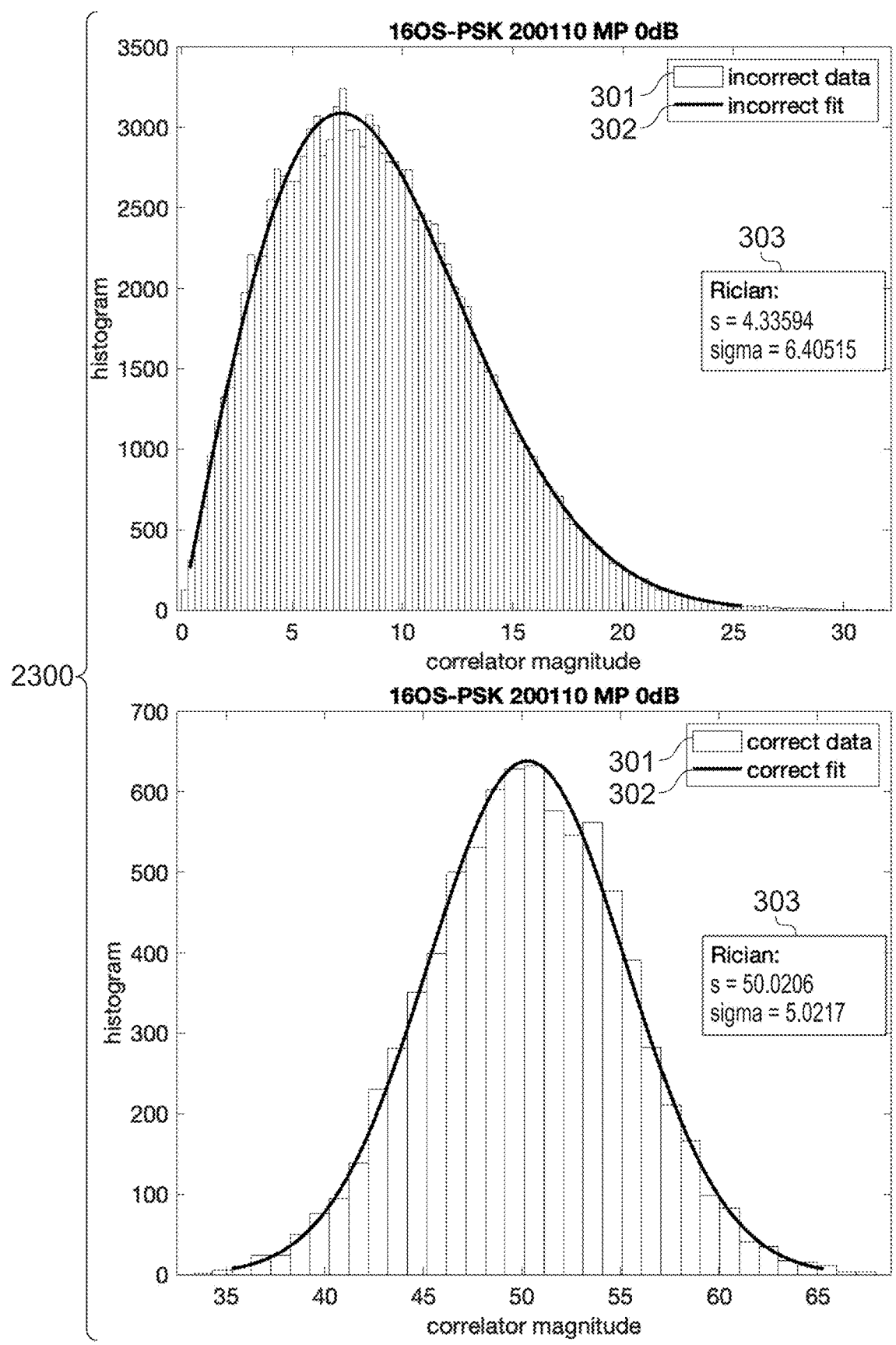
FIG. 23A, FIG. 23B and FIG. 23C illustrate the magnitude distributions of the 16OS-PSK-scheme correlator outputs for the Multipath channel.
Figure 23B:
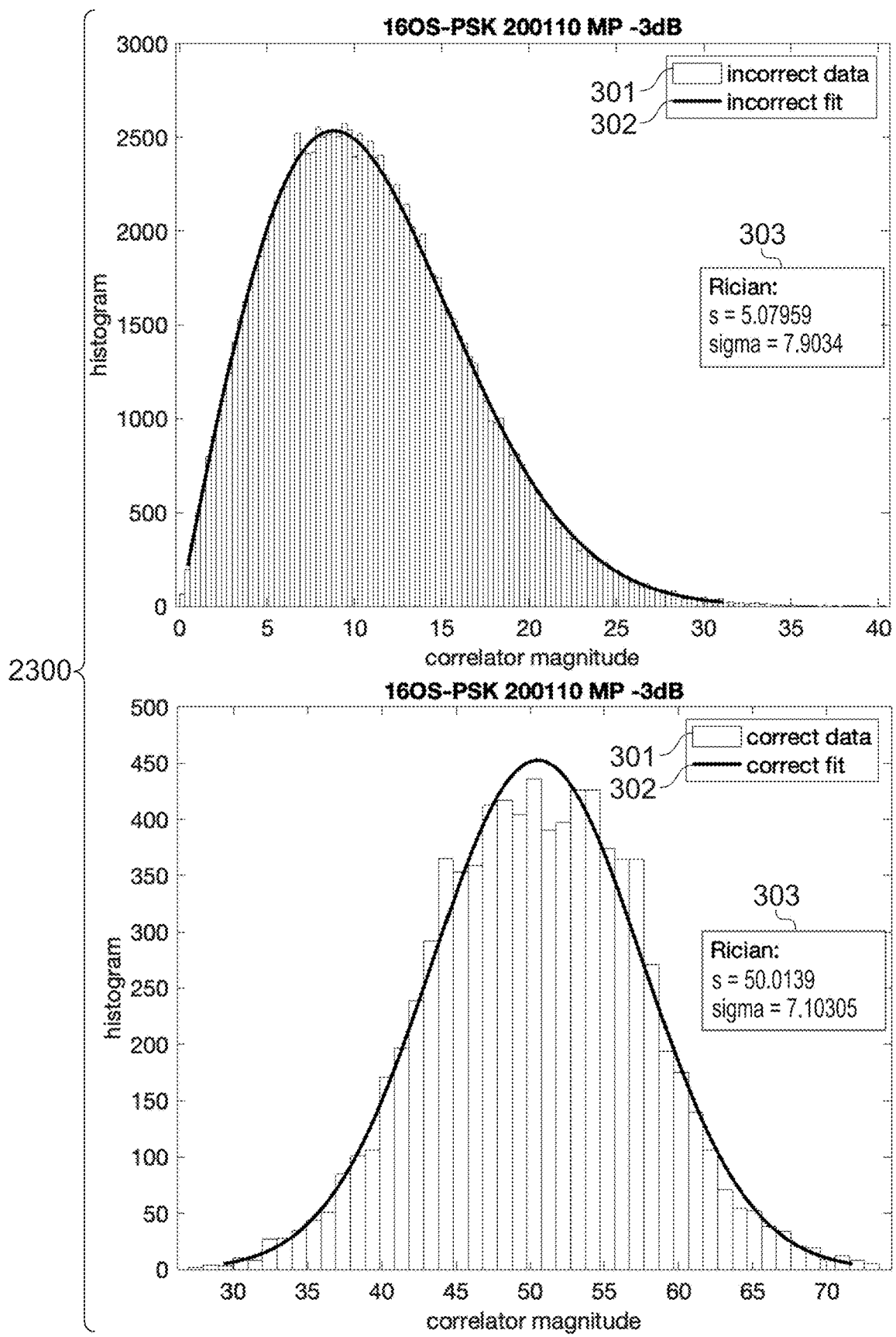
Figure 23C:
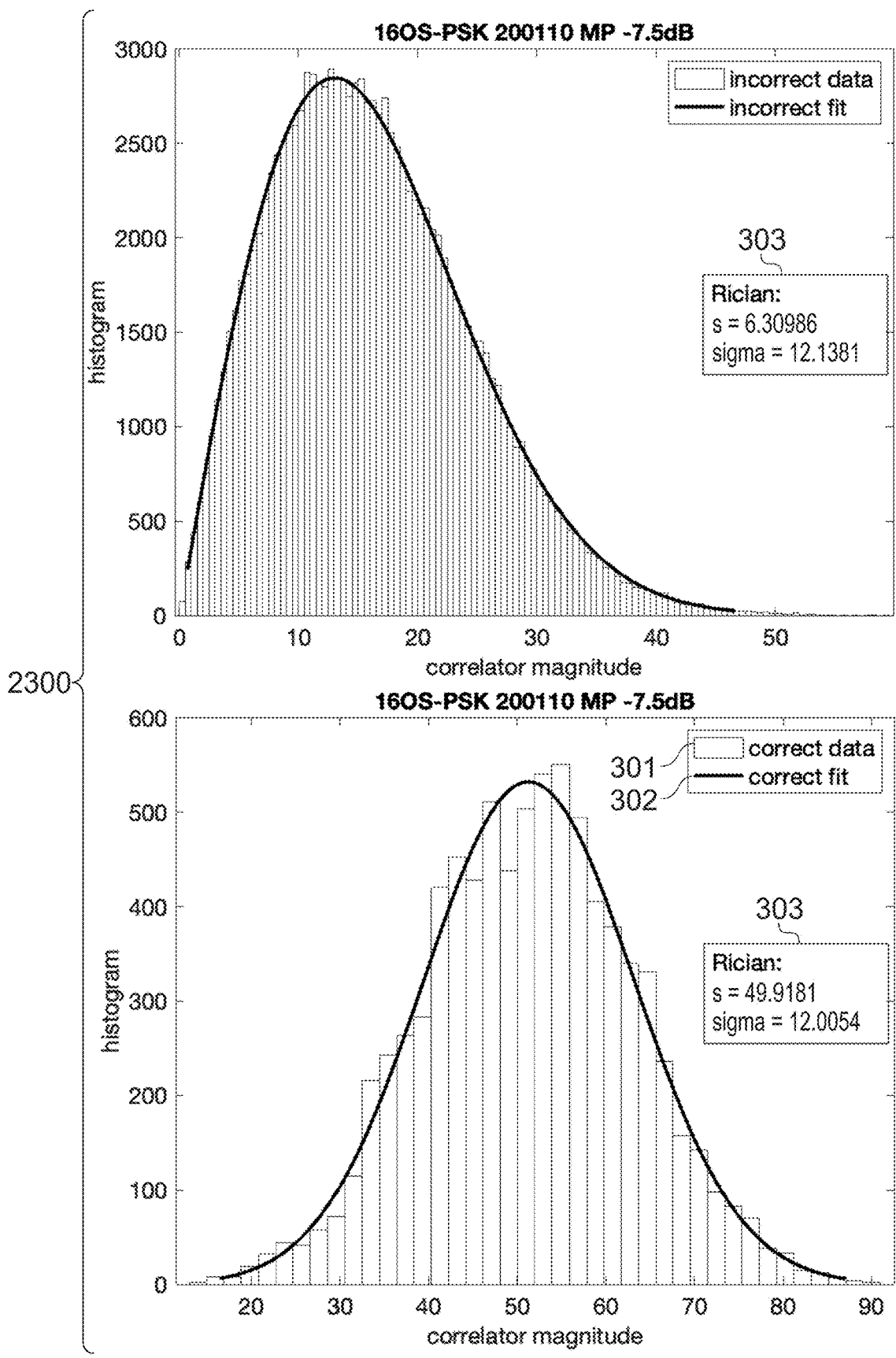
Figure 24A:
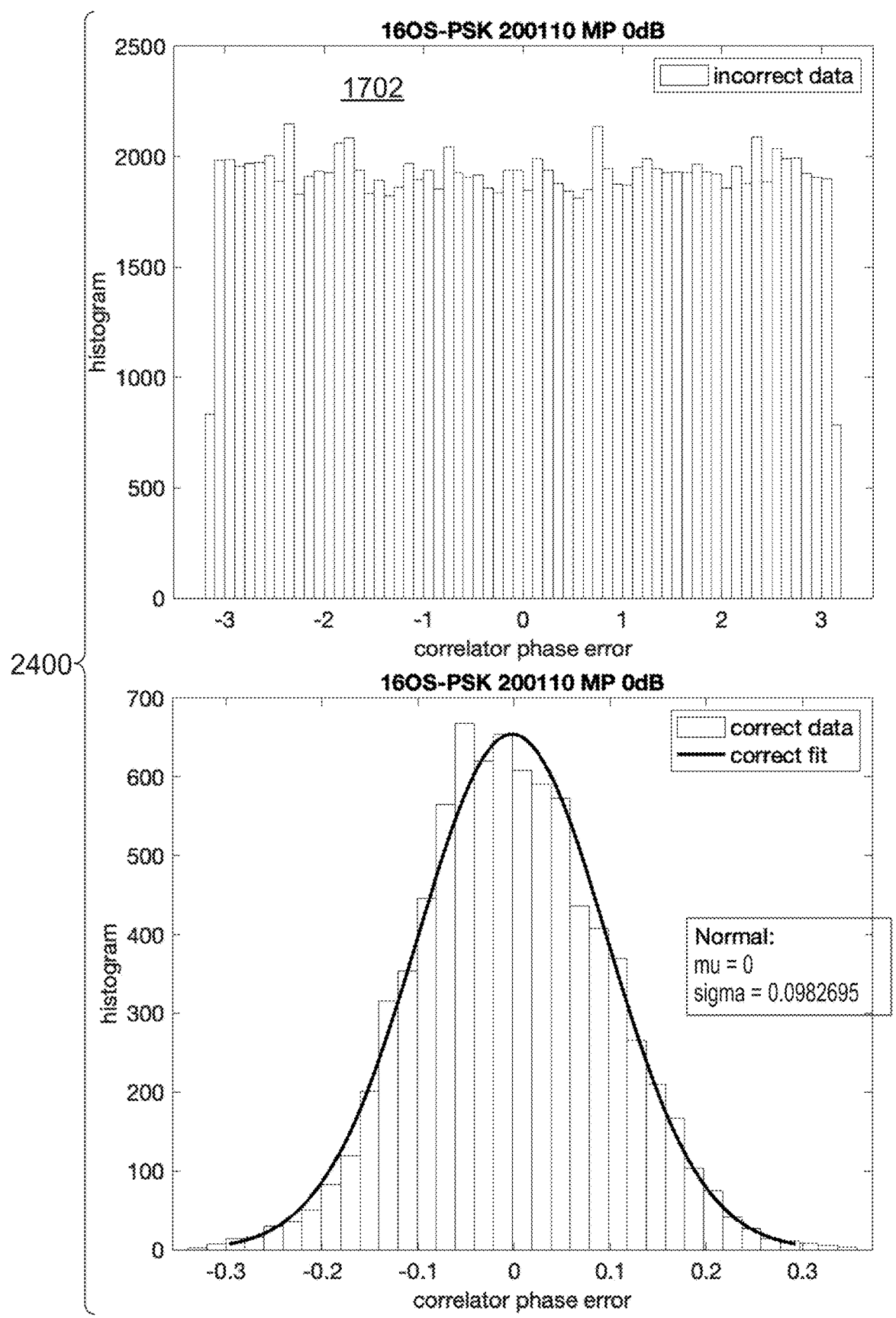
FIG. 24A, FIG. 24B and FIG. 24C illustrate the phase error distributions of the 16OS-PSK-scheme correlator outputs for the Multipath channel.
Figure 24B:
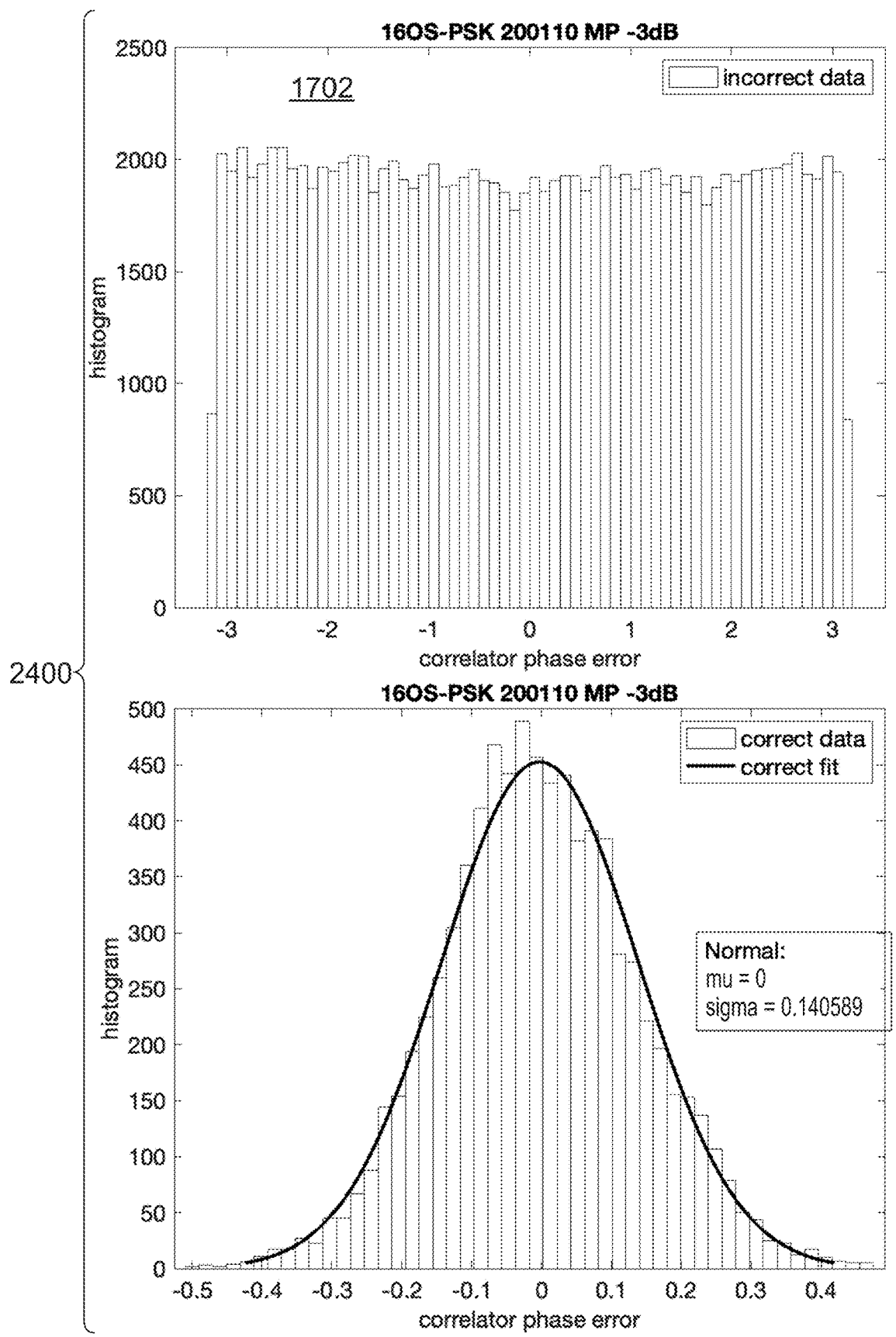
Figure 24C:
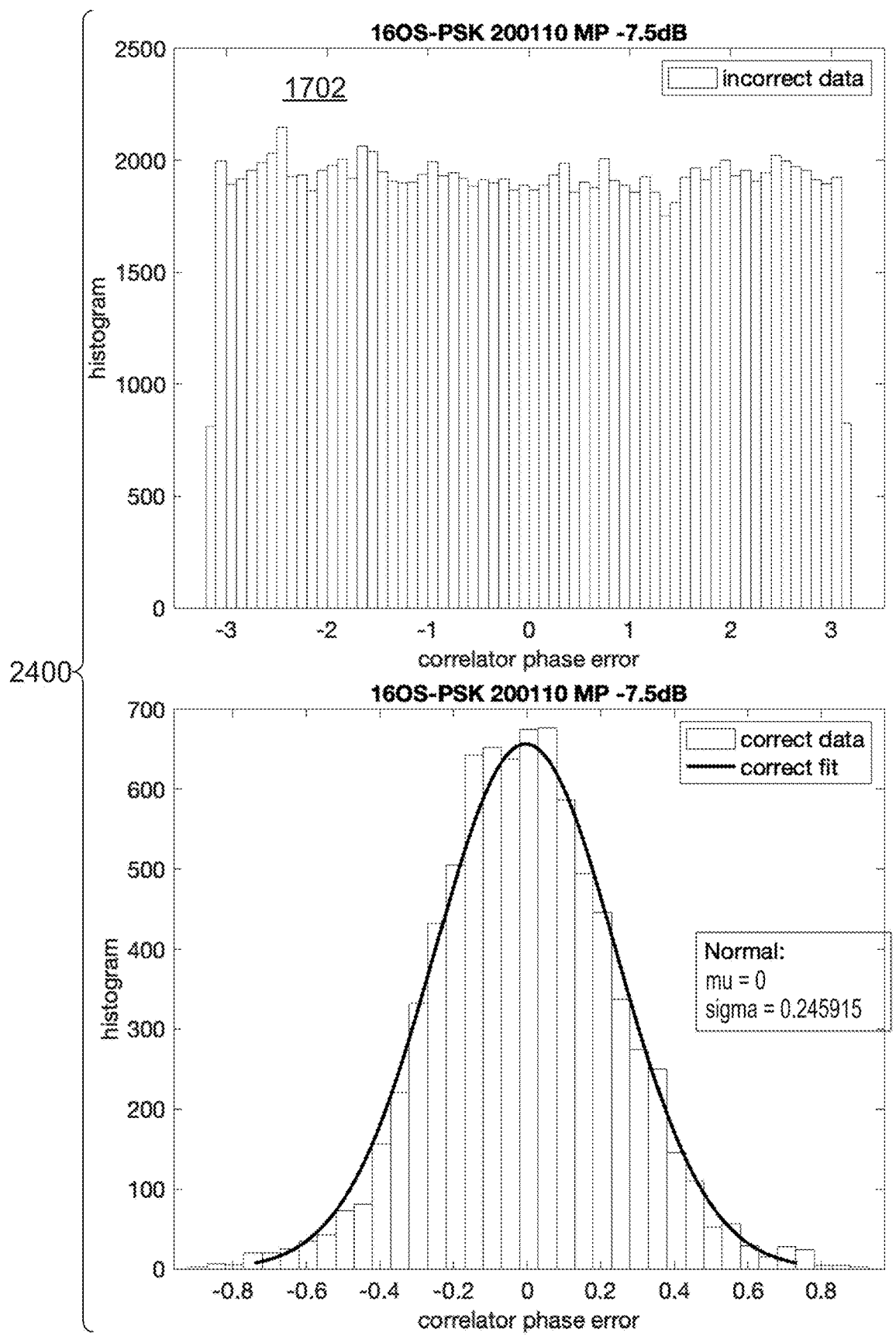
Figure 25A:
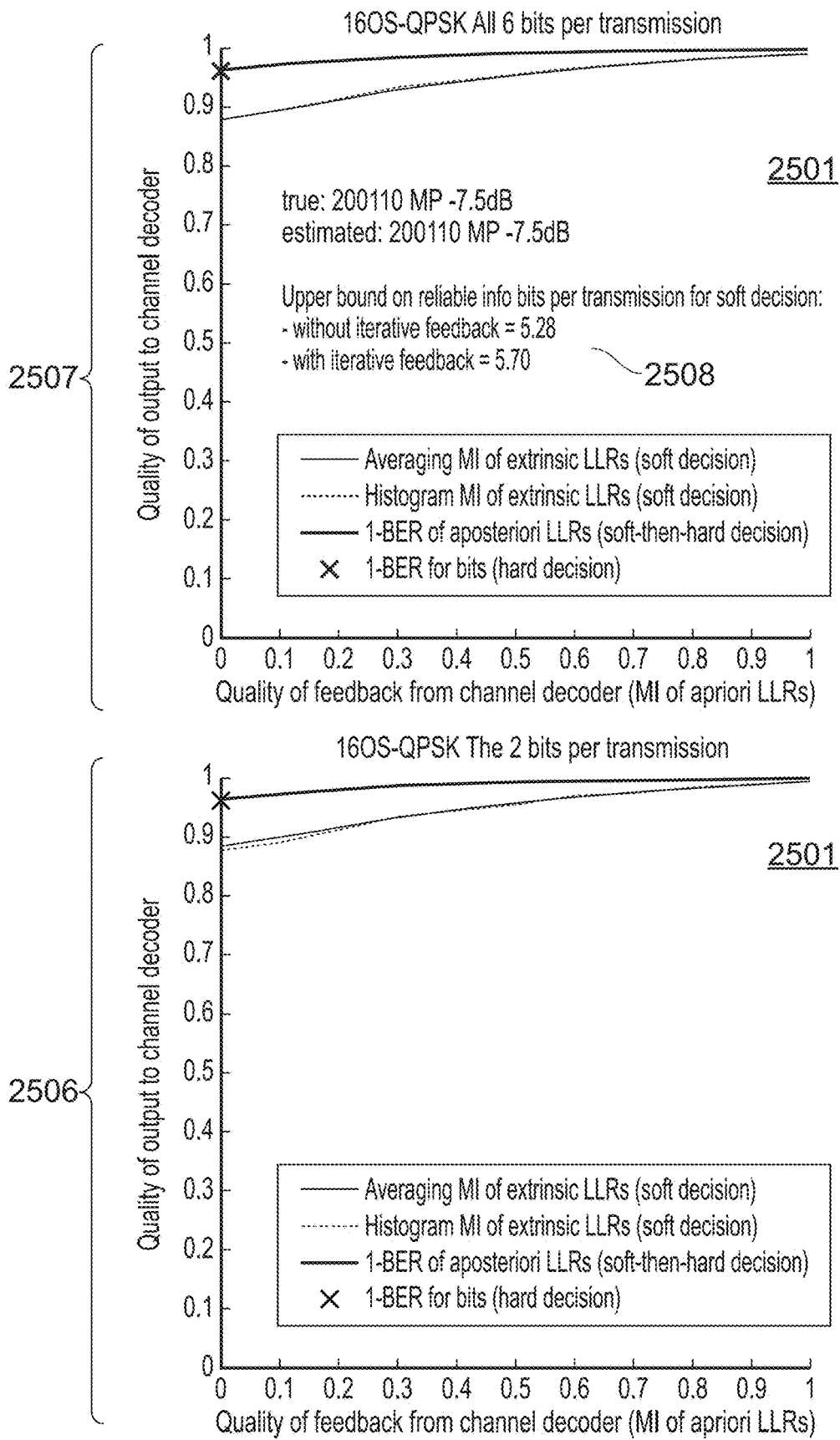
FIG. 25A, FIG. 25B, FIG. 25C, FIG. 25D, FIG. 25E and FIG. 25F illustrate the EXIT charts of the OS-PSK scheme for the Multipath channel.
Figure 25B:
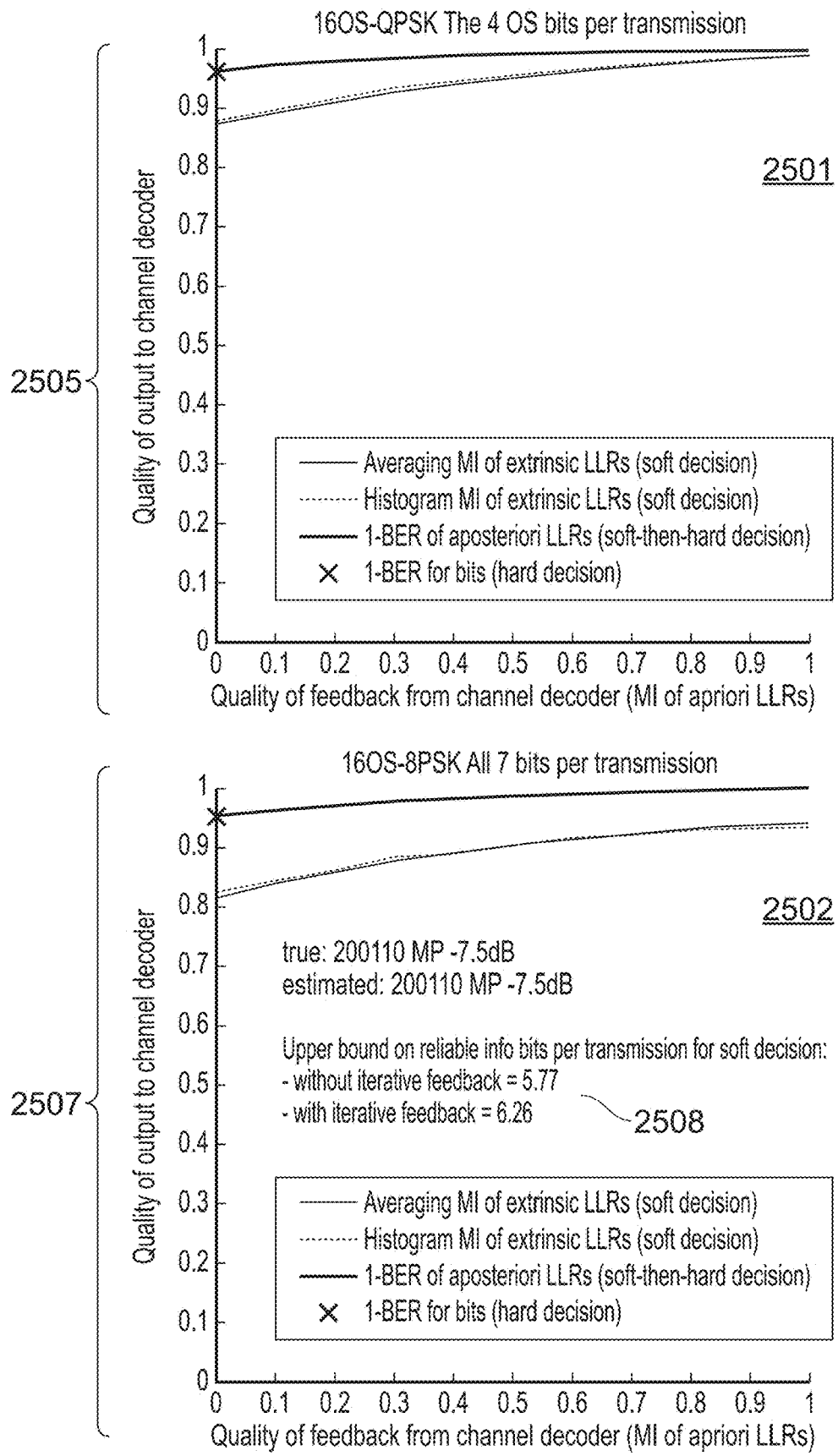
Figure 25C:
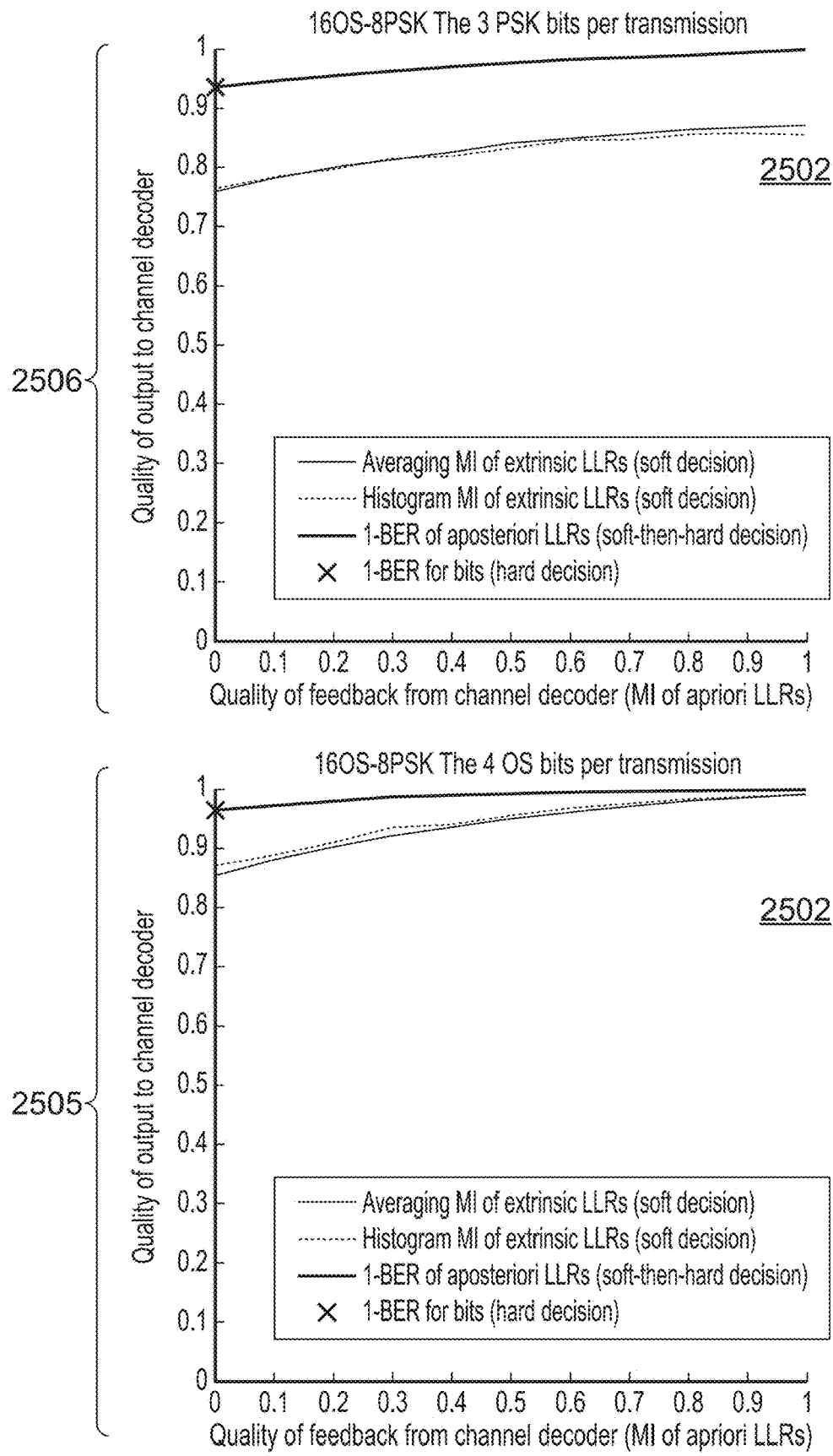
Figure 25D:
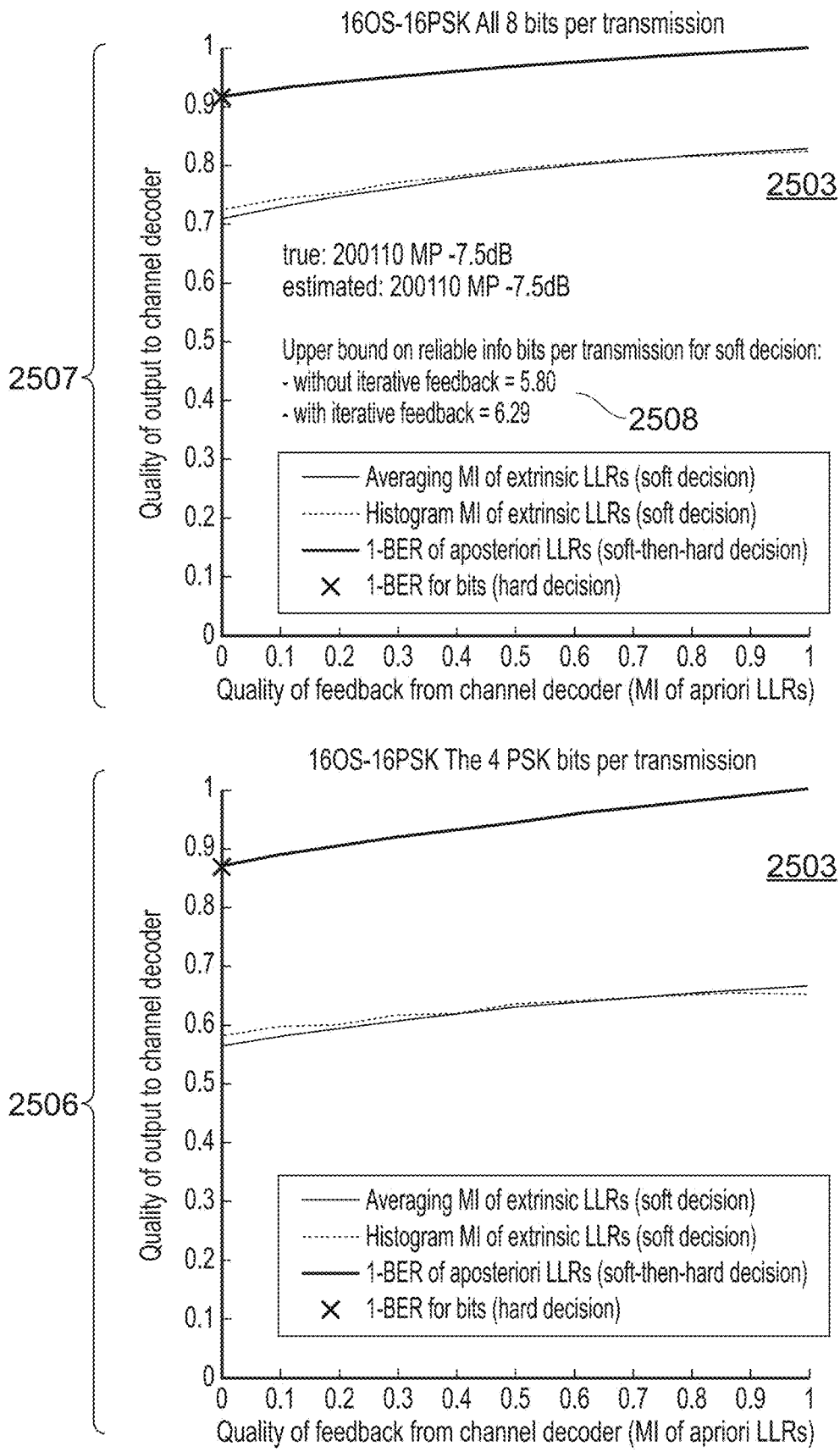
Figure 25E:
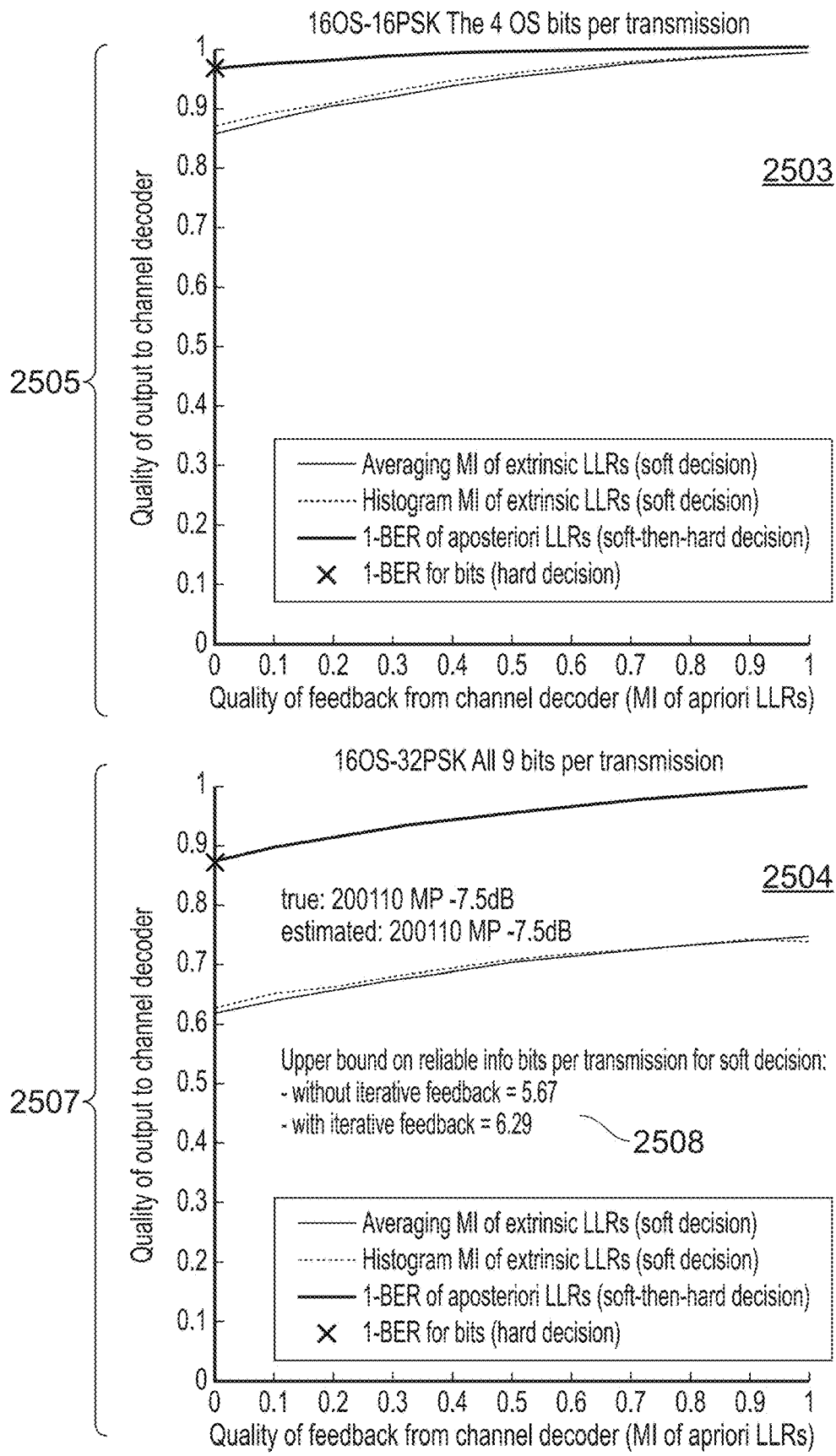
Figure 25F:
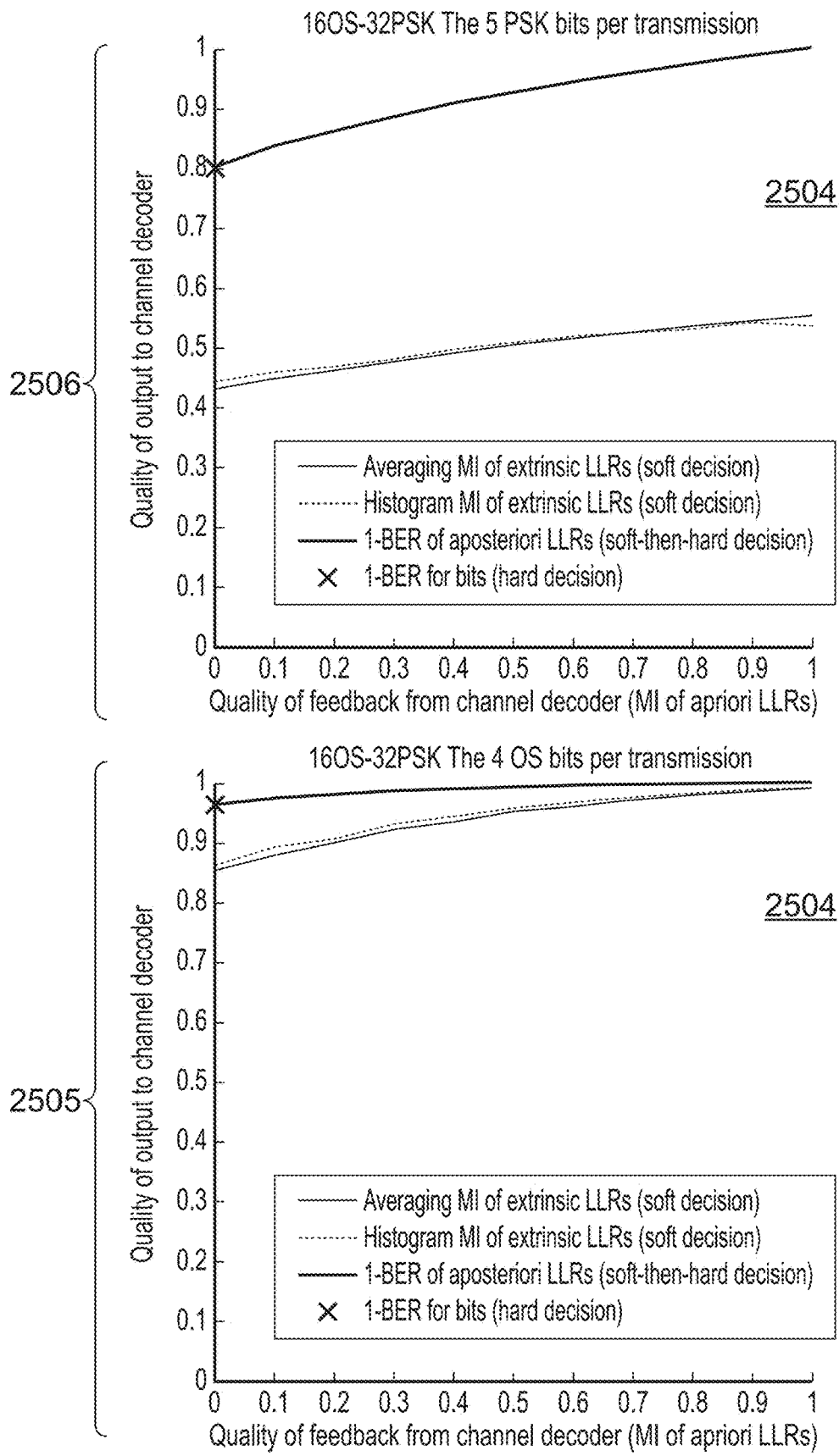

Similar to the work in the earlier section that investigated the data from an OS-only model, the distributions of the correct and incorrect correlator output magnitudes for the OS-PSK scheme can be aggregated into two distributions, as the first and the second aggregated correlator output magnitude distributions, respectively. The parameters 1520 used to represent each of the two aggregated distributions may also be referred to as the first set of distribution parameters. As before, the Rician distribution may be identified as the single distribution which fits best to each of both the correct and incorrect sets of correlator output magnitudes. The distributions of correct and incorrect correlator output magnitudes, as described previously, are shown in FIG. 21A, FIG. 21B, FIG. 21C at 2100 and FIG. 23A, FIG. 23B, FIG. 23C at 2300, for both the AWGN and the MP channel datasets, and an example 1600 is provided in FIG. 16 for the MP_-7.5 dB dataset. Comparing these distributions with those of FIG. 5A, FIG. 5B, and FIG. 5C and FIG. 6A, FIG. 6B, and FIG. 6C discussed earlier for the OS-only scheme shows that the data are distributed very similarly between the OS-PSK (this section) and the OS-only (earlier section) models. This is demonstrated through the Rician distribution's non-centrality parameter (s) and scale parameter (a), which have similar values of parameters 303 of FIG. 3 for all SNR values between the two models and for the first set of distribution parameters.

In summary, as explained previously, methods for estimating the parameters of the first and second aggregated correlator output magnitude distributions have been described, wherein one of the following is employed:

(i) the first set of distribution parameters of the first aggregated correlator output magnitude distribution are estimated (as in step 4507 of FIG. 36A) by fitting a first probability distribution to the magnitudes of correlator outputs obtained by correlating received synchronisation signals with known synchronisation signals;

(ii) the first set of distribution parameters of the second aggregated correlator output magnitude distribution are estimated (as in step 4507 of FIG. 36A) by fitting a second probability distribution to the magnitudes of correlator outputs obtained by correlating received synchronisation signals with signals other than the known synchronisation signal;

(iii) the first set of distribution parameters of the first aggregated correlator output magnitude distribution are estimated (as in step 4508 of FIG. 36A) by fitting a third probability distribution to the magnitudes of correlator outputs having the greatest magnitude among sets of 2k correlator outputs obtained by the bank of 2k correlators;

(iv) the first set of distribution parameters of the second aggregated correlator output magnitude distribution are estimated (as in step 4508 of FIG. 36A) by fitting a fourth probability distribution to the magnitudes of the 2k−1 correlator outputs that do not have the greatest magnitude among sets of 2k correlator outputs obtained by the bank of 2k correlators; or (v) the first set of distribution parameters of the first and second aggregated correlator output magnitude distributions are selected (as in step 4505 of FIG. 36A) from, say, a look-up-table 1527.

In other examples, it may also be demonstrated that the first, second, third or fourth probability distributions may be represented using the Rician distribution.

Correlator Output Phases: PSK Modulated
Phase Error Values

Figure 17:
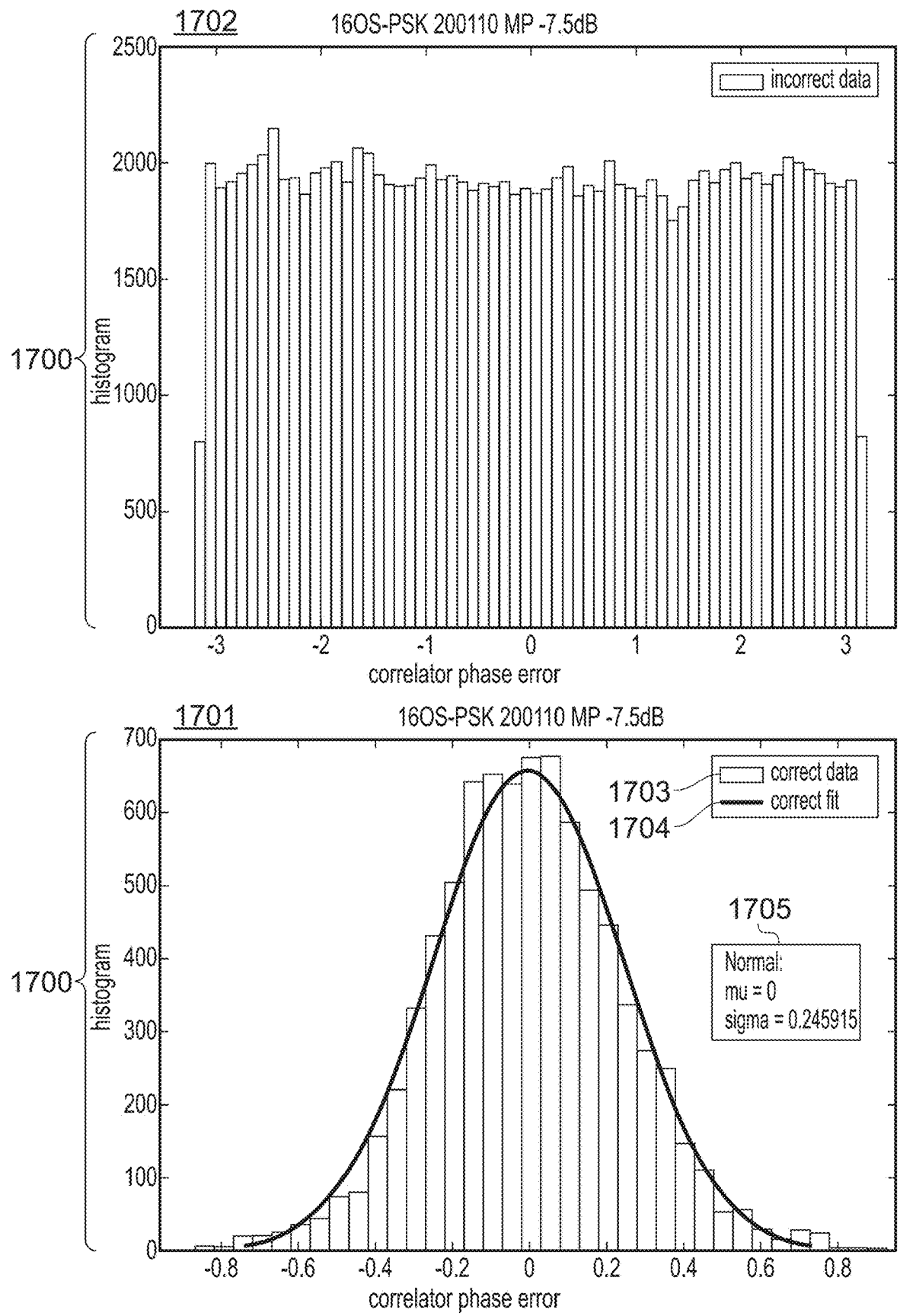
FIG. 17 illustrates distributions of correct and incorrect 16OS-QPSK correlator phase errors for the MP_-7.5 dB dataset.

The aggregated distributions of the correlator output phase values are shown in FIG. 22A-FIG. 22C and FIG. 24A-FIG. 24C for the AWGN 2200 and Multipath 2400 channels, and for the correct and incorrect sets of I-Q pairs. The data in these figures are represented in terms of the phase errors: for every row in a dataset (like FIG. 31A and FIG. 31B), the 'true' phase of the transmitted message (defined by the Qm=2 MS bits of the message) is subtracted from the phase of each correlator I-Q pair as the 'received' phases, producing received phase errors. Following this, in some examples, the phase error of the 'correct' correlator output was extracted from each row of the dataset to obtain the set of 'correct' phase errors, while the remaining M−1=15 phase errors from each row were pooled into the set of 'incorrect' phase errors. FIG. 17 provides histograms and fitted distributions 1700 of the correct phase errors 1701 and incorrect phase errors 1702 for the MP_-7.5 dB dataset.

Fitting Distribution to Phase Errors

The parameters of the aggregated correct correlator output phase error distribution may be referred to as the second set of distribution parameters. The correct phase errors 1701, 1703 were best fitted 1704 to normal distributions that were constrained to have mean values of zero. This constraint was achieved by fitting the absolute values of the correct phase errors to half-normal distributions, so that the distributions are characterised by just a single spreading parameter $\sigma_{phase}$ 1705. This is shown in FIG. 15B where the $\sigma_{phase}$ parameter 1523 of the correct phase error distributions is sent to the Convert to PSK symbol LLRs circuit 1501. The incorrect phase errors 1702, as shown in FIG. 22A-FIG. 22C and FIG. 24A-FIG. 24C all have uniform distributions. This means that the incorrect phases contain no information and do not need to be characterised by any distribution parameters.

According to above, only the correct phase errors 1703, and not the incorrect phase errors 1702, will convey information from the correlation data. Hence, the distribution of all the correct correlator output phase error values may be referred to as the aggregated correlator output phase distribution. In this name, the term 'correct' is explicitly excluded, even though the distribution is built from the correct set of phase error values. This maintains a generic definition of the aggregated correlator output phase distribution. As before, the correct phase error is provided by the correlator for which the corresponding one of the $2^k$ possible signals was selected as the transmission signal.

In summary, an approach has been proposed, wherein the plurality of aggregated correlator output phase distributions is one, and the aggregated correlator output phase distribution approximates the aggregation of the $2^k$ distributions of the output phases of the $2^k$ correlators when the corresponding one of the $2^k$ possible signals was selected as the transmission signal. An approach has also been proposed wherein the aggregated correlator output phase distribution is represented by a second set of distribution parameters and wherein the second set of distribution parameters comprises a spreading parameter $\sigma_{phase}$.

Estimation Methods

The above analysis assumes a testbench environment, in which prior knowledge of the true values of the transmitted bits 1508 and PSK encoded bits 1509 is available. In practical receivers, however, this knowledge will not be available and the distribution parameter $\sigma_{phase}$ 1523 must be estimated in its absence. To obtain the distribution of correlator output phases, online (as in step 4524 of FIG. 36A) or offline (as in step 4523 of FIG. 36A) approaches are proposed. In the example proposed online approaches, a Data Analyser circuit 1524 is responsible for analysing the correlator outputs 1525 from the demodulator 1519 received at run-time, finding the best distribution to fit to the data, and calculating parameters 1526 of the distributions, with the benefits from real-time tuning of distribution parameters. This is shown in FIG. 15B with the Data Analyser circuit 1524 and is detailed below. But first, some offline approaches are discussed, which use the library look up table 1527 of correlator distributions shown in FIG. 15B.

Offline Estimation Approaches

Figure 36A:
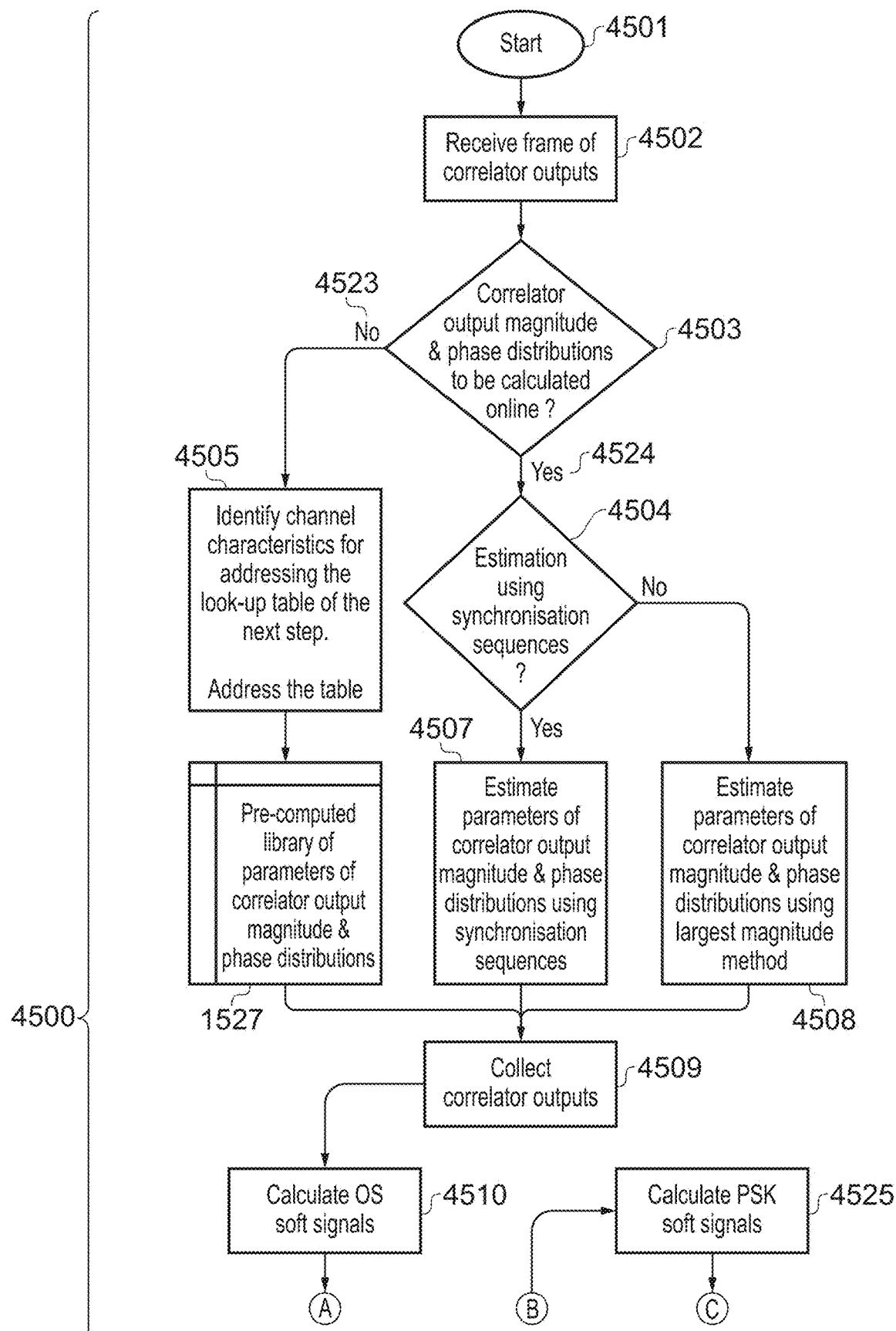
FIG. 36A and FIG. 36B illustrate a flowchart of a soft demapping algorithm for an OS-PSK scheme, according to some example embodiments of the invention.
Figure 36B:
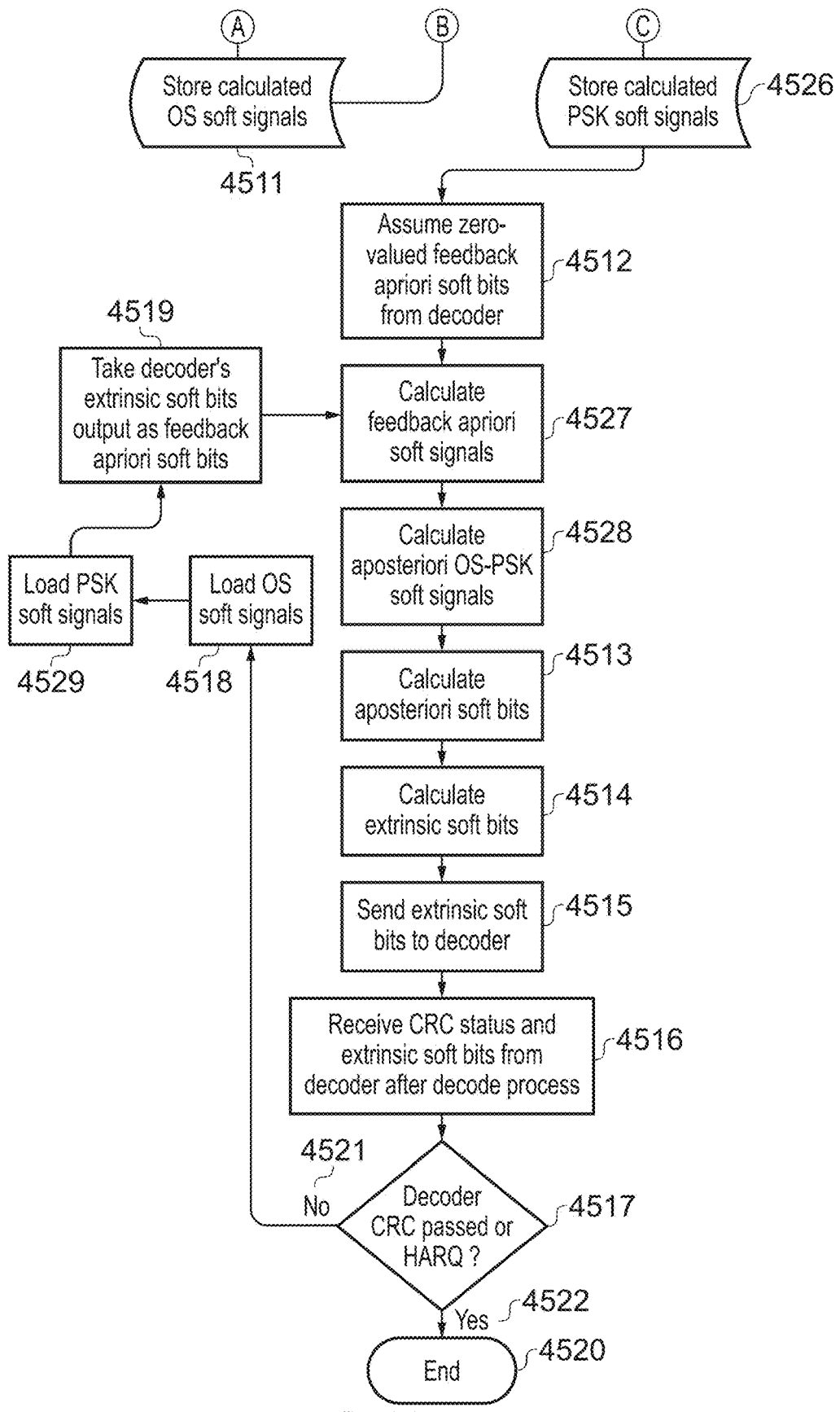

As described earlier for the OS-only scheme, in an offline approach, the correlator distributions may be calculated offline in order to build a library look up table 1527 of distributions on all applicable modulation-channel combinations. For example, the datasets mentioned earlier can be used as models for different channel conditions and modulation schemes. A configuration-time switch 1528, as demonstrated in FIG. 15B, can be configured to choose (as in step 4505 of FIG. 36A) the right set of data based on the system's modulation scheme and channel type. This could be performed as an extension of any other channel estimation tasks performed by the demodulator 1519. For example, the outputs of these channel estimation tasks could be used to index (as in step 4505 of FIG. 36A) a look-up table 1527 of pre-computed correlator output distributions. More specifically, an offline estimation of correlator distributions may be used to record correlator outputs for several channel conditions and used to build a look-up table of those distributions. Then, during actual data transmissions a channel estimation task identifies (as in step 4505 of FIG. 36A) the current state of the channel and chooses the corresponding distribution from the look-up table 1527, as shown in FIG. 36A.

Another offline approach option would be to use a single set of correlator distributions in all cases, irrespective of the varying channel conditions. This single set of correlator distributions could be recorded during a worst-case scenario, perhaps at the lowest SNR where reliable synchronisation can be achieved. When the channel conditions match this worst-case scenario, the use of the corresponding correlator distributions will ensure the best possible performance. When the channel conditions are better than this worst-case scenario, the chance of decoding success can be expected to increase, even though the assumed correlator distributions are pessimistic compared to the true distributions.

Online Estimation Approaches

Other than using datasets to estimate the distributions offline, two online approaches 4507, 4508 are also proposed which calculate the distribution parameters in the early stages of a real data transmission, such as when a channel estimation task is in progress. The first online approach of step 4507 in FIG. 36A is through correlating received synchronisation signals with known synchronisation signals. Using this first online approach of step 4507, as the receiver chain 1510 is aware of the true symbol phases, it can associate every set of M=16 correlator outputs 1525 of a transmission to its correct phase. This first online approach of step 4507 may be referred to as correlator distribution estimation using synchronisation sequences. Following distribution aggregation in the Data Analyser circuit 1524, a distribution fitting approach (like the histfit function of Matlab) may be used to estimate (as in step 4507 of FIG. 36A) the $\sigma_{phase}$ parameter 1523 for the aggregated distribution. The correlator distribution estimation using synchronisation sequences has the advantage of being operated online, but also has its own disadvantages. One disadvantage is that synchronisation sequences, unless embedded in time-consuming channel estimations, are usually short sequences. Therefore, they do not always provide sufficient samples to obtain accurate distributions, which may lower the quality of symbol LLRs 1529 calculated using those distribution parameters. Aiming for sufficient accuracy requires long sequences, and that adds a time overhead to the channel estimation phase and increases power and bandwidth consumption.

The other approach in estimating distribution parameters, that is described earlier for the OS-only scheme, is the online approach of step 4508 of FIG. 36A, which considers the largest-magnitude correlator output. The online approach of step 4508 divides the correlator outputs 1525 into two groups of a) largest magnitude correlator outputs (each largest magnitude would be amongst M outputs of the same received message), and b) non-largest magnitude correlator outputs (M−1 outputs with non-largest magnitudes of the same received message, and for several transmission/messages). In the online approach of step 4508, it is assumed that any largest-magnitude correlator output, amongst the M correlator outputs 1525, corresponds to its transmitted sequence 1518 from the transmitter chain 1503. Based on this assumption, the phases of the largest-magnitude correlator outputs should also correspond to the phase value of the transmitted sequences 1518, and hence each should be representative of the $Q_m$ number of PSK encoded bits 1509 in the message. Therefore, like the offline estimation approach of step 4523 where the incorrect phase error values 1702 of the incorrect correlator outputs followed a uniform distribution, the phase error values of the non-largest-magnitude correlator outputs are expected to have a uniform distribution too. Consequently, the valuable distribution(s) in the largest-magnitude of step 4508 will be of the phase error values of the largest-magnitude correlator outputs. These values form the aggregated correlator output phase distribution, as mentioned earlier, but this time for the largest-magnitude of step 4508. The calculation of the phase errors in the largest-magnitude of step 4508 is the same as that described earlier, except that the 'true' phase value (which was known in other approaches), is assumed to be the one phase in the phase mapping that is closest to the phase of the largest-magnitude correlator output. More explicitly, the phase error may be estimated as the difference between the phase of the largest-magnitude correlator output and the phase mapping that is closest to this.

Note that the largest-magnitude correlator distribution estimation approach of step 4508 could be further refined by completing a first estimation of the $\sigma_{phase}$ parameter 1523 then using these to calculate LLRs, as described later with respect to a soft-demapper circuit, before they are provided to a channel decoder 912. The channel decoder 912 can then attempt to remove any errors in the LLR sequence and use a Cyclic Redundancy Check (CRC) decoder 911 to determine if it has been successful. If it has not been successful, then the channel decoder can provide feedback LLRs to the Data Analyser circuit 1524 of FIG. 15B. These LLRs can then be considered and may cause the classification of the correlator outputs between the largest-magnitude and not-largest-magnitude groups to be overridden. More specifically, a correlator output having the largest magnitude for a particular transmission may be swapped for another that does not have the largest magnitude, when forming the largest-magnitude group, if the feedback LLRs provide sufficiently-strong suggestion that the magnitudes do not reflect the correct transmission.

A definition for the aggregated correlator output phase distribution is now provided, which applies to all the estimation approaches as described above. The aggregated correlator output phase distribution approximates the aggregation of the M distributions of the output phases of the M correlators when the corresponding one of the M possible signals was selected as the transmission signal. The aggregated correlator output phase distribution is represented by the second set of distribution parameters.

Summary

In summary, methods for estimating the parameters of the aggregated correlator output phase distribution have been proposed, wherein one of the following is employed:
the second set of distribution parameters of the aggregated correlator output phase distribution is estimated (as in step 4507 of FIG. 36A)) by fitting a fifth probability distribution to the phase errors of correlator outputs obtained by correlating received synchronisation signals with known synchronisation signals;
the second set of distribution parameters of the aggregated correlator output phase distribution is estimated (as in step 4508 of FIG. 36A)) by fitting a sixth probability distribution to the phase errors of correlator outputs having the greatest magnitude among sets of 2k correlator outputs obtained by the bank of 2k correlators; or
the second set of distribution parameters of the aggregated correlator output phase distribution is selected (as in step 4505 of FIG. 36A)) from a look-up-table 1527.

It has also been demonstrated that the fifth or sixth probability distributions may be represented using the Gaussian distribution.

In the following example embodiment, the soft demapping circuit 1522 uses the phases 1530 of the M=16 correlator I-Q pairs to obtain the logarithmic-likelihood ratio (LLR) representation of the possible phase values.

Soft Demapper

Like the soft demapper circuit 907 of FIG. 9 and FIG. 10, proposed earlier for the OS-only scheme, in this section every message bit requires an LLR value to feed a soft-decision decoder 912. This means that for a $(k+Q_m)$-bit message, there needs to be $(k+Q_m)$ bit LLRs generated by the soft demapping circuit 1522, and hence for a total of N encoded bits 1505 transmitted there will be N extrinsic bit LLRs 904 that the soft demapping circuit 1522 outputs, as shown in FIG. 15B. Since k=4 OS bits of information (out of a $(k+Q_m)$-bit message) are conveyed through the correlator output magnitudes 1531 (as described earlier), feeding those magnitudes, as the first set of inputs to the soft demapper circuit, to the demapper circuit (Convert to OS LLRs circuit) 113 in FIG. 15B will provide (as in step 4510 of FIG. 36A) M=16 OS symbol LLRs 908, as the first set of apriori soft signals, corresponding to the M=16 correlator outputs 1525. Also, as in the OS-only scheme discussed earlier, a set of OS apriori feedback bit LLRs 910 is fed back from the decoder 912 into the soft demapping circuit 1522 as the second set of inputs to the soft demapper circuit 1522, wherein those feedback bit LLRs 910 may be referred to as the second set of apriori soft signals.

In this example embodiment, a soft demapping circuit 1522 is described that can operate in the generalised case of M-OS-PSK using any number of PSK bits per symbol $Q_m$. However, in the following discussions, QPSK with $Q_m=2$ will be used frequently as a specific example, in which case $(k+Q_m)=6$.

Conversion to Bit LLRs

The generation of extrinsic bit LLRs 904 is performed using the Convert to Bit LLRs circuit 1521 (FIG. 15B). In an example embodiment with no feedback from the decoder, as described previously, a Convert to Bit LLRs circuit 906, was introduced that converted M=16 OS symbol LLRs 908 of a 4-bit message to k=4 bit LLRs. The Convert to Bit LLRs circuit 1521 in this current section needs to generate $k+Q_m=6$ extrinsic bit LLRs 904 for a 6-bit message, comprising of LLRs corresponding to the OS modulation and LLRs corresponding to the PSK scheme, as described previously with respect to the modulation model. The Convert to Bit LLRs circuit 1521 in this section uses the same approach used by the similar circuit discussed earlier for the OS-only scheme, but this time it has, as inputs, information on the bits representing the phase of demodulator correlator outputs 1525. This new information is the PSK symbol LLRs 1532 provided by the Convert to PSK symbol LLRs circuit 1501, as demonstrated in FIG. 15B, and it may be referred in some examples as the third set of apriori soft signals.

Below describes the Symbol-bit LLR circuit 1533 of FIG. 15B, which is responsible for generating the aposteriori bit LLRs 909. This Symbol-bit LLR circuit 1533 takes input from the Symbol-to-Symbol LLR circuit 1502 of FIG. 15B, which is described further below and is responsible for combining LLR information from inputs provided by three sources, namely the LLRs of 908, 1532 and 1534. These three sources are the Bit-symbol LLR circuit 1535 (described below, which processes the feedback apriori bit LLRs 910), the demapper circuit (Convert to OS LLRs circuit) 113 (which processes the magnitudes 1531 of the correlator outputs) and the Convert to PSK symbol LLRs circuit 1501 (which processes the phases 1530 of the correlator outputs).

Symbol-Bit LLR Circuit

Like the OS-only scheme, it may be assumed that every message combination in the OS-PSK scheme has a corresponding symbol LLR. With 6-bit messages, this makes a total of $2^6=64$ symbol LLRs for one message in, for example, the 16OS-QPSK scheme: $LLR_{63}^{sym}$, $LLR_{62}^{sym}$, ... $LLR_0^{sym}$. These values are shown in FIG. 15B by the line with the annotation showing the total number of symbol LLRs 1529 for an N-bit encoded bits 1505 from encoder 101 as $N/(k+Q_m) \times M \times 2^{Q_m}$ or $N/6 \times 16 \times 2^2$ symbol LLRs 1529. The symbol LLRs 1529 are converted (as in step 4513 of FIG. 36B) to bit LLRs 909 using the Symbol-bit LLR circuit 1533 in FIG. 15B. FIG. 32 is an extension of FIG. 31, which applied for 4-bit messages, and FIG. 32 here in 4100 illustrates the terms in the symbol-bit LLR conversion for 6-bit messages In FIG. 32, the values of each of the LLR terms $L_5^{bit,0}$, $L_5^{bit,1}$, $L_4^{bit,0}$, $L_4^{bit,1}$, ..., $L_0^{bit,0}$, $L_0^{bit,1}$, are defined by the terms above them in the same column. For example, $L_4^{bit,0}$ in column 4 is defined as $L_4^{bit,0}$ $LLR_0^{sym}$ ⊛ $LLR_1^{sym}$ ⊛ ... ⊛ $LLR_{15}^{sym}$ ⊛ $LLR_{32}^{sym}$ ⊛ $LLR_{33}^{sym}$ ⊛ ... ⊛ $LLR_{47}^{sym}$. The symbol ⊛ denotes the maxstar operation that is defined in an earlier section for the OS-only scheme, where detailed explanation on the calculations of bit LLRs from symbol LLRs are provided. The bottom row 3804 in FIG. 32 defines the values of the aposteriori output bit LLRs, where in this OS-PSK scheme comprises of two sets of soft bits: the OS bit LLRs (MS $Q_m$ LLRs: $LLR_5^{bit,out} LLR_4^{bit,out}$) and the PSK bit LLRs (LS k LLRs: $LLR_3^{bit,out}$ down to $LLR_0^{bit,out}$) The output OS bit LLRs may be referred to as the first set of aposteriori soft bits comprising k soft bits, and the output PSK bit LLRs as the second set of aposteriori soft bits comprising $Q_m$ soft bits.

To obtain (as in step 4514 of FIG. 36B) the extrinsic bit LLRs 904, as shown in FIG. 15B, the feedback apriori bit LLRs 910 are subtracted from the aposteriori bit LLRs 909. This relation with the bits corresponding to OS and PSK schemes separated from each other may be described as follows. The first set of aposteriori soft bits are combined with the soft bits of the second set of apriori soft signals, to obtain a first set of extrinsic soft bits comprising k soft bits. The second set of aposteriori soft bits are combined with the soft bits of the fourth set of apriori soft signals, to obtain a second set of extrinsic soft bits comprising $Q_m$ soft bits.

Symbol-to-Symbol LLR Circuit

Now the question is how symbol LLRs 1529 are calculated (as in step 4528 of FIG. 36B) using the LLRs coming from the upstream 908, 1532 and downstream feedback bit LLRs 910. In the OS-only scheme, OS symbol LLRs 908 were a function of correlator output magnitudes 109 (as the first set of inputs to the soft demapper circuit 1522) and feedback OS apriori feedback bit LLRs 910 (as the second set of inputs to the soft demapper circuit). Here, symbol LLRs are additionally a function of the correlator output phases 1530 as the third set of inputs, and feedback PSK apriori bit LLRs as the fourth set of inputs, to the soft demapping circuit 1522. The feedback PSK bit LLRs can equivalently be referred to, in some examples, as the fourth set of apriori soft signals.

The Symbol-to-symbol LLR circuit 1502 takes as inputs the following to generate (as in step 4528 of FIG. 36B) symbol LLRs 1529: OS symbol LLRs 908, PSK symbol LLRs 1532, and symbol LLRs 1534 that are converted (as in step 4527 of FIG. 36B) from downstream bit LLRs. The latter symbol LLRs 1534 may be referred to as the feedback symbol LLRs (shown in FIG. 15B) which includes both OS and PSK apriori symbol LLRs as the second and fourth sets of apriori soft signals, respectively. Each of the M=16 OS symbol LLRs corresponds to one combination amongst M=16 of the k=4 LS bits of the 6-bit message, and 6 bits can represent 64 combinations. Given that the $Q_m=2$ MS bits of the message can also have four combinations by themselves ('00', '01', '10', '11'), in some examples FIG. 28 can be extended for the work in this section according to FIG. 33, which illustrates in 4200 the 6-bit message combinations 4201 and corresponding LLR parameters 3703, 4202, 4203.

In FIG. 33, the OS symbol LLRs 3703 have the same values as the symbol LLRs 3703 in the earlier discussion for the OS-only scheme: $LLR_i^{OS,in}{}_{OS-PSK}=LLR_i^{sym,in}{}_{os-only}$ for all i in the range [0,M−1] or [0,15]. This is because the work discussed earlier was based on an OS-only scheme where the cross-correlation data were just magnitudes, but not phases. As shown in FIG. 33, the M=16 OS symbol LLR values 3703 are repeated after every M=16 combinations. Also, assume that each message combination (out of $2^{k+Q_m}=64$) has its own PSK symbol LLR—it will be explained why this assumption holds and explain how the PSK symbol LLRs 4202 are calculated in step 4525. Each message combination will also have a corresponding feedback symbol LLR 4203 too, as shown in the right-most column in FIG. 33. The symbol LLR value for every message combination will be the addition of all LLR terms in the corresponding row in FIG. 31. For example, $LLR_{31}^{sym}=LLR_{15}^{OS,in}+LLR_{31}^{PSK,in}+LLR_{31}^{sym,bit}$. In other words, all apriori soft signals 908 1532 1534 are combined in the Symbol to Symbol LLRs circuit 1502 to generate in step 4528 a set of $2^{k+Q_m}$ aposteriori soft signals or symbol LLRs 1529, which are combined 1533 in step 4514 to obtain the first set of aposteriori soft bit LLRs 909 and the second set of aposteriori soft bits.

Bit-Symbol LLR Circuit

The feedback bit LLRs 910 in FIG. 15A may contain LLR values fed back from the decoder 912 to the soft demapping circuit 1522. If the decoder 912 is not feeding back any LLRs, the feedback bit LLRs 910 will have (as in step 4512 of FIG. 36B) bit LLR values of zero, making no difference in the computation (as in steps 4527 and 4528) of symbol LLRs 1529. Otherwise, the fed back bit LLR values affect (as in steps 4519 and 4527) the computation of step 4528 inside the Convert to Bit LLRs circuit 1521 in an iterative decoding operation of step 4521. FIG. 34 illustrates in 4300 the conversion of apriori bit LLRs into the symbol LLR domain which are represented by the feedback symbol LLR parameters $LLR_{63}^{sym,bit}$, $LLR_{62}^{sym,bit}$, ..., $LLR_0^{sym,bit}$ 4203 (the right-most column in FIG. 33). An explanation of one example approach as to how the feedback symbol LLRs 4301 are calculated in step 4527 has been previously described.

Note that in some examples a constant value of $(LLR_5^{bit,in}+LLR_4^{bit,in}+LLR_3^{bit,in}+LLR_2^{bit,in}+LLR_1^{bit,in}+$ $LLR_0^{bit,in}$)/2 may be added to all 64 rows in FIG. 34, without affecting the extrinsic LLRs that are ultimately generated by the overall soft demapping circuit 1522. Adding this constant has the advantage of eliminating all divisions by 2 and reducing the number of additions in the computations of FIG. 34, following some simplifications.

Conversion to PSK Symbol LLRs

It was assumed in FIG. 33 that each of the $2^{k+Q_m}$ message combinations 4201 has a corresponding PSK LLR. The PSK LLRs are generated (as in step 4525 of FIG. 36A) by the Convert to PSK symbol LLRs circuit 1501 as shown in FIG. 15B. This conversion, for a 16OS-QPSK scheme, takes (as in step 4509 of FIG. 36A) as inputs M=16 correlator outputs 1525 for a (k+$Q_m$) 6-bit message and generates $2^{k+Q_m}$=64 PSK LLRs 1532 as outputs. From earlier, it was shown that the phases of the M=16 complex correlator outputs 1525 are meant to contain the $Q_m$=2 MS bits of information of the transmitted 6-bit message. For example, consider the case where the true phase is $-\pi/2$ for a 6-bit message x. Now, it may be observed that in normal channel conditions, one correlator output (most probably the correct 1-Q pair), has a phase of $-\pi/2$, and the phase values of the remaining M−1=15 correlator outputs (most probably the incorrect I-Q pairs), will be uniformly distributed from the applicable range of $[-\pi, \pi)$. Therefore, if the true phase $-\pi/2$ is subtracted from all the M=16 correlator output phases, at least one phase error is expected to be near zero, and the rest of the phases are expected to have random values in the above applicable range.

Note that while the QPSK phases $[\pi/4, 3\pi/3, -\pi/4, -3\pi/4]$ were used in the datasets described earlier for the OS-only scheme, one example technique will be introduced that allows these 16OS-QPSK datasets to be generalised and used to model any PSK radix in the previous testbench discussion. For the sake of simplicity, phase mappings that begin with a phase of 0 will be adopted, such as $[0, \pi/2, -\pi/2, -\pi]$ for QPSK, in this example embodiment.

On the other side, the distributions of correct and incorrect phase error values may be considered. The phase errors calculated above (resulting from the subtraction of an 'assumed' true phase from the M=16 received phases) may be applied to the probability density functions (PDFs) of both the distributions, in order to obtain the probabilities of each correlator output to be a) a correct correlator output or b) an incorrect correlator output. Using these conditional probabilities, the probability ratios (i.e., the PSK LLRs) may be calculated for each of the M=16 correlator outputs, according to the formulae below:

$$PSK\ LLR \triangleq \ln\left[\frac{Pr(\text{correct} | \text{correlator output})}{Pr(\text{incorrect} | \text{correlator output})}\right]$$

Applying Bayes theorem gives:

$$PSK\ LLR = \ln\left[\frac{Pr(\text{correlator output} | \text{correct}) \times Pr(\text{correct})}{Pr(\text{correlator output} | \text{incorrect}) \times Pr(\text{incorrect})}\right]$$

Here, the conditional probabilities are characterised by the normal and the uniform distributions, and it may be assumed that Pr (correct)=1/M and Pr (incorrect)=(M−1)/M. Making these substitutions gives:

$$PSK\ LLR = \ln\left[\frac{NormalPDF(\text{phase error}, 0, \sigma_{correct})}{0.5/\pi \times (M-1)}\right]$$

Here, $0.5/\pi$ is the value of the uniform distribution across the range $-\pi$ to $+\pi$. Note that here 'phase error' refers to the difference between the phase of the corresponding correlator output and the phase of the corresponding one of the $2^{k+Q_m}$ message combinations.

In the above example, it was assumed that the true phase is $-\pi/2$; i.e., a fixed value was assumed for the 2 MS bits of the message. However, this assumption is made in the absence of any knowledge of what the true phase is, and hence, the above approach must be applied to all PSK phase possibilities (that is 4 phases in a QPSK scheme). The steps in the conversion 1501 (as in step 4525 of FIG. 36A) to PSK symbol LLRs 1532 can therefore be summarised into the following: assume one possible PSK phase value (e.g. one value in $[0, \pi/2, -\pi/2, -\pi]$ for QPSK), subtract it from the M correlator phases 1530, apply resulting phase error values to the correct and incorrect PDFs, calculate the PSK LLR for each correlator value from the PDF outputs, and repeat these steps from the beginning with a new PSK phase value. This process of step 4525 produces, in a 16OS-QPSK scheme, $M.2^{Q_m}$ or 16×4=64 PSK symbol LLRs 1532, which correspond to the input PSK LLR parameters 4202 in FIG. 33 shown as $LLR_{63}^{PSK,in}$, $LLR_{62}^{PSK,in}$, ..., $LLR_0^{PSK,in}$. In summary, it can be said that the output phases 1530 of the M correlator outputs 1525 are combined with the second set of distribution parameters ($\sigma_{phase}$) 1523 of the aggregated correlator output phase distribution, in order to obtain in step 4525 a third set of apriori soft signals comprising $2^{k+Q_m}$ soft phases (PSK symbol LLRs 1532).

Summary

In summary, a soft demapping circuit 1522 has been proposed for performing soft-decision demodulation in the receiver chain 1510 of a transmission system 1500 comprising a transmitter chain 1503, a channel 1536 and a receiver chain 1510. The transmitter chain 1503 signals a first set of bits 1508 comprising k bits by transmitting a spreading sequence 1511 that is selected from a set of $2^k$ possible signals according to the values of the k bits, and the transmitter signals a second set of bits 1509 comprising am bits by rotating the phase of the spreading sequence 1511 using a rotation selected from a set of $2^{Q_m}$ possible rotations according to the values of the $Q_m$ bits in the modulator circuit 1504. The receiver chain 1510 uses a bank of $2^k$ correlators to detect the transmission of each possible signal, and wherein the $2^k$ magnitudes 1531 of the correlator outputs 1525 are provided as a first set of inputs to the soft demapping circuit 1522, and wherein a second set of apriori soft signals or feedback bit LLRs 910 comprising k soft bits are provided as a second set of inputs to the soft demapping circuit 1522. Furthermore, the $2^k$ phases 1530 of the correlator outputs 1525 are provided as a third set of inputs to the soft demapping circuit 1522, and a fourth set of apriori soft signals or feedback bit LLRs 910 comprising $Q_m$ soft bits are provided as a fourth set of inputs to the soft demapping circuit 1522. The soft demapping circuit 1522 calculates a first set of aposteriori soft bits comprising k soft bits based on statistics and parameters 1520 derived from a plurality of aggregated correlator output magnitude distributions, and wherein the soft demapping circuit 1522 calculates a second set of aposteriori soft bits comprising $Q_m$ soft bits based on statistics (the $\sigma_{phase}$ parameter 1523) derived from a plurality of aggregated correlator output phase distributions. Furthermore, the soft demapping circuit 1522 combines (as in step 4528 of FIG. 36B) all apriori soft signals 908 1532 1534 to generate a set of $2^{k+Q_m}$ aposteriori soft signals or symbol LLRs 1529 and wherein the set of $2^{k+Q_m}$ aposteriori soft signals or symbol LLRs 1529 are combined (as in step 4513 of FIG. 36B) to obtain the first set of aposteriori soft bit LLRs 909 and the second set of aposteriori soft bits. Following that, the first set of aposteriori soft bits are combined with the soft bits of the second set of apriori soft signals, in order to obtain a first set of extrinsic soft bits. Finally, the second set of aposteriori soft bits are combined with the soft bits of the fourth set of apriori soft signals, in order to obtain a second set of extrinsic soft bits comprising $Q_m$ soft bits.

The operation 4500 of the example soft demapper for the OS-PSK scheme, as demonstrated in the flowchart of FIG. 36, may be summarised as follows. Initially at 4501, the demapper receives 4502 a set of signals as the outputs of the demodulator that correspond to a transmitted frame. Then, it is decided at 4503 and at 4504 which of the three different methods of estimating the distributions of the correlator output magnitudes and phases, are to be employed in FIG. 36A. If the offline approach of, say, step 4523 is chosen, the characteristics of the channel, such as the signal-to-noise ratio and channel type (e.g. AWGN), are identified in step 4505. The result of the identification is then used to address a pre-computed look up table 1527 of parameters for the distributions of the correlator output magnitudes and phases. If, in contrast, an online approach of distribution estimation of step 4524 is chosen, the choice will be either the use of synchronisation sequences (as in step 4507 of FIG. 36A), or applying the largest magnitude of step 4508. Whichever estimation approach is employed, the estimated parameters of the magnitude distributions, alongside the collected correlator output magnitudes of step 4509 of FIG. 36A, are used to calculate (as in step 4510 of FIG. 36A) the OS soft signals, which may be in the form of LLRs, as described previously. Similarly, the calculation in step 4525 of the PSK soft signals is performed using the correlator output phase values and the estimated parameters of the phase error distribution, as described in the example embodiment for conversion to PSK symbol LLRs.

Following that, the calculated OS (as in step 4510 of FIG. 36A) and PSK (as in step 4525) soft signals are stored (as in steps 4511 and 4526) in internal memory, in case a demap-decode round of iterative decoding is required later. Since, only the first iteration has been started so far, of a possible iterative decoding process, there is no value on the feedback path from the decoder. Hence, this feedback will be all zero-valued, as in step 4512 of FIG. 36B. The feedback path—albeit zero valued as of now—is in the LLR domain (soft bits), and hence is converted in step 4527 into the symbols domain to provide the feedback apriori soft signals (as previously described with respect to the Bit-symbol LLR circuit of a soft demapper). The OS and PSK soft signals, which were previously calculated in steps 4510 and 4525, are also of the apriori type, and combined with the feedback apriori soft signals, are used to calculate in step 4528 OS-PSK soft signals (as previously described with respect to the Symbol-to-symbol LLR circuit of a soft demapper). These signals are aposteriori information as they are a function of the feedback path, despite so far being zero valued.

Next, the aposteriori OS-PSK symbols are converted in step 4513 into the LLRs domain to give the aposteriori soft bits (as previously described with respect to the Symbol-bit-LLR circuit). This is followed by converting in step 4514 the aposteriori soft bits into extrinsic soft bits as the type required by, and sent in step 4515 to, the decoder. After the decoder is finished with the process of decoding the extrinsic information it received, the demapper receives in step 4516 the CRC status and the decoded soft bits from the decoder. Following a check in step 4517 of the CRC status, if it is failed in step 4521, turbo decoding is applied and the decoded soft bits received in step 4516 are treated in step 4519 as apriori information fed back from the downstream decoder. Also, the OS and PSK soft signals, which had been calculated previously in steps 4510 and 4525, are loaded in steps 4518 and 4529 from memory as another set of apriori information for the second demapping iteration. The fed back apriori soft bits are converted in step 4527 into the soft signals domain, and the soft demapper uses all apriori information to make a second calculation (as in step 4528 of FIG. 36B) of aposteriori soft signals. The demap-decode iterations of turbo decoding are ended in step 4522 either by a CRC pass or abandoning further decodes of the current frame, which may lead into, for example, a HARQ retransmission. At this point, the demapping of the current frame is ended in step 4520.

Testbench

Figure 18A:
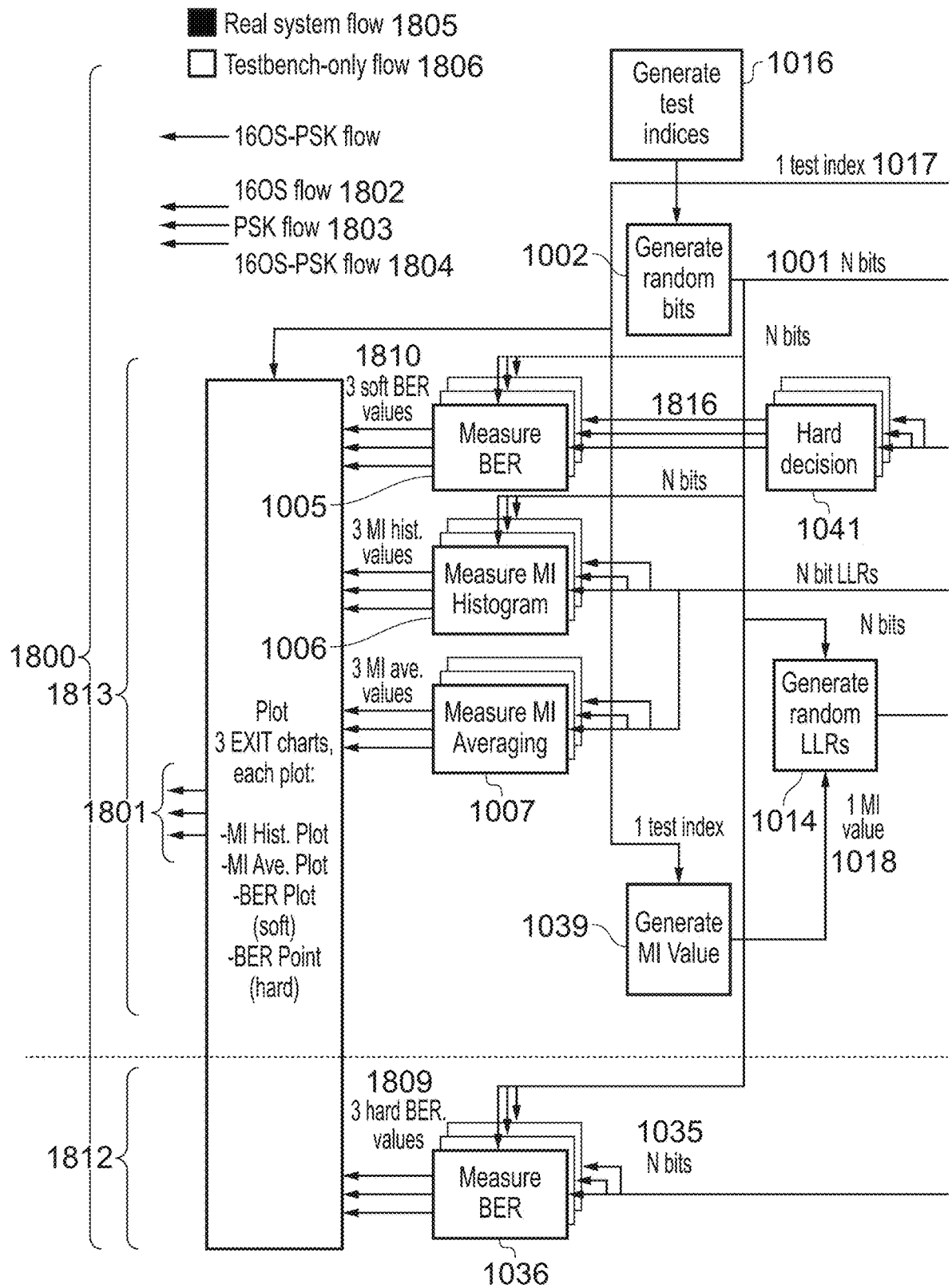
FIG. 18A and FIG. 18B illustrate an example 16OS-PSK testbench.
Figure 18B:
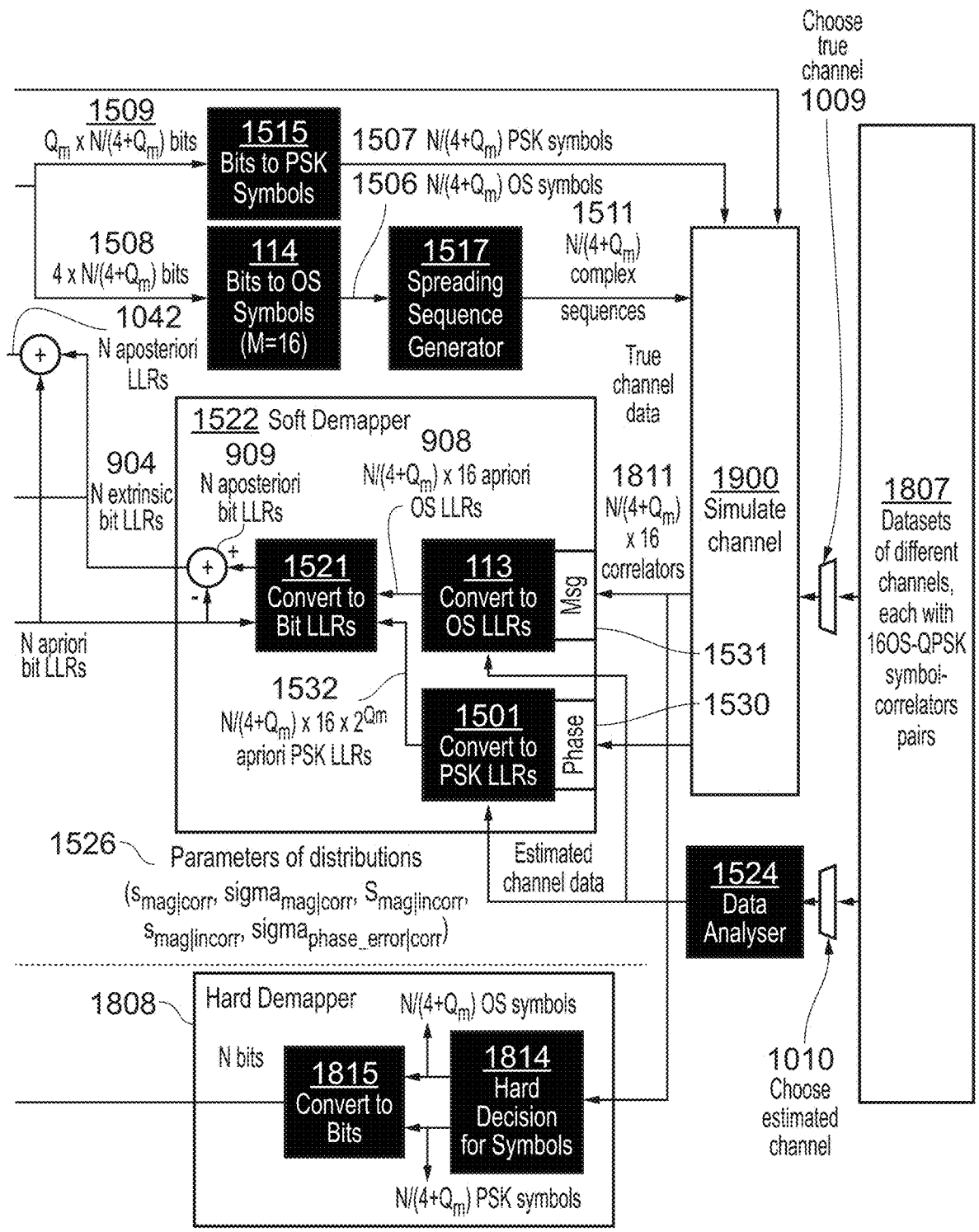

Here, the testbench evaluates a soft demapping circuit 1522, for the OS-PSK scheme, and the testbench is demonstrated in the block diagram of FIG. 18A and FIG. 18B, which illustrates the 16OS-PSK testbench using 16OS-QPSK datasets. For a given dataset, the testbench 1800 generates three extrinsic information transfer (EXIT) charts 1801 on different parts of the message bits/LLRs: namely the OS bits/LLRs of the OS flow 1802, the PSK bits/LLRs of the PSK flow 1803, and the combined OS-PSK bits/LLRs of the combined flow 1804 (i.e., the entire encoded/decoded message). Parts of the testbench 1800 that are in the set 113, 114, 904, 909, 1001, 1501, 1506, 1507, 1508, 1509, 1511, 1515, 1517, 1521, 1522, 1524, 1526, 1530, 1531, 1532, 1808, 1811, 1814, 1815 in FIG. 18A and FIG. 18B represent the flow 1805, which is present in real transmission systems 1500, and the remaining parts are the flows 1806 exclusive to the testbench. The testbench 1800 in FIG. 18A and FIG. 18B has the same operation as the testbench 1000 demonstrated in FIG. 10.

As the datasets used in this current work's testbench 1800 are based on OS-PSK schemes, that is different from the earlier discussed OS-only models and datasets 1012, the datasets 1807 and the functionality of the Simulate channel circuit 1900 in FIG. 18A and FIG. 18B are different from the corresponding circuits 1012 1021 in the OS-only scheme. Example OS-PSK datasets 1807 have been described and introduced previously, and the Simulate channel circuit 1900 described below. The above-listed parts in FIG. 18A and FIG. 18B share the same circuits with the block diagram of FIG. 15A and FIG. 15B, except that the hard demapper circuit 1808 is added (as it was for the OS-only scheme) in this testbench 1800 so that the bit error rates (BER) 1809 of the hard decision demapping flow 1812 is compared against those 1810 of the soft decision demapping flow 1813.

Channel Simulation

Figure 19:
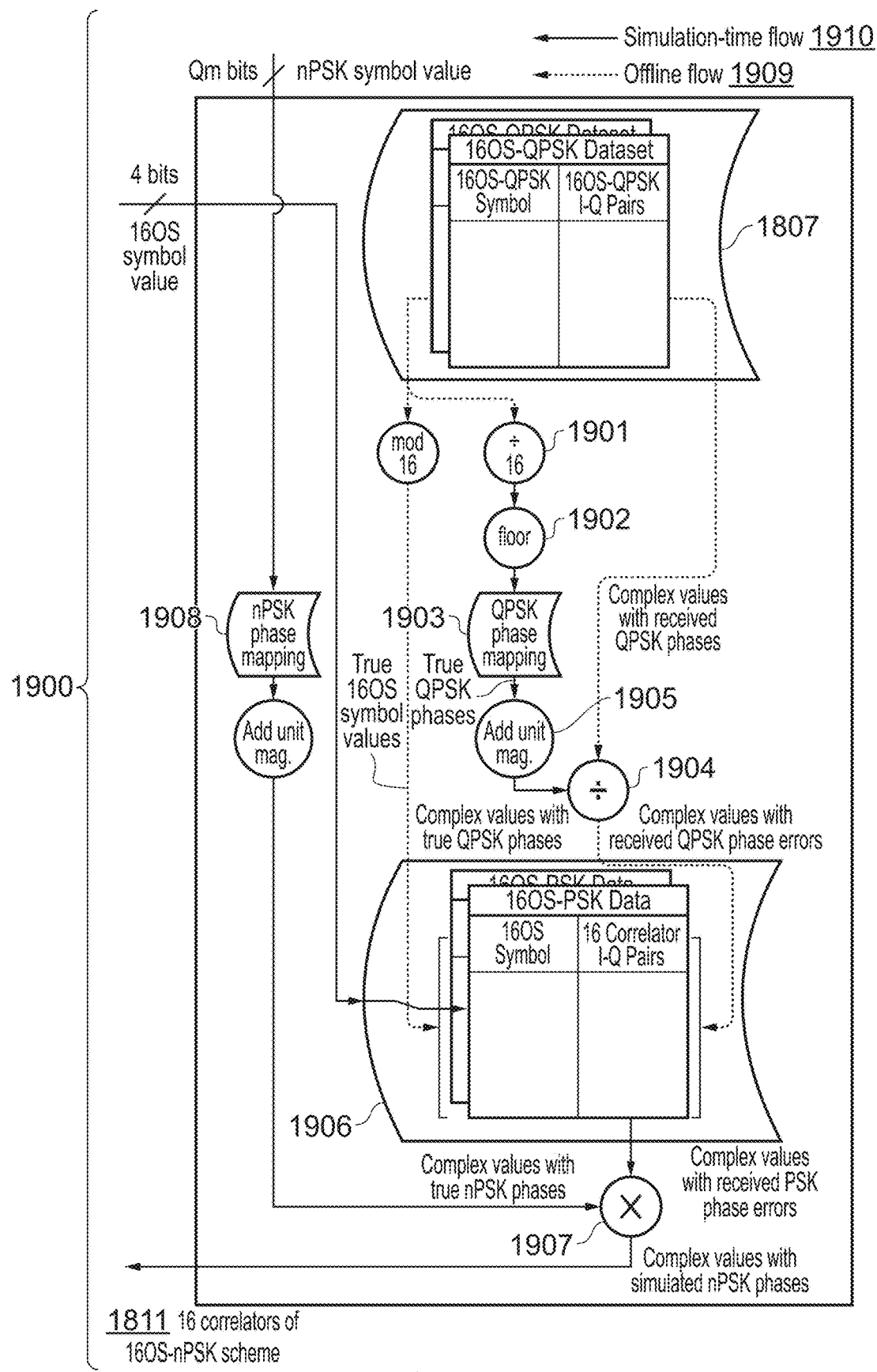
FIG. 19 illustrates an example 16OS-nPSK channel simulation.

In the example testbench 1800, a given channel is simulated in the simulate channel circuit 1900 using its corresponding dataset, from the set of datasets 1807 presented earlier, which all belong to the 16OS-QPSK scheme. In some examples, the testbench 1800 may be arranged to simulate other PSK schemes; such as BPSK, 8PSK or 16PSK. For this, it is necessary to remove, from the datasets 1807, the dependence on the QPSK scheme. This can be performed by the method described for the OS-only scheme: for every pair of '1 16OS-QPSK symbol-16 correlator I-Q pairs', the true phase embedded in the QPSK part of the 16OS-QPSK symbol value is subtracted from the phase of each correlator complex value (as the received QPSK phase). This is shown in FIG. 19, which illustrates the 16OS-nPSK channel simulation using 16OS-QPSK dataset. To find out the true phase value, the result of dividing 1901 the 16OS-QPSK symbol value by M=16 (with rounding 1902 towards zero) is used to choose the phase in the QPSK phase mapping circuit 1903. The testbench 1800 is generic with respect to the OS modulation order and can have any value of M=2k.

Given that the 16OS-QPSK symbol values 4001 are in the range [0, $2^{k+Q_m}-1$] or [0,63](FIG. 31), the division 1901 by M=16 (followed by rounding 1902) will give a value in the range [0,$2^{Q_m-1}$] or [0,3], that is equal to the $Q_m$=2 MS bits of 16OS-QPSK symbol's binary value. Subtraction of phases is performed by dividing 1904 the complex number with the received phase by a complex number of magnitude one 1905 and the true phase value, as shown by the ' ' operator in FIG. 19. With this computation, the 16OS-QPSK dataset is transformed into a new set of data 1906 with 16OS symbols and PSK phase errors: the 16OS-PSK data. This transformation is performed offline 1909, shown by dotted lines in FIG. 19. The flow during the simulation 1910 is shown by solid lines in FIG. 19.

The new 16OS-PSK data 1906 can be used to simulate 16OS-PSK schemes with any degrees of PSK modulation; such as BSPK, 8PSK, or nPSK (n=2Qm) in the generic case. From the inputs to the circuit in FIG. 19, k=4 bits define the 16OS symbol value, and one row from the 16OS-PSK data 1906 with the same input 16OS symbol value is randomly chosen. The M=16 complex I-Q pairs in the corresponding row of the data are multiplied 1907 by a complex number with a magnitude of one and a phase that is defined by the other input to the simulate channel circuit 1900: the $Q_m$ bits of an nPSK scheme (where n=$2^{Q_m}$). This multiplication 1907 inverses the effect of the division 1904 performed offline previously to calculate the phase errors: the multiplication 1907 adds to the phase errors the phase from the nPSK scheme. The result is M=16 correlator I-Q pairs that become the output 1811 for the simulate channel circuit 1900.

Note that the phase mappings [π/4, 3π/4, -π/4, -3π/4] are always adopted in the QPSK phase mapping circuit 1903 in FIG. 19, in accordance with the datasets described earlier in this section. By contrast, the nPSK phase mapping circuit 1908 in FIG. 19 adopts different phases depending on which PSK modulation order is being simulated. For the sake of simplicity, a phase mapping that begins with a phase of '0' is adopted. In the case of QPSK, the phase mapping [0, π/2, -π/2, -π] is adopted here, which preserves the Gray mapping, but with a rotation of π/4 radians with respect to the datasets 1807 mentioned above. For BPSK [0, -π] is adopted, for 8PSK [0 1 3 2 -1 -2 -4 -3]*π/4 is adopted, for 16PSK [0 1 3 2 7 6 4 5 -1 -2 -4 -3 -8 -7 -5 -6]*π/8 is adopted and for 32PSK [0 1 3 2 7 6 4 5 15 14 12 13 8 9 11 10 -1 -2 -4 -3 -8 -7 -5 -6 -16 -15 -13 -14 -9 -10 -12 -11]*π/16 is adopted, which all implement Gray mapping.

PSK Hard Demapping

It was mentioned earlier that a hard decision demapping flow 1812 is used in the testbench 1800 to compare the hard BERs 1809 with the soft BERs 1810 in the EXIT charts 1801. The k=4 bits of the message modulated by the OS scheme are demapped by the hard demapper circuit 1808 in the hard decision for symbol circuit 1814 by taking the index of the largest-magnitude I-Q complex pair and converting it to binary in the convert to bits circuit 1815. This is described in full detail above, for the OS-only scheme.

To find out $Q_m$ bits of the message modulated by the PSK scheme, the Hard Demapper circuit 1808 (FIG. 18B) applies the following approach. The hard decision for symbol circuit 1814 first calculates the difference between the phase of the largest-magnitude correlator I-Q pair (amongst the received M=16 correlator outputs) with each phase in the phase mapping vector (e.g., vector [0, π/2, -π/2, -π] in QPSK) in the applied PSK scheme. The hard decision for symbol circuit 1814 of the hard demapper circuit 1808 then takes the PSK phase that has the least difference with the phase of the largest-magnitude I-Q complex value as the phase of the PSK symbol and converts the index of this phase to binary according to the PSK's phase mapping vector in the convert-to-bits circuit 1815. For example, it may be assumed that a QPSK modulation with a mapping vector [0, π/2, -π/2, -π] is applied, and the phase of the largest-magnitude I-Q pair is 5π/3. With some calculations, it may be observed that the angle 5π/3 in the [0, 2π] range is closest to the angle -π/2 in the [-π, π] range (of the phase mapping). The value -π/2 has an index of 2 in QPSK mapping [0, π/2, -π/2, -π], and, hence, the hard demapper circuit 1808 binary value for the $Q_m$=2 MS bits of the 16OS-QPSK modulation in this example will be '10'.

Per-Scheme Quality Measurements

With the 16OS-PSK schemes that was simulated using the example testbench 1800, it is possible to measure the quality parameters, not only of the results representing all message bits in the combined flow 1804, but also on parts of the message corresponding to each of the OS flow 1802 and the PSK flow 1803. For example, in a 16OS-QPSK scheme with N bits in a code block in total, every k+$Q_m$=6 bits of the encoded bits 1001 of the transmitter and on the hard demapper's output bits 1035 will comprise of k=4 16OS bits, $Q_m$=2 QPSK bits, and the total 6 16OS-QPSK bits—each of the three referred to as a bit group. The same can be said, in terms of LLR groups, for the bit LLRs generated from the soft demapper circuit 1522, which includes both the extrinsic bit LLRs 904 and aposteriori bit LLRs 1042. The bit and LLR groups, when processed simultaneously, are shown by three cascaded arrows, indicating the OS flow 1802, PSK flow 1803 and combined flow 1804 in FIG. 16.

Figure 20A:
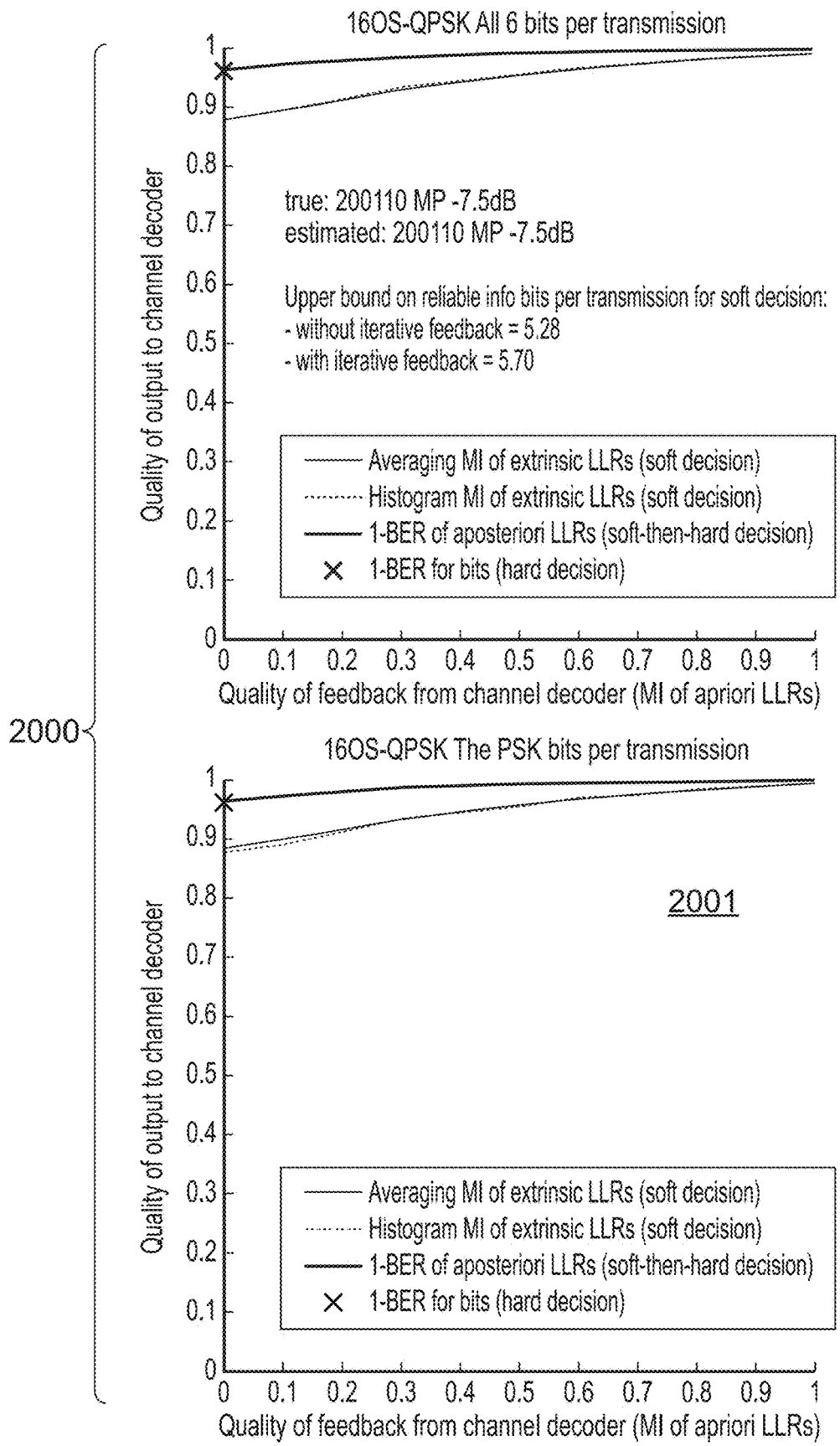
FIG. 20A and FIG. 20B illustrate per-scheme EXIT charts for the 16OS-QPSK scheme.
Figure 20B:
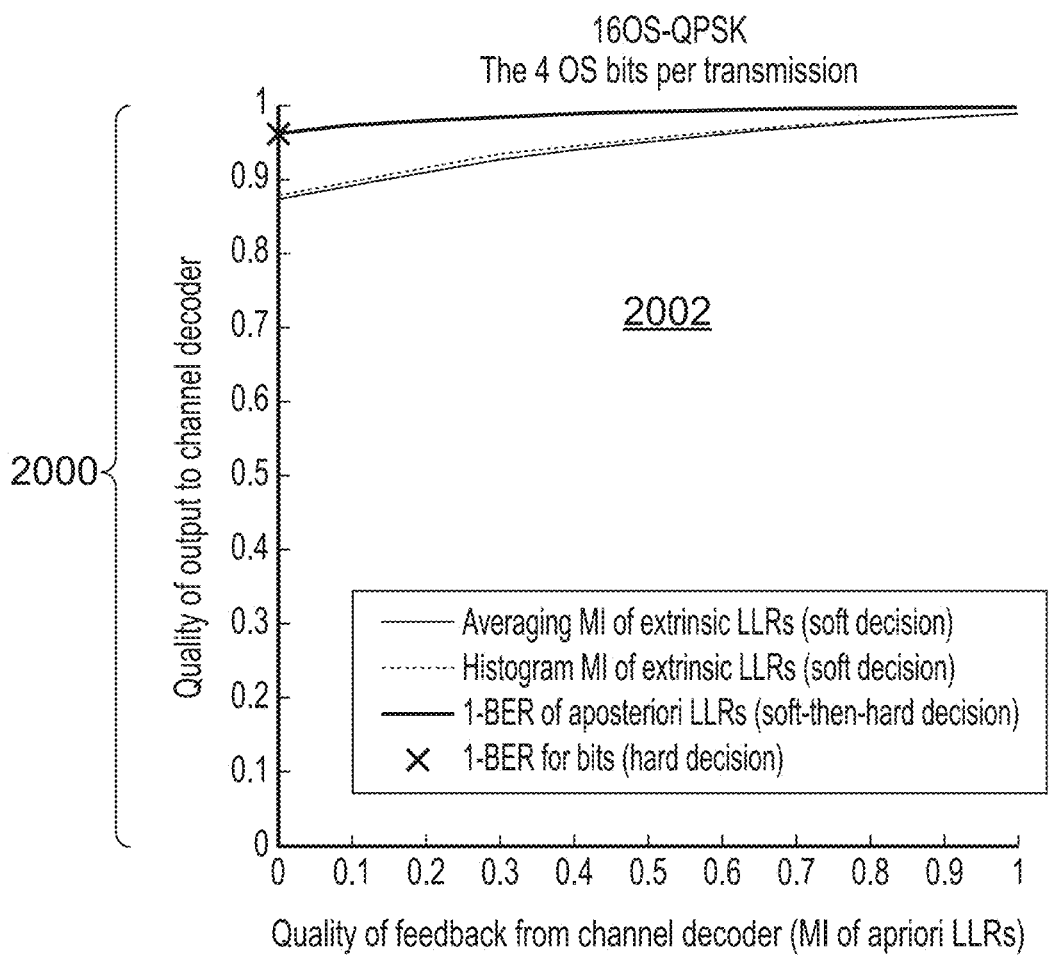

FIG. 20A and FIG. 20B demonstrate three EXIT charts 2000 for the three different 16OS-QPSK modulation schemes. The plot 2001 in FIG. 20A corresponds to the $Q_m$=2 QPSK bits/bit LLRs of the first 6-bit transmission made during the processing of a set of N bits, and to the $Q_m$=2 QPSK bits/bit LLRs of the second transmission, and so on until the $Q_m$=2 QPSK bits/bit LLRs of the last transmission made during the processing of the N bits. The same can be said for plot 2002 of FIG. 20B: the plot data corresponds to the set of all k=4 16OS bits/bit LLRs where each appear in a different transmission, amongst all transmissions, for N bits.

Measuring at 1036 the hard BERs 1809 for the 16OS-PSK, 16OS, and PSK flows requires encoded bits groups 1001 from the transmitter and the hard demapper's output bits 1035, as shown in FIG. 18A. The three soft BER values 1810 are computed at 1005 from the encoded bits groups 1001 of the transmitter chain (as the reference) and the aposteriori bit LLR groups 1042 that are turned at 1041 into hard bits 1816 (as the soft-then-hard bits). Measuring at 1006 the mutual information histogram (MI) values of the bit LLRs for the three modulation schemes in a message is made possible by using the encoded bits groups 1001 from the transmitter chain and the extrinsic bit LLR groups 904 from the soft demapping circuit 1522. These extrinsic bit LLR groups 904 are also used to calculate 1007 the MI averaging values, as shown in FIG. 18A.

Results

FIG. 25 demonstrates the EXIT charts for the MP_-7.5 dB dataset for different PSK modulation orders of QPSK 2501, 8PSK 2502, 16PSK 2503, and 32PSK 2504. Only the EXIT charts 2500 for the worst-case SNR value of −7.5 dB were chosen for inclusion as higher SNRs resulted in all quality measures (including MI values and the 1-BER figure) to be close to 1. Also, there was not much difference between the results from the AWGN and MP channels, so only the multipath channel charts 2500 were included. Details of what information is included in the EXIT charts are described above for the OS-only scheme.

EXIT Charts

OS Charts—PSK Charts

From the EXIT charts 2500, it may be observed that increasing the PSK modulation order, except for small changes, does not have much effect on the quality of the 16OS LLRs characterised in the EXIT charts 2505. This means that the model underlying the datasets 1807 could, to a great extent, keep the modulation schemes independent from each other. In contrast, increasing the PSK modulation order does have noticeable effect on the quality of PSK bit LLRs characterised in the EXIT charts 2506: the quality measures decrease with increasing PSK modulation order. This is expected, as the increase in the number of modulated phases increases the chances of error in both (i) making the precise phases in transmitted signals, and (ii) in identifying the correct phase from the more error-prone data.

It is worth noting that in the specific case of 16OS-QPSK, the OS bit LLRs and the PSK bit LLRs have similar quality to each other. In the higher order PSK schemes, the PSK bit LLRs have lower quality than the OS bit LLRs.

OS-PSK Charts

The EXIT charts 2507 for the OS-PSK symbols are based on measurements on all bit LLRs of the combined flow 1804 (including both OS bit LLRs of the OS flow 1802 and PSK bit LLRs of the PSK flow 1803), and hence demonstrate an average behaviour between the corresponding OS EXIT charts 2505 and PSK EXIT charts 2506 for each PSK modulation order. For example, for the 16OS-32PSK scheme at MI=0, while the histogram MI measurements for the 16OS bit LLRs and 32PSK bit LLRs are 0.87 and 0.44, respectively, the 16OS-32PSK bit LLRs have a histogram MI value of 0.63, that is a value between the other two measurements. Here, the average is a weighted average—in the case of 16OS-32PSK, the OS bit LLRs carry only 4/5 of the weight of the PSK bit LLRs.

In the discussion of the OS-only scheme, the EXIT charts 1300 and 1400 were generated 1000 from a single scheme (16OS) and the upper bounds on the coding rate were represented by the area underneath the MI histogram plot. In this section, there are schemes with different PSK modulation orders, and hence different total number of transmitted bits for the schemes are present. For example, the 16OS-QPSK scheme of the EXIT chart 2501 contains 4+2=6 bits per transmission, and the 16OS-8PSK scheme of the EXIT chart 2502 is based on 4+3=7 bits per transmission. However, while the number of encoded bits per transmission increases with increasing PSK modulation order, the reliability of the transmission decreases, and a lower channel coding rate is needed. It may be expected that a 'sweet spot' can be found where the benefit of increasing the number of encoded bits per transmission maximally outweighs the cost of requiring reduced coding rate. Given that the coding rate is a function of the total number of transmitted bits, in each 16OS-nPSK EXIT chart 2500 the area below the histogram MI plot is multiplied by the total number of bits in order to provide a common measure of information transfer that is comparable across different nPSK schemes with different n. For example, in moving from the 16OS-QPSK EXIT chart 2501 to the 16OS-8PSK EXIT chart 2502, although the MI plots decrease in value, but it may be observed that the upper bound 2508 in the achievable coding rate (for both with and without iterative feedback) increases. This is because, although the area below the histogram MI plot decreases in this movement, the increase in the number of transmitted bits from 6 to 7 causes a considerable jump in the maximum coding rate, from 5.71 to 6.26 in the iterative case, for instance.

In general, it can be said that using higher order PSK allows more encoded bits per symbol, but imposes a lower channel coding rate in order to achieve reliable decoding—these two effects act against each other, but to different degrees at different PSK modulation orders. The results suggest that the 16OS-16PSK scheme of the EXIT chart 2503, with maximum achievable coding rates of 6.31 and 5.79 for with and without iterative feedback, respectively, can convey the most information. However, phase tracking can be expected to become more challenging for this high PSK modulation order, which might favour a reduced value in practice. Also, the 4 PSK bits are more error prone than the 4 OS bits, which might make the channel decoder optimisation more difficult. By contrast, it may be observed that in the 16OS-QPSK scheme of the EXIT chart 2501, the 2 PSK bits and the 4 OS bits are equally error prone (more or less), and support reliable phase tracking, which might be expected to yield a reduced implementation challenge.

One Example Application

Figure 37:
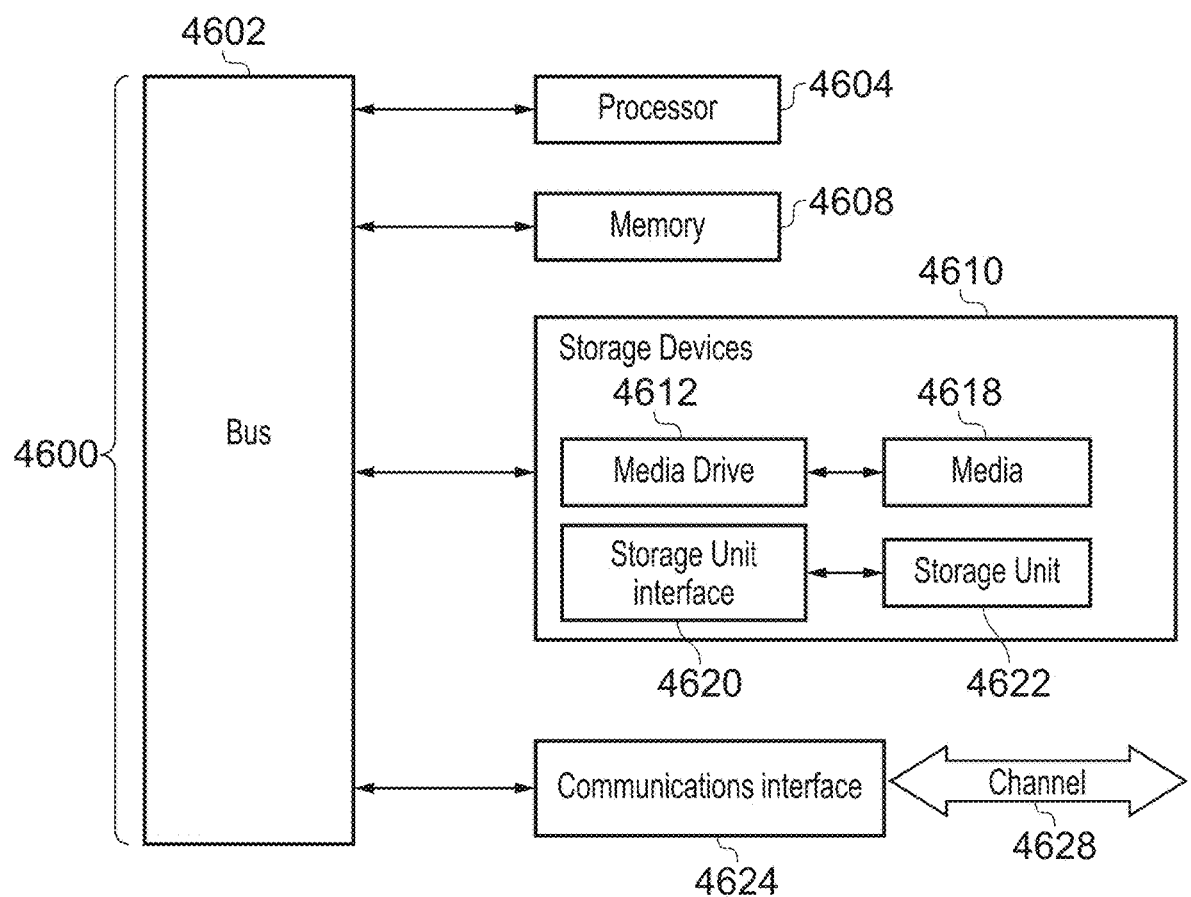
FIG. 37 illustrates a typical computing system that may be employed in an electronic device or a wireless communication unit to perform soft demapping and channel decoding in accordance with some example embodiments of the invention.

Referring now to FIG. 37, there is illustrated a typical computing system 4600 that may be employed to implement soft demapping according to some example embodiments of the invention. Computing systems of this type may be used in wireless communication units. Those skilled in the relevant art will also recognize how to implement the invention using other computer systems or architectures. Computing system 4600 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 4600 can include at least one processors, such as a processor 4604. Processor 4604 can be implemented using a general or special-purpose processing engine such as, for example, a microprocessor, microcontroller or other control logic. In this example, processor 4604 is connected to a bus 4602 or other communications medium. In some examples, computing system 4600 may be a non-transitory tangible computer program product comprising executable code stored therein for implementing soft demapping.

Computing system 4600 can also include a main memory 4608, such as random access memory (RAM) or other dynamic memory, for storing information and instructions to be executed by processor 4604. Main memory 4608 also may be used for storing temporary variables or other intermediate information during execution of instructions to be executed by processor 4604. Computing system 4600 may likewise include a read only memory (ROM) or other static storage device coupled to bus 4602 for storing static information and instructions for processor 4604.

The computing system 4600 may also include information storage system 4610, which may include, for example, a media drive 4612 and a removable storage interface 4620. The media drive 4612 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 4618 may include, for example, a hard disk, floppy disk, magnetic tape, optical disk, CD or DVD, or other fixed or removable medium that is read by and written to by media drive 4612. As these examples illustrate, the storage media 4618 may include a computer-readable storage medium having particular computer software or data stored therein.

In alternative embodiments, information storage system 4610 may include other similar components for allowing computer programs or other instructions or data to be loaded into computing system 4600. Such components may include, for example, a removable storage unit 4622 and an interface 4620, such as a program cartridge and cartridge interface, a removable memory (for example, a flash memory or other removable memory module) and memory slot, and other removable storage units 4622 and interfaces 4620 that allow software and data to be transferred from the removable storage unit 4618 to computing system 4600.

Computing system 4600 can also include a communications interface 4624. Communications interface 4624 can be used to allow software and data to be transferred between computing system 4600 and external devices. Examples of communications interface 4624 can include a modem, a network interface (such as an Ethernet or other NIC card), a communications port (such as for example, a universal serial bus (USB) port), a PCMCIA slot and card, etc. Software and data transferred via communications interface 4624 are in the form of signals which can be electronic, electromagnetic, and optical or other signals capable of being received by communications interface 4624. These signals are provided to communications interface 4624 via a channel 4628. This channel 4628 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 4608, storage device 4618, or storage unit 4622. These and other forms of computer-readable media may store at least one instruction for use by processor 4604, to cause the processor to perform specified operations. Such instructions, generally referred to as 'computer program code' (which may be grouped in the form of computer programs or other groupings), when executed, enable the computing system 4600 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 4600 using, for example, removable storage drive 4622, drive 4612 or communications interface 4624. The control logic (in this example, software instructions or computer program code), when executed by the processor 4604, causes the processor 4604 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of the soft demapper. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

Also, embodiments of the invention are not limited to physical devices or units implemented in non-programmable hardware but can also be applied in programmable devices or units able to perform the desired soft demapping by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as at least one than one. Also, the use of introductory phrases such as 'at least one' and 'at least one' in the claims should not be construed to imply that the introduction of another claim element by the indefinite articles 'a' or 'an' limits any particular claim containing such introduced claim element to inventions containing only one such element, even when the same claim includes the introductory phrases 'at least one' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The word 'subset' refers to a selection of elements from a set, where that selection may comprise one, some or all of the elements in the set.

REFERENCES

[1] J. Hagenauer, "The exit chart—introduction to extrinsic information transfer in iterative processing," 2004 12*th European Signal Processing Conference*, Vienna, 2004, pp. 1541-1548.

[2] 3GPP TS 38.212, "NR; Multiplexing and channel coding", v16.1.0, March 2020.

[3] Z. B. Kaykac Egilmez, L. Xiang, R. G. Maunder and L. Hanzo, "The Development, Operation and Performance of the 5G Polar Codes," in IEEE Communications Surveys & Tutorials, vol. 22, no. 1, pp. 96-122, First quarter 2020.

[4] S. B. Wicker and V. K. Bhargava, eds. "Reed-Solomon codes and their applications," John Wiley & Sons, 1999.

[5] J. Neasham, "Simulated cross-correlation dataset for the 16-ary Orthogonal Signalling scheme," Newcastle University, Oct. 1, 2020.

[6] J. Neasham, "Simulated cross-correlation dataset for the 16-ary Orthogonal Signalling-Phase Shift Keying scheme," Newcastle University, Oct. 1, 2020.

[7] "Modulation using the 16-ary Orthogonal Signalling scheme, and the 16-ary Orthogonal Signalling-Phase Shift Keying scheme," Newcastle University and Sonardyne International Ltd, 2020.

We claim:

1. A communication unit for performing soft-decision demodulation comprising a receiver, wherein the receiver is arranged to receive a transmitted signal conveying a first set of bits comprising k bits that has been selected from a set of $2^k$ possible signals, wherein the receiver comprises:
    a demodulator comprising a bank of 2k correlators and configured to:
    detect a transmission of each possible transmitted signal, and
    output 2k magnitudes of correlator outputs, based on the detected possible transmitted signals, by the bank of 2k correlators as a first set of inputs; and
    a de-mapper circuit coupled to the demodulator and configured to receive the first set of inputs and:
    determine statistics derived from a plurality of aggregated correlator output magnitude distributions of the first set of inputs, wherein the plurality of aggregated correlator output magnitude distributions is fewer than $2^{2k}$; and
    calculate a first set of aposteriori soft bits comprising k soft bits from the determined statistics and output the first set of aposteriori soft bits comprising k soft bits.

2. The communication unit of claim 1, wherein the plurality of aggregated correlator output magnitude distributions is two, and wherein a first aggregated correlator output magnitude distribution approximates an aggregation of the $2^k$ distributions of the output magnitudes of the $2^k$ correlators when a corresponding one of the $2^k$ possible signals was selected as the transmission signal, and wherein a second aggregated correlator output magnitude distribution approximates an aggregation of a remaining $2^{2k}$-$2^k$ distributions of the output magnitudes.

3. The communication unit of claim 2, wherein the first and second aggregated correlator output magnitude distributions are each represented by a first set of distribution parameters.

4. The communication unit of claim 3, wherein the first set of distribution parameters comprises a non-centrality parameter(s) and a scale parameter, sigma.

5. The communication unit of claim 3 further comprising a look-up-table, wherein the de-mapper circuit is further configured to perform one of the following:
    estimate the first set of distribution parameters of the first aggregated correlator output magnitude distribution by fitting a first probability distribution to the magnitudes of correlator outputs obtained by correlating received synchronization signals with correlators corresponding to known synchronization signals;
    estimate the first set of distribution parameters of the second aggregated correlator output magnitude distribution by fitting a second probability distribution to the magnitudes of correlator outputs obtained by correlating received synchronization signals with the $2^k-1$ correlators corresponding to signals other than the known synchronization signal;
    estimate the first set of distribution parameters of the first aggregated correlator output magnitude distribution by fitting a third probability distribution to the magnitudes of correlator outputs having the greatest magnitude among sets of $2^k$ correlator outputs obtained by the bank of $2^k$ correlators;

estimate the first set of distribution parameters of the second aggregated correlator output magnitude distribution by fitting a fourth probability distribution to the magnitudes of the $2^k-1$ correlator outputs that do not have the greatest magnitude among sets of $2^k$ correlator outputs obtained by the bank of $2^k$ correlators; or select the first set of distribution parameters of the first and second aggregated correlator output magnitude distributions from the look-up-table coupled to the de-mapper circuit.

6. The communication unit of claim 5, wherein the first set of distribution parameters comprises a non-centrality parameter(s) and a scale parameter, sigma, and wherein at least one of the first, second, third or fourth probability distributions is a Rician distribution.

7. The communication unit of claim 3, wherein the de-mapper circuit is further configured to combine output magnitudes of the $2^k$ correlators with the first set of distribution parameters of the first and second aggregated correlator output magnitude distributions to obtain a first set of apriori soft signals comprising $2^k$ soft magnitudes.

8. The communication unit of claim 7, wherein the de-mapper circuit is further configured to combine all the apriori soft signals to generate a set of $2^k$ aposteriori soft signals and wherein the set of $2^k$ aposteriori soft signals are combined to obtain the first set of aposteriori soft bits.

9. The communication unit of claim 1, wherein the first set of aposteriori soft bits are combined with the soft bits of the second set of apriori soft signals, to obtain a first set of extrinsic soft bits comprising k soft bits.

10. The communication unit of claim 9, wherein the de-mapper circuit is further configured to combine the first set of aposteriori soft bits with the soft bits of the second set of apriori soft signals, to obtain a first set of extrinsic soft bits comprising k soft bits.

11. The communication unit of claim 1, wherein the transmitted signal also conveys a second set of bits comprising Qm bits where a phase of the received transmitted signal has been rotated using a rotation selected from a set of $2^{Qm}$ possible rotations, and the demodulator is configured to output an additional $2^k$ phases of the correlator outputs as a second set of inputs, to the de-mapper circuit and wherein the de-mapper circuit is further configured to:

determine statistics derived from a number of aggregated correlator output phase distributions of the second set of inputs; and calculate a second set of aposteriori soft bits comprising Qm soft bits based on the derived statistics.

12. The communication unit of claim 11, wherein the number of aggregated correlator output phase distributions is one, and the aggregated correlator output phase distribution approximates an aggregation of the $2^k$ distributions of the additional $2^k$ phases of the correlator outputs when a corresponding one of the $2^k$ possible signals was selected as the transmission signal.

13. The communication unit of claim 12, wherein the aggregated correlator output phase distribution is represented by a second set of distribution parameters.

14. The communication unit of claim 13, wherein the second set of distribution parameters comprises a spreading parameter, $sigma_{phase}$.

15. The communication unit of claim 13, further comprising a look-up-table, wherein the de-mapper circuit is further configured to perform one of the following:

estimate the second set of distribution parameters of the aggregated correlator output phase distribution by fitting a fifth probability distribution to phase errors of correlator outputs obtained by correlating received synchronization signals with correlators corresponding to known synchronization signals;

estimate the second set of distribution parameters of the aggregated correlator output phase distribution by fitting a sixth probability distribution to phase errors of correlator outputs having the greatest magnitude among sets of $2^k$ correlator outputs obtained by the bank of $2^k$ correlators; or select the second set of distribution parameters of the aggregated correlator output phase distribution from the look-up-table coupled to the de-mapper circuit.

16. The communication unit of claim 15, wherein at least one of the fifth or sixth probability distributions is a Gaussian distribution.

17. The communication unit of claim 15, wherein the de-mapper circuit is further configured to combine output phases of the $2^k$ correlators with the second set of distribution parameters of the aggregated correlator output phase distribution to obtain a third set of apriori soft signals comprising $2^{k+Qm}$ soft phases.

18. The communication unit of claim 11, wherein the de-mapper circuit is further configured to accept a fourth set of apriori soft signals comprising Qm soft bits as a fourth set of inputs and wherein the second set of aposteriori soft bits is combined with soft bits of the fourth set of apriori soft signals to obtain a second set of extrinsic soft bits comprising Qm soft bits.

19. The communication unit of claim 18, wherein the de-mapper circuit is further configured to combine all the apriori soft signals to generate a set of $2^{k+Qm}$ aposteriori soft signals and wherein the set of $2^{k+Qm}$ aposteriori soft signals is combined to obtain the first set of aposteriori soft bits and the second set of aposteriori soft bits.

20. A method for performing soft-decision demodulation comprising a communication unit having a receiver, the receiver having a de-mapper circuit coupled to a demodulator that comprises a bank of $2^k$ correlators, the method at the receiver comprising:

receiving a transmitted signal that conveys a first set of bits comprising k bits that has been selected from a set of $2^k$ possible signals:

detecting a transmission of each possible transmitted signal;

outputting $2^k$ magnitudes of correlator outputs, based on the detected possible transmitted signals, by the bank of $2^k$ correlators as a first set of inputs;

determining statistics derived from a plurality of aggregated correlator output magnitude distributions of the first set of inputs, wherein the plurality of aggregated correlator output magnitude distributions is fewer than $2^{2k}$; and calculating a first set of aposteriori soft bits comprising k soft bits from the determined statistics and outputting the first set of aposteriori soft bits comprising k soft bits.

* * * * *